(12) United States Patent
Ishida

(10) Patent No.: US 6,537,877 B2
(45) Date of Patent: Mar. 25, 2003

(54) SEMICONDUCTOR MEMORY DEVICE

(75) Inventor: Minoru Ishida, Kanagawa (JP)

(73) Assignee: Sony Corporation, Tokyo (JP)

( * ) Notice: Subject to any disclaimer, the term of this patent is extended or adjusted under 35 U.S.C. 154(b) by 19 days.

(21) Appl. No.: 09/779,889

(22) Filed: Feb. 8, 2001

(65) Prior Publication Data

US 2002/0024105 A1 Feb. 28, 2002

Related U.S. Application Data

(62) Division of application No. 09/301,982, filed on Apr. 29, 1999, now Pat. No. 6,229,186.

(30) Foreign Application Priority Data

May 19, 1998 (JP) ............................. 10-122542
Jun. 18, 1998 (JP) ............................. 10-171186

(51) Int. Cl.[7] .......................................... H01L 21/336
(52) U.S. Cl. ..................................... 438/258; 257/206
(58) Field of Search ......................... 438/151, 157–158, 438/164, 258, 637, 672, 675; 257/206–207, 210–211, 390–391, 903, 381

(56) References Cited

U.S. PATENT DOCUMENTS

| | | | |
|---|---|---|---|
| 5,298,782 A | * | 3/1994 | Sundaresan ............... 257/377 |
| 5,341,327 A | * | 8/1994 | Kuriyama ................. 365/154 |
| 5,523,598 A | | 6/1996 | Watanabe et al. |
| 5,539,216 A | * | 7/1996 | Nguyen et al. ............. 257/67 |
| 5,654,572 A | | 8/1997 | Kawase |
| 5,694,354 A | * | 12/1997 | Anami et al. ............. 365/154 |
| 5,751,640 A | * | 5/1998 | Gil ........................ 257/903 |
| 5,754,467 A | | 5/1998 | Ikeda et al. |
| 5,798,551 A | | 8/1998 | Kikushima et al. |
| 5,818,090 A | * | 10/1998 | Kimura .................... 257/369 |
| 5,844,836 A | * | 12/1998 | Kepler et al. ............. 365/154 |
| 5,879,980 A | * | 3/1999 | Selcuk et al. ............. 438/238 |
| 5,920,097 A | * | 7/1999 | Horne ..................... 257/368 |
| 5,981,995 A | * | 11/1999 | Selcuk .................... 257/330 |
| 5,994,735 A | * | 11/1999 | Maeda et al. ............. 257/302 |
| 6,017,794 A | * | 1/2000 | Burns et al. .............. 438/158 |
| 6,130,470 A | * | 10/2000 | Selcuk .................... 257/532 |

\* cited by examiner

*Primary Examiner*—David Nelms
*Assistant Examiner*—David Vu
(74) *Attorney, Agent, or Firm*—Sonnenschein, Nath & Rosenthal

(57) ABSTRACT

A semiconductor memory device provided with a plurality of memory cells each including first transistors having first conductivity type and second transistors having a second conductivity type, each memory cell comprising a first active region where channels of the first transistors are formed and a second active region where channels of the second transistors are formed, the first and second active regions being arranged so that the directions of channel currents of the transistors become parallel to each other in each cell and being separated between adjoining memory cells in a direction perpendicular to the directions of channel current.

3 Claims, 73 Drawing Sheets

TYPE A

TYPE B

TYPE C

TYPE D

FIRST EMBODIMENT

NON ALIGNMENT DEVIATION

ALIGNMENT DEVIATION

SECOND EMBODIMENT

THIRD EMBODIMENT

COMPARISON EXAMPLE
(FIRST EMBODIMENT)

FOURTH EMBODIMENT

FIRST MODIFICATION

SECOND MODIFICATION

FIFTH EMBODIMENT

SIXTH EMBODIMENT

FIRST MODIFICATION

SECOND MODIFICATION

THIRD MODIFICATION

SEVENTH EMBODIMENT

EIGHTH EMBODIFIMENT

MODIFICATION

NINTH EMBODIMENT

FIG. 69A
TENTH EMBODIMENT
FIG. 69D
COMPARISON EXAMPLE
(RELATED ART)
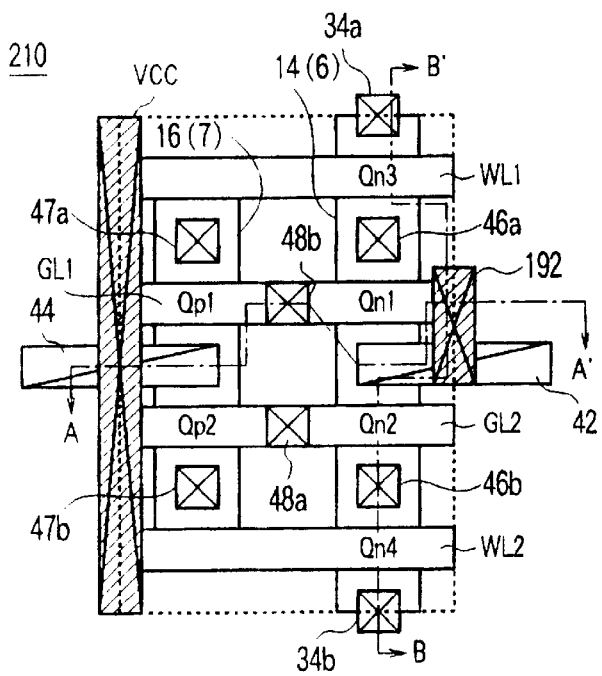
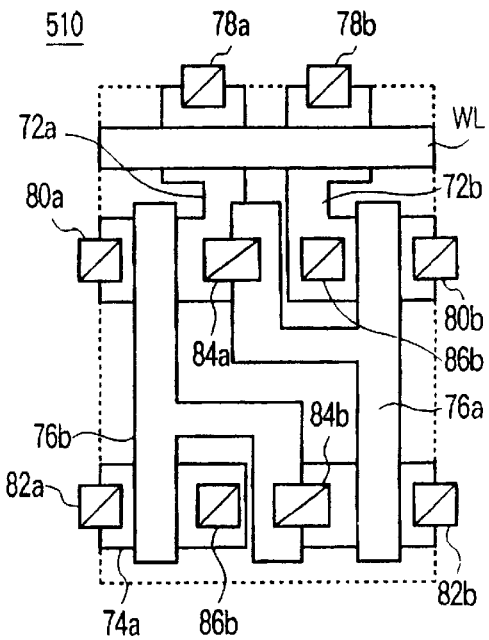
FIG. 69B
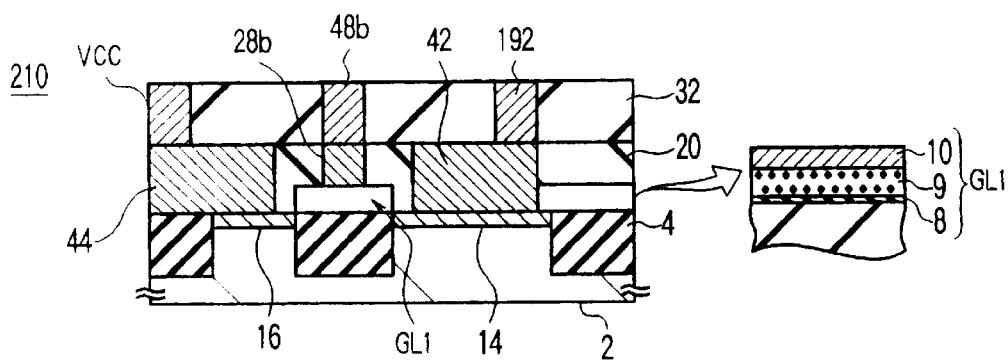
FIG. 69C
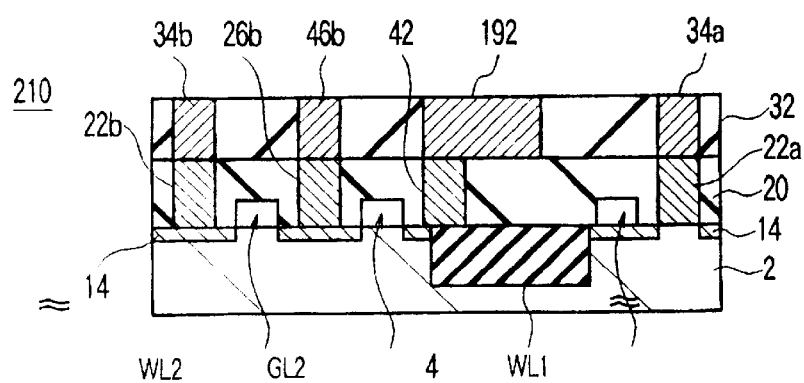

FIG. 70A
FIG. 70D
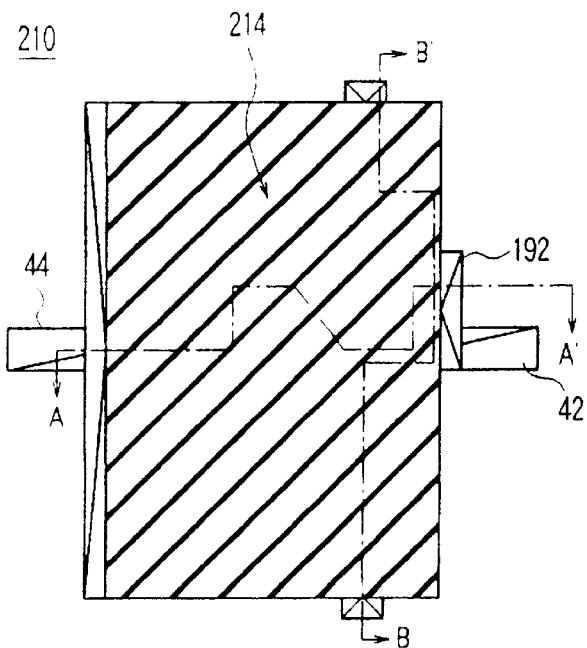
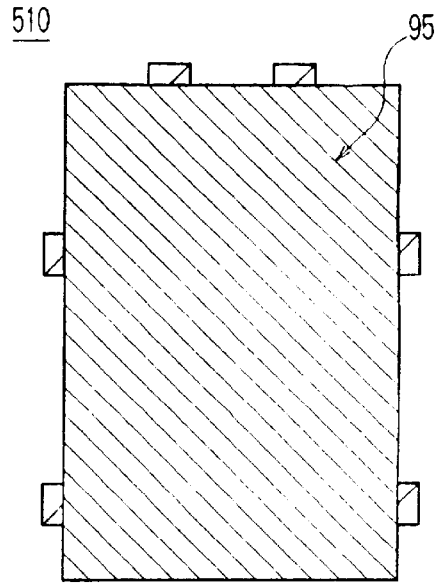
FIG. 70B
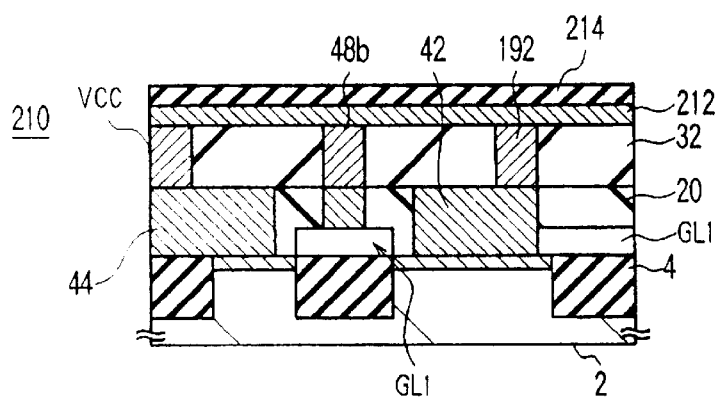
FIG. 70C
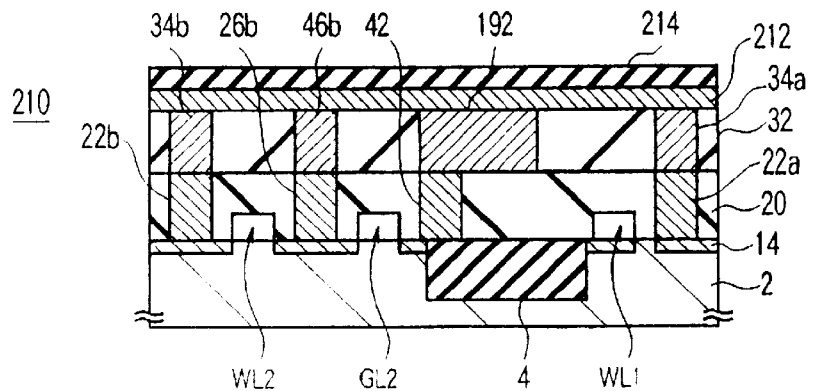

FIG. 74A
FIG. 74D
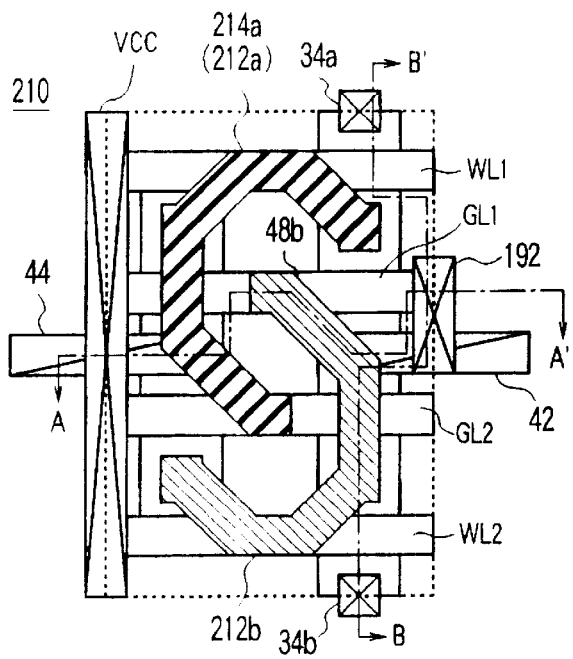
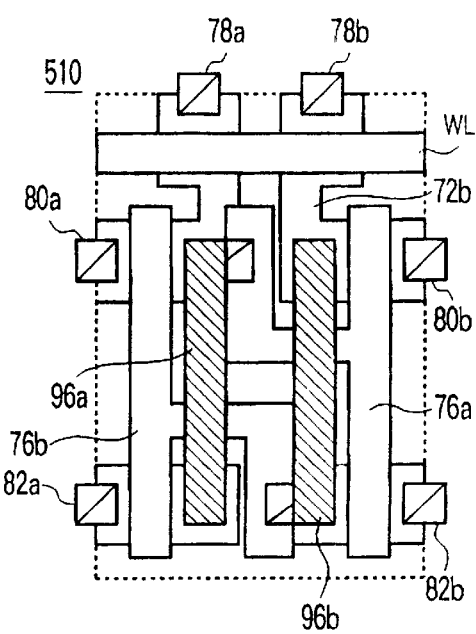
FIG. 74B
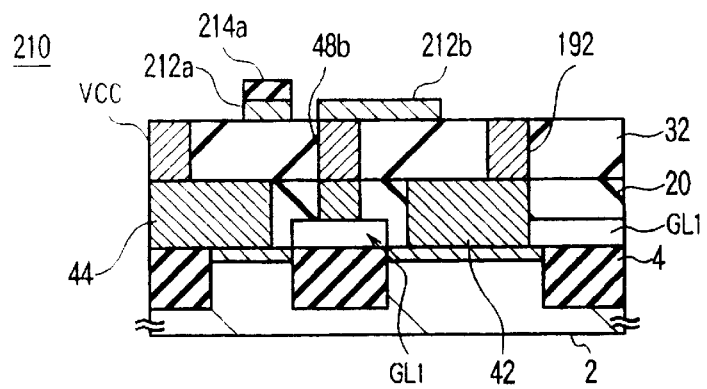
FIG. 74C
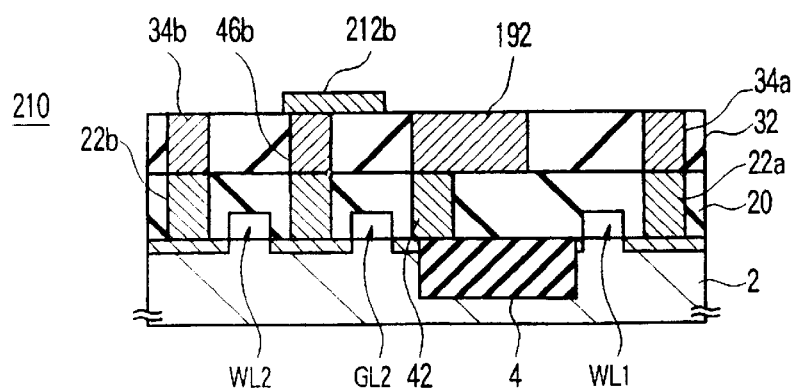

FIG. 76A
FIG. 76D
FIG. 76B
FIG. 76C
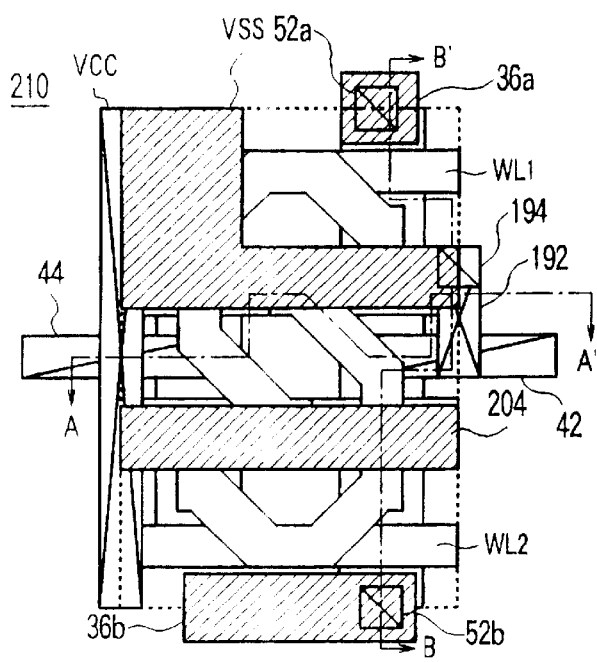
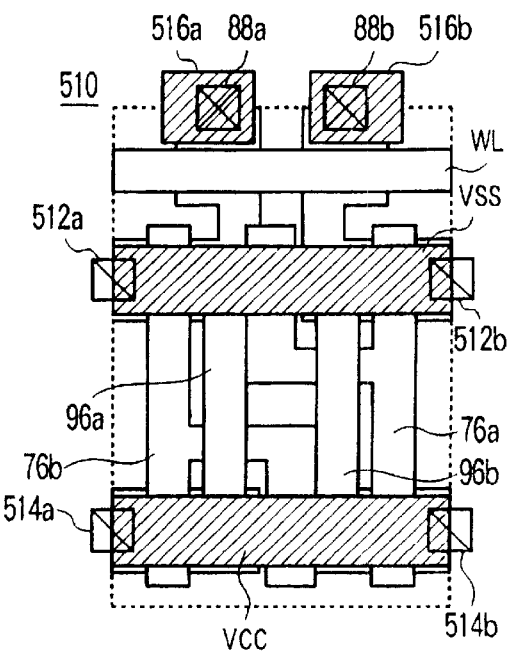
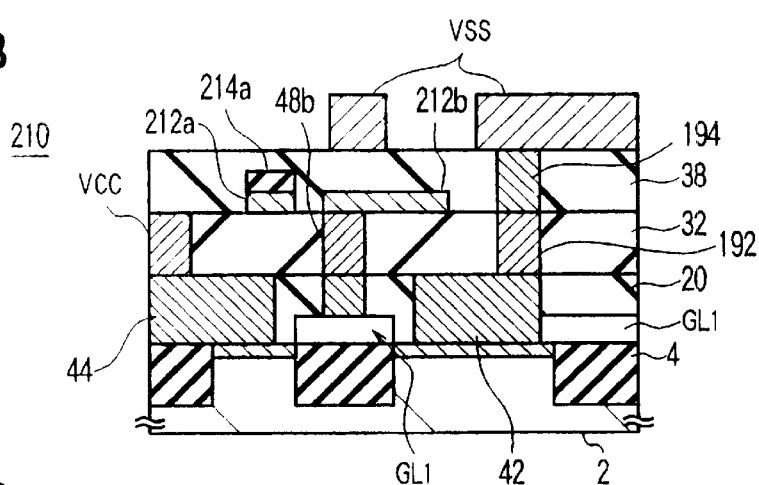
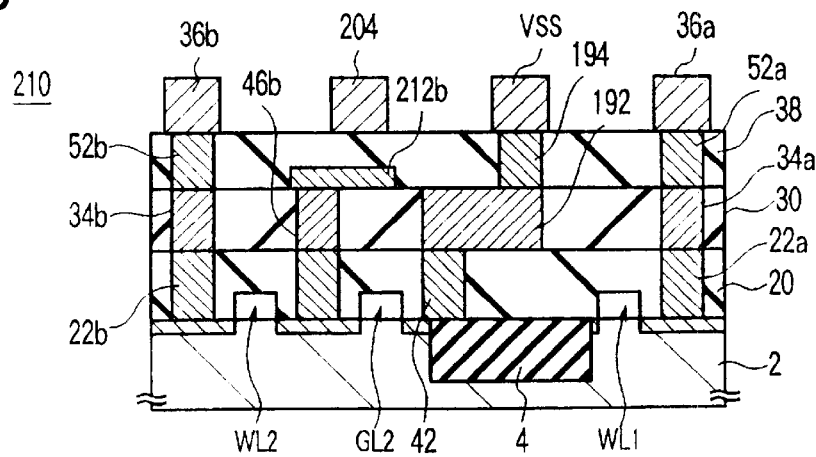

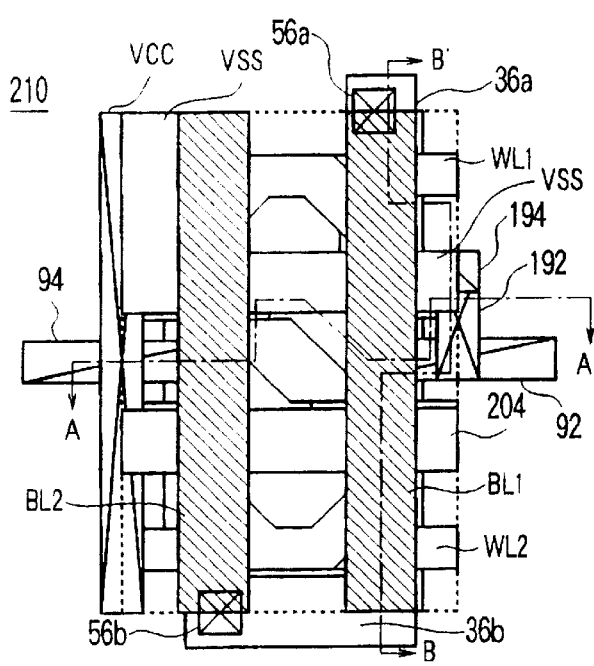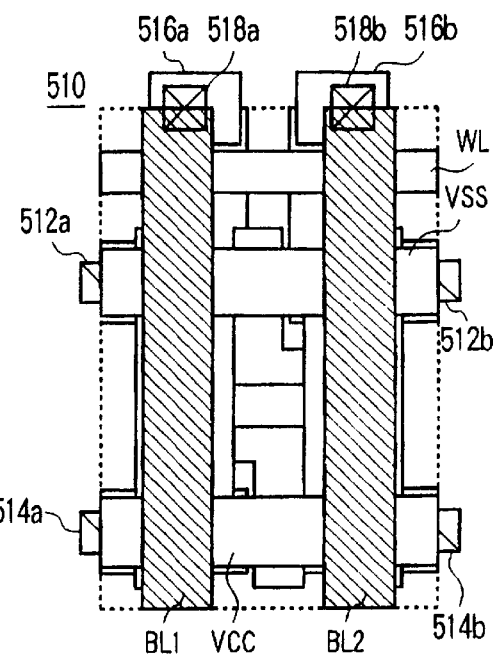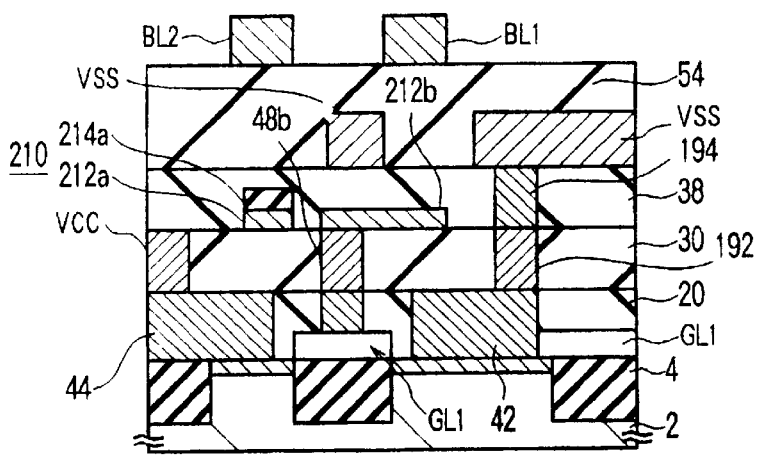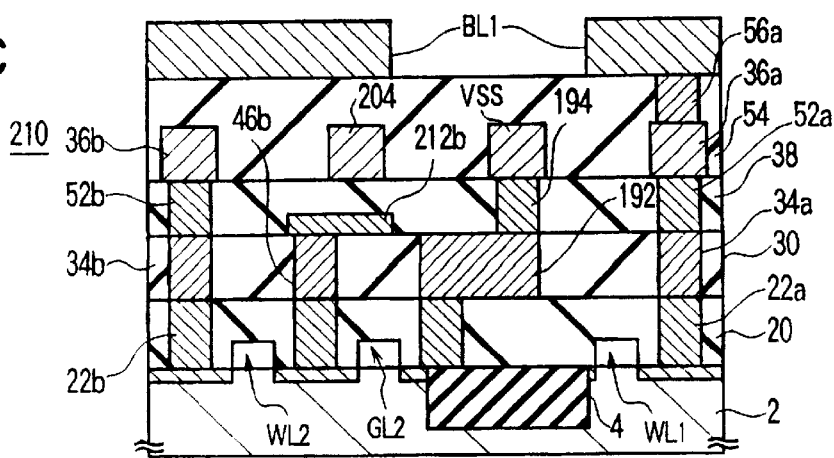

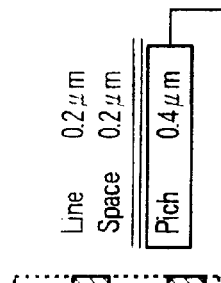
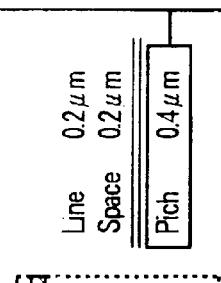
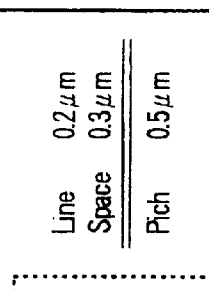
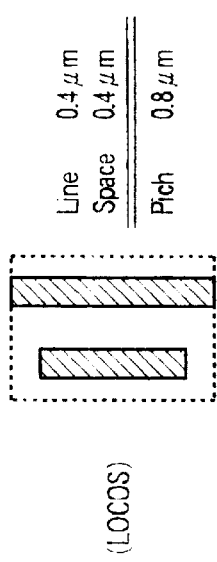
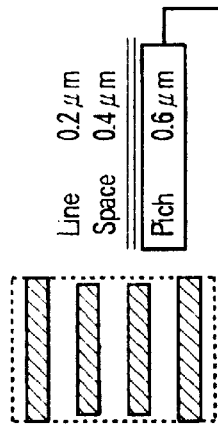
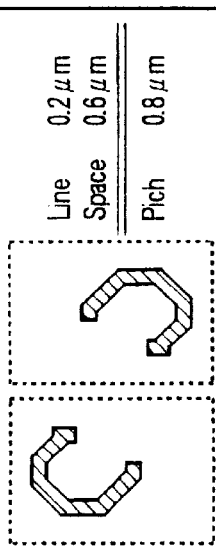

FIG. 79A — PRESENT EMBODIMENT

FIG. 79B — COMPARISON EMBODIMENTS (2ND, 7TH TO 9TH)

FIG. 79C — SECOND COMPARISON EXAMPLE (RELATED ART)

(LOCOS)

FIG. 79A:
Line 0.4 μm / Space 0.4 μm / Pitch 0.8 μm

FIG. 79B:
Line 0.4 μm / Space 0.4 μm / Pitch 0.8 μm

FIG. 79C:
Line 0.2 μm / Space 0.2 μm / Pitch 0.4 μm (GATE ELECTRODE)

FIG. 79A:
Line 0.2 μm / Space 0.4 μm / Pitch 0.6 μm

FIG. 79B:
Line 0.2 μm / Space 0.4 μm / Pitch 0.6 μm

FIG. 79C:
Line 0.2 μm / Space 0.2 μm / Pitch 0.4 μm (STORAGE NODE CONNECTION LINE)

FIG. 79A:
Line 0.2 μm / Space 0.6 μm / Pitch 0.8 μm

FIG. 79B:
Line 0.2 μm / Space 0.2 μm / Pitch 0.4 μm

FIG. 79C:
Line 0.2 μm / Space 0.3 μm / Pitch 0.5 μm (DESIGN RULE : MIN. PITCH × 1/2)

FIG. 79A: 0.3 μm Rule
FIG. 79B: 0.2 μm Rule
FIG. 79C: 0.2 μm Rule (CELL SIZE)

● ▬▬▬ SECOND POLY-SILICON LINE
● ░░░ THIRD CONNECTION LINE
● ▨▨▨ FOURTH CONNECTION LINE (PRIOR ART)

SEMICONDUCTOR MEMORY DEVICE

RELATED APPLICATION DATA

This application is a divisional of application Ser. No. 09/301,982, filed Apr. 29, 1999, U.S. Pat. No. 6,229,186. The present and foregoing applications claim priority to Japanese applications No. P10-122542, filed May 1, 1998 and No. P10-171186, filed Jun. 18, 1998. All of the foregoing applications are incorporated herein by reference to the extent permitted by law.

BACKGROUND OF THE INVENTION

1. Field of the Invention

The present invention relates to a semiconductor memory device having six-transistor configuration static random access memory (SRAM) cells or other memory cells of a complementary metal-oxide-semiconductor (CMOS) configuration and a method of producing the same, more particularly relates to a semiconductor memory device which improves the memory cell characteristics by reducing the fluctuation in transistor characteristics due to misalignment of the pattern and by reducing the resistance of the interconnections and which increases the flexibility in layout of interconnections of storage nodes for connection inside the cells and thereby reduces the area of the same and to a method of producing a semiconductor memory device enabling close arrangement of interconnections of storage nodes.

2. Description of the Related Art

An SRAM cell is in general comprised of a flip-flop and two transistors (so-called word transistors) controlled to be conductive or nonconductive in accordance with a supply voltage of a word line and determining whether to connect the two storage nodes of the flip-flop to a bit line. It can be broadly divided into two types according to the difference in the load elements of the flip-flop: a metal-oxide-semiconductor (MOS) transistor load type and a high resistance load type. Of these, the MOS transistor load type has a six-transistor configuration. Depending on the type of the load transistor, a p-type channel MOS transistor (hereinafter referred to as a p-MOS) load type and a thin film transistor (TFT) load type are known.

Looking at a first related art, FIG. 80 is a plan view of an example of the pattern of the layout of a p-MOS load type SRAM cell according to the related art. FIGS. 80 shows the state after forming the gates of the transistors and omits the illustration of the connections inside the cell and the upper-layer interconnections of the bit lines etc.

Instead, FIG. 80 shows connection of portions connected by the upper-layer interconnections overlappingly on the pattern diagram.

In FIG. 80, reference numeral 300 shows the p-MOS load type SRAM cell, 302a and 302b show p-type active regions in which MOS transistors having n-type channels (hereinafter referred to as n-MOS) are to be formed, and 304a and 304b show n-type active regions in which p-MOS's are to be formed. The areas surrounding the active regions 302a, 302b, 304a, and 304b form element isolation insulating regions using local-oxidation-of-silicon (LOCOS) or trenches.

In this SRAM cell 300 of the related art, the two p-type active regions 302a and 302b have planar shapes bent outward substantially perpendicularly. At the two sides straddling each of the bent portions are formed a drive transistor Qn1 (or Qn2) and a word transistor Qn3 (or Qn4).

A word line serving also as the polycrystalline silicon gate electrodes of the word transistors Qn3 and Qn4 is laid intersecting both of the two p-type active regions substantially perpendicularly and running between cells in the horizontal direction in FIG. 80. As opposed to this, common gate lines 306a and 306b serving also as polycrystalline silicon gate electrodes of the drive transistors Qn1 and Qn2 are formed separately for each cell. That is, the common gate line 306a perpendicularly intersects the p-type active region 302a in the vertical direction in FIG. 80, while the common gate line 306b perpendicularly intersects the p-type active region 302b in the same direction.

These common gate lines 306a and 306b perpendicularly intersect the n-type active regions 304a and 304b, respectively, as well. Due to this, a p-MOS (load transistor Qp1 or Qp2) is formed at each of the n-type active regions 304a and 304b. The load transistor Qp1 and the drive transistor Qn1 constitute a first inverter, while the load transistor Qp2 and the drive transistor Qn2 similarly constitute a second inverter. Note that each common gate line 306a and 306b has a branch line near the mid portion. As shown by the connections in FIG. 80, an input of one inverter is connected to the output of the other inverter by a second-layer polycrystalline silicon layer. Further, a supply line of a power voltage $V_{cc}$, a supply line of a common potential $V_{ss}$, and bit lines BL1 and BL2 are connected as shown in the figure.

Looking at a second related art, in recent years, for example, "A LOW COST MICROPROCESSOR COMPATIBLE, 18.4 $\mu m^2$, 6-T BULK CELL TECHNOLOGY FOR HIGH SPEED SRAMS. VLSI Symposium Report, pp. 65–66, 1993" proposed a split word line type SRAM cell with word lines laid split for each word transistor.

FIG. 81 is plan view of the pattern of the layout of the split word line type cell described in that paper and is shown in the same way as FIG. 80.

In the split word line type SRAM cell 310, a p-type active region 312 in which n-MOS transistors are to be formed is formed in common between the inverters and word transistors and is made common between cells adjoining in the word line direction as well. In the same way, an n-type active region 314 in which p-MOS transistors are to be formed is formed in common between inverters and between cells adjoining in the word line direction.

Note that, the connections shown in FIG. 81 are basically the same as those in FIG. 80, but here the serial connections of the p-MOS's and n-MOS's of the inverters are comprised by second-layer polycrystalline silicon layers, the connections between the serial connecting points and the inputs of the other inverters, the supply line of the power voltage $V_{cc}$, etc. are comprised by third-layer polycide layers, and the supply line of a common potential $V_{ss}$ and the bit lines are comprised by fourth-layer metal interconnections.

Turning now to the problems to be solved by the invention, in general reduction of the pattern size is indispensable in increasing the degree of integration and the memory capacity of semiconductor memory devices. This reduction of the pattern size is achieved by forming finer patterns, reducing the amount of mismatch in alignment of photo masks between different patterns, and adopting self-alignment technology where mismatch between patterns does not become a problem.

At the present time, the former finer patterns are formed by improving the resist materials, increasing the precision of producing of the interconnections etc. using the resist as a pattern transfer mask, and shortening the wavelength of the light emitted from the exposure system from g-rays to KrF excimer lasers, ArF excimer lasers, and on to X-rays.

On the other side, looking at the latter mismatch between patterns, the amount of mismatch can be tremendously reduced while maintaining high characteristics and reliability by adopting self-alignment technology. In the actual manufacture of devices, however, the types of processes in which self-alignment technology can be applied are limited. In other processes, the amount of mismatch between patterns depends on the mechanical precision of the exposure system. The mechanical precision cannot be improved to a great degree, so the amount of mismatch is not being reduced at the same pace as the miniaturization of the patterns themselves at the present time.

Therefore, it is required to design patterns so that even if mismatch occurs between patterns, it will not become a problem as seen from the characteristics and reliability— particularly in processes where self-alignment technology cannot be adopted.

The SRAM cells of the first and second related arts explained above with reference to FIGS. 80 and 81, however, were not designed with sufficient consideration to the mismatch between patterns.

For example, in the SRAM cell 300 of the first related art shown in FIG. 80, the p-type active regions 302a, 302b for forming the n-MOS's are bent outward. Despite the patterns on the mask being patterns of combinations of rectangular shapes, the actually produced pattern ends up becoming deforming with the corners become very rounded as shown. This occurs due to the excessive light intensity in the case of pattern formation by leaving the resist and insufficient light intensity in the case of pattern formation by removing the resist when using a mask pattern for exposure on a resist (transfer of pattern). In the specific case illustrated, the drive transistors Qn1 and Qn2 tend to increase in gate width (size of overlay perpendicularly intersecting channel current direction) and the word transistors Qn3 and Qn4 tend to decrease in gate width.

Further, in addition to the pattern deformation, the patterns of the p-type active regions themselves are bent. When forming gate electrodes (in this case, the word line WL and the common gate lines 306a and 306b) on them, the mismatch of the photo masks ends up causing fluctuations in the transistor size (size of channel formation region).

For example, in FIG. 80, if the gate patterns of the common gate lines 306a, 306b etc. are is offset to the right with respect to the patterns of the p-type active regions 302a, 302b (actually, the LOCOS patterns), the gate width of the drive transistor Qn2 will decrease and the gate width of the drive transistor Qn1 will increase. Conversely, if the gate patterns are offset to the left, the gate width of the drive transistor Qn1 will decrease and the gate width of the drive transistor Qn2 will increase. In both cases, this will result in the characteristics of the two inverters constituting the flip-flop becoming unequal and will result in a drop in the stability of the flip-flop and further the data retention characteristic of the SRAM memory cell.

Further, if a gate pattern is offset downward, the gate widths of the word transistors Qn3 and Qn4 will both become smaller. Accordingly, when reading from or writing to the SRAM memory cell, the resistance of the path of the cell current flowing from the bit line to the word transistor, the storage node, the drive transistor, and then the common potential supply line will become larger, especially at the "low-node" side held by a low potential level, therefore the read or write operation become slower. Conversely, when the gate pattern is offset upward, while there is no problem with the cell shown in FIG. 80, in the adjoining cell above FIG. 80 arranged vertically symmetrically across from the cell contact, the same thing happens as with the gate pattern being offset downward in FIG. 80 and as a result, the resistance of the path of the cell current increases and the read or write operation becomes slower.

In this way, if the sizes at the n-MOS side change, that is, the sizes of the drive transistors and the word transistors change relative to each other, the cell characteristics (data retention characteristic, high speed, etc.) will become lower.

Further, the amount of mismatch of patterns differs slightly depending on the location in the wafer (for example, by each chip), therefore the change in characteristics also changes depending on the location in the wafer. This shows up as differences in characteristics of the finished semiconductor devices in the memory cell array or between chips.

The problem of the reduction in of fluctuation of characteristics arising due to the transistor sizes also occurs in the split word line type SRAM cell shown in FIG. 81.

In the split word line type SRAM cell 310, the active regions 312, 314 are commonly connected between adjoining cells. The commonly connected portions are bent with respect to the other portions, so the change in size at both the drive transistors Qn1, Qn2 and the load transistors Qp1, Qp2 adjoining the bent portions becomes a problem. In particular, this type of SRAM cell is susceptible to mismatch in the direction in which the bit lines are laid and differences easily occur between inverters. In this case as well, the data retention characteristic of the memory cell and the read or write speed fall.

The problems of the decline and fluctuation in these characteristics can be avoided by arranging the gate electrodes sufficiently away from the bent parts of the active regions, but this increases the cell area and therefore is not desirable.

Note that, in the related art, the power voltage supply line was formed by a metal interconnection, but, for example as shown in FIG. 81, it was necessary to lay the power voltage supply line at a pitch of the same extent as the LOCOS or first-layer polycrystalline silicon interconnections (word lines WL1, WL2 or common gate lines 316A, 316B). In this case, in high-resolution patterning, while the resist film becomes thinner, since it is necessary to secure a certain thickness of the resist film remaining after etching, the metal interconnection for forming the power voltage supply line cannot be made too thick. For example. if the thickness of the resist at this time is made 0.7 $\mu$m in the same way as when forming the LOCOS or the first-layer polycrystalline silicon interconnections, the thickness of the metal interconnection for forming the power voltage supply line has to be made no more than 200 nm.

With a metal interconnection of a thickness of no more than 200 nm, however, the material of the interconnections becomes limited to a titanium-based material in view of the required resistance to electro-migration (EM). As a result, there is the problem that the resistance of the power voltage supply line cannot be lowered.

To avoid this problem, if trying to form the metal interconnections by the low resistance Al, it is necessary to make the total thickness of the metal interconnections, including the anti-reflective coating and barrier metal provided above and below the Al, 400 nm in view of the EM resistance. In this case, it is necessary to make the thickness of the resist at the time of patterning the interconnections at least two times that when patterning the first-layer polycrystalline silicon layers (for example, at least 1.4 $\mu$m). Therefore, the pitch of the Al interconnections has to be made about 1.5 times larger than the first-layer polycrystalline layers.

For example, in the example of FIG. 81, assuming the sizes of the cell in the x- and y-directions to be substantially the same, it is too considerably difficult to arrange 2.5 fourth-layer metal interconnections by Al interconnections in a size of one side of the same cell where four first-layer polycrystalline silicon layers are arranged.

In the cell pattern shown in FIG. 81, the size of the cell in the bit line direction was determined by the first-layer polycrystalline silicon layers, therefore further reduction of size is difficult unless these can be made finer in pattern.

On the other hand, the size of the cell in the word line direction was determined by the pitch of the second-layer and higher interconnections. Therefore, to reduce the resistance of the power voltage supply line, due to the above-mentioned restrictions on the material and pitch of the interconnections, it is necessary to further increase the number of layers of the inner connections. Increasing the number of layers of the interconnections, however, would not only make the producing process more complicated, but would also significantly detract from the cost-reducing effect resulting from the reduction of the cell size or conversely cause the cost to increase and therefore is not desirable.

SUMMARY OF THE INVENTION

An object of the present invention is to provide a semiconductor memory device having a cell pattern and cell structure capable of effectively preventing deterioration of characteristics caused by a pattern mismatch at the time of gate formation and capable of reducing the resistance of the power voltage supply line while effectively keeping down any increase in the memory cell area or conversely reducing it.

Another object of the present invention is to provide a method of producing a semiconductor memory device capable of reducing the pitch of node interconnections by improving their process of formation.

According to a first aspect of the present invention, there is provided a semiconductor memory device comprising a plurality of memory cells formed in a substrate, each memory cell including a first transistor having a first conductivity type and a second transistor having a second conductivity type different to the first conductivity type, each memory cell comprising: a first active region being formed in the substrate, and channels of the first transistor being formed therein; and a second active region being formed in the substrate, and channels of the second transistors being formed therein; the first and second active regions being arranged so that the directions of channel current flows of the first and second transistors become parallel to each other in each cell, and being separated between adjoining memory cells in a direction perpendicular to the directions of channel current.

Such a pattern of arrangement of active regions is preferable for a so-called split word line type SRAM cell in which n-type active regions are connected in series and two different word lines are made to perpendicularly intersect the two ends thereof to form word transistors.

According to a second aspect of the present invention, there is provided A semiconductor memory device comprising a plurality of memory cells each including a first and second inverters each of which comprises a drive transistor of a first conductivity type and a load transistor of a second conductivity type connected in series between a first power voltage supply line and a second power voltage supply line and having gates connected in common, and an input terminal of the first inverter is connected to an output terminal of the second inverter and an output terminal of the first inverter is connected to an input terminal of the second inverter, wherein at least one of the first power voltage supply line and the second power voltage supply line is a trench interconnection layer formed by a conductive material buried in a trench formed through an interlayer insulating layer.

This configuration may be broadly applied to not only split word line type SRAM cells, but also single word line type SRAM cells.

According to a third aspect of the present invention, there is provided a semiconductor memory device comprising a plurality of memory cells each comprising: first and second inverters each of which comprises a drive transistor having a first conductivity type and a load transistor having a second conductivity type connected in series between a first power voltage supply line for supplying a first power voltage and a second power voltage supply line for supplying a second power voltage and having gates connected in common and an input terminal of the first inverter is connected to an output terminal of the second inverter and an output terminal of the first inverter is connected to an input terminal of the second inverter, and two word transistors having the first conductivity type each having one impurity region functioning as a source or drain connected to the input terminal of each inverter, having the other impurity regions connected to different bit lines, and having gates connected to different word lines, the other impurity region of one of the two word transistors being connected to an upper-layer bit line via a bit line connecting interconnection extending in the word line direction, and at least one of the first power voltage supply line and the second power voltage supply line and the bit line connecting interconnection being a trench interconnection formed by a conductive material buried in a trench formed through the same interlayer insulating layer.

This configuration preferably can be applied to a split word line type SRAM cell.

According to a fourth aspect of the present invention, there is provided a semiconductor memory device comprising a plurality of memory cells each comprising: first and second inverters each of which comprises a drive transistor having a first conductivity type and a load transistor having a second conductivity type connected in series between a first power voltage supply line for supplying a first power voltage and a second power voltage supply line for supplying a second power voltage and having gates connected in common and an input terminal of the first inverter is connected to an output terminal of the second inverter and an output terminal of the first inverter is connected to an input terminal of the second inverter, a first buried conductive formed in contact on an impurity region to which the first or second power voltage is supplied among impurity regions forming the source or drain of the drive transistors and load transistors and buried in a first interlayer insulating layer, and a second buried conductive formed in contact on the first buried conductive and buried in a second interlayer insulating layer.

This configuration may be broadly applied to not only split word line type SRAM cells, but also single word line type SRAM cells.

According to a fifth aspect of the present invention, in the fourth aspect, the second buried conductive is a trench interconnection formed by a conductive material buried in a trench formed through a second interlayer insulating layer as the first or second power voltage supply line.

This configuration may be broadly applied to not only split word line type SRAM cells, but also single word line type SRAM cells.

According to a sixth aspect of the present invention, there is provided a semiconductor memory device comprising a plurality of memory cells each including first and second inverters each of which comprises a drive transistor having a first conductivity type and a load transistor having a second conductivity type connected in series between a first power voltage supply line and a second power voltage supply line and having gates connected in common and an input terminal of the first inverter is connected to an output terminal of the second inverter and an output terminal of the first inverter is connected to an input terminal of the second inverter, wherein: one of said first and second power voltage supply lines being a trench interconnection formed by a conductive material buried in a trench formed through the interlayer insulating layer, and the other of said first and second power voltage supply lines being an upper-layer interconnection from the trench interconnection and being interconnected between adjoining cells in a direction perpendicular to a direction of arrangement of the other power voltage supply line.

This configuration preferably can be applied to a split word line type SRAM cell.

Explaining this in other words, in the semiconductor memory device of the various aspects of the present invention, the p-type and n-type transistor active regions are arranged in parallel to the direction of channel current of the transistors in the cells. Specifically, the p-type and n-type transistor active regions can be formed for example by simple rectangular patterns arranged in parallel to each other or by substantially rectangular patterns provided with step differences etc. to change the gate widths of the word transistors and the drive transistors. Accordingly, it is possible to arrange the gate electrode patterns formed overlapping thereon (word line or common gate lines) in parallel with each other.

Further, in the semiconductor memory device according to the above aspects of the present invention, the transistor active regions are separated between adjoining cells in directions perpendicularly intersecting the directions of their arrangement and do not have bent portions like in the past. Due to this, the sizes of all transistors in the cell (sizes of overlap regions of gate electrode patterns and active regions) change uniformly due to mismatch at the time of overlaying a gate electrode pattern on the pattern of already formed active regions. The sizes of the transistors in the cell change uniformly not only in the case of offset of the pattern in the x- or y-directions, but also in the case of rotation error (θ error). Therefore, no imbalance occurs in the characteristics of the transistors in a cell.

Further, in the semiconductor memory device according to the above aspects of the present invention, the power voltage supply line is a trench interconnection formed buried in an interlayer insulating layer. This trench interconnection may be made the same thickness as the interlayer insulating layer(for example, 400 nm or more), so can be made thicker than a metal interconnection. Further, as the material of the power voltage supply line, it is possible to select a tungsten-based material etc. having a smaller specific resistivity than a titanium-based material. Further, by making the power voltage supply line a trench interconnection, depending on the cell pattern, there is often room for increasing the width of the power voltage supply lines around it.

Further, in the semiconductor memory device according to the above aspects of the present invention, for example, the contact structure between the power voltage supply line and an impurity region to which the power voltage is to be applied under the node interconnections of the SRAN cell is achieved by two buried conductive layers. Specifically, the lower-layer first buried conductive layer can be made by the trench interconnection, while the upper-layer second buried conductive layer can be made by another trench interconnection forming the power voltage supply line. Alternatively, the second buried conductive layer may be made by another trench interconnection or a plug etc. for connecting the first buried conductive layer (trench interconnection) to a further upper-layer power voltage supply line.

Generally, the two node interconnections in an SRAM cell have to be laid to reach from one common gate line side to the other common gate line in a limited space. Considering the need for a node contact for the electrical contact with the other common gate line as well, in many cases there is no extra margin of space for storage node interconnections to be laid.

By using the above-mentioned contact structure of the semiconductor memory device of the present invention to arrange the location of connection of the trench interconnection first buried conductive layer and second buried conductive layer more to the outside in a cell, an extra margin is given for arranging the node interconnections above the impurity region. That is, the space for arrangement of the node interconnections is expanded outward. Therefore, the node interconnections are no longer disturbed by the power supply line contact giving the power voltage to the transistors or the ground line contact and they become easier to arrange. Further, assuming the same pitch of the node interconnections as in the past, it becomes possible to reduce the space between active regions by that amount.

According to a seventh aspect of the present invention, there is provided a semiconductor memory device provided with a plurality of memory cells each including two inverters which are comprised of drive transistors of a first conductivity type and load transistors of a second conductivity type connected in series between a first power voltage supply line for supplying a first power voltage and a second power voltage supply line for supplying a second power voltage and which have inputs and outputs connected cross-wise, wherein at least one node interconnection among two node interconnections is comprised of an interconnection layer of the same level as the interconnection layer forming the other node interconnection and an etching mask layer formed on the interconnection layer by the same pattern and having an etching rate slower than the underlying interconnection layer.

According to an eighth aspect of the present invention, there is provided a method of producing a semiconductor memory device provided with a plurality of memory cells each including two inverters which are comprised of drive transistors of a first conductivity type and load transistors of a second conductivity type connected in series between a first power voltage supply line for supplying a first power voltage and a second power voltage supply line for supplying a second power voltage and having gates connected in common and which have inputs and outputs connected cross-wise, comprising, when forming first and second interconnections for interconnecting the inputs and outputs of the two inverters: successively forming over the entire surface a conductive film for forming node interconnections and a film having an etching rate slower than the conductive film; using the pattern of the first interconnections to process the film with the slower etching rate so as to form an etching mask layer; and using the pattern of the second interconnections to process the conductive film so as to form the first and second node interconnections while using the thus formed etching mask layer to protect the portions of the conductive film directly underneath.

In the semiconductor memory device and the producing method of the present invention, compared with the conventional approach of forming two node interconnections at one time by a single photo mask, the pitch of the node interconnection pattern is eased or the space between two node interconnections can be reduced.

BRIEF DESCRIPTION OF THE DRAWINGS

These and other objects and features of the present invention will become clearer from the following description of the preferred embodiments given with reference to the attached drawings, in which:

FIGS. 69A to 69D are plan views and sectional views of a method for producing an SRAM cell according to a 10th embodiment of the present invention showing up to the formation of a first contact and a comparative example;

FIGS. 70A to 70D are plan views and sectional views of a method for producing an SRAM cell according to a 10th embodiment of the present invention showing up to the formation of a film when forming the second-layer interconnections (storage node interconnections) and a comparative example;

FIGS. 74A to 74D are plan views and sectional views of a method for producing an SRAM cell according to a 10th embodiment of the present invention showing up to the patterning of the conductive film and a comparative example;

FIGS. 76A to 76D are plan views and sectional views of a method for producing an SRAM cell according to a 10th embodiment of the present invention showing up to the formation of third-layer interconnections (common potential lines etc.) and a comparative example;

FIGS. 78A to 78D are plan views and sectional views of a method for producing an SRAM cell according to a 10th embodiment of the present invention showing up to the formation of bit lines and a comparative example;

FIGS. 79A to 79C are views explaining the design rule and cell size in an SRAN cell of the 10th embodiment along with two comparative examples;

DESCRIPTION OF THE PREFERRED EMBODIMENTS

Below, embodiments of the semiconductor device according to the present invention will be explained in detail with reference to the drawings taking as an example a six-transistor configuration p-MOS load type SRAM cell.

Figure 1:
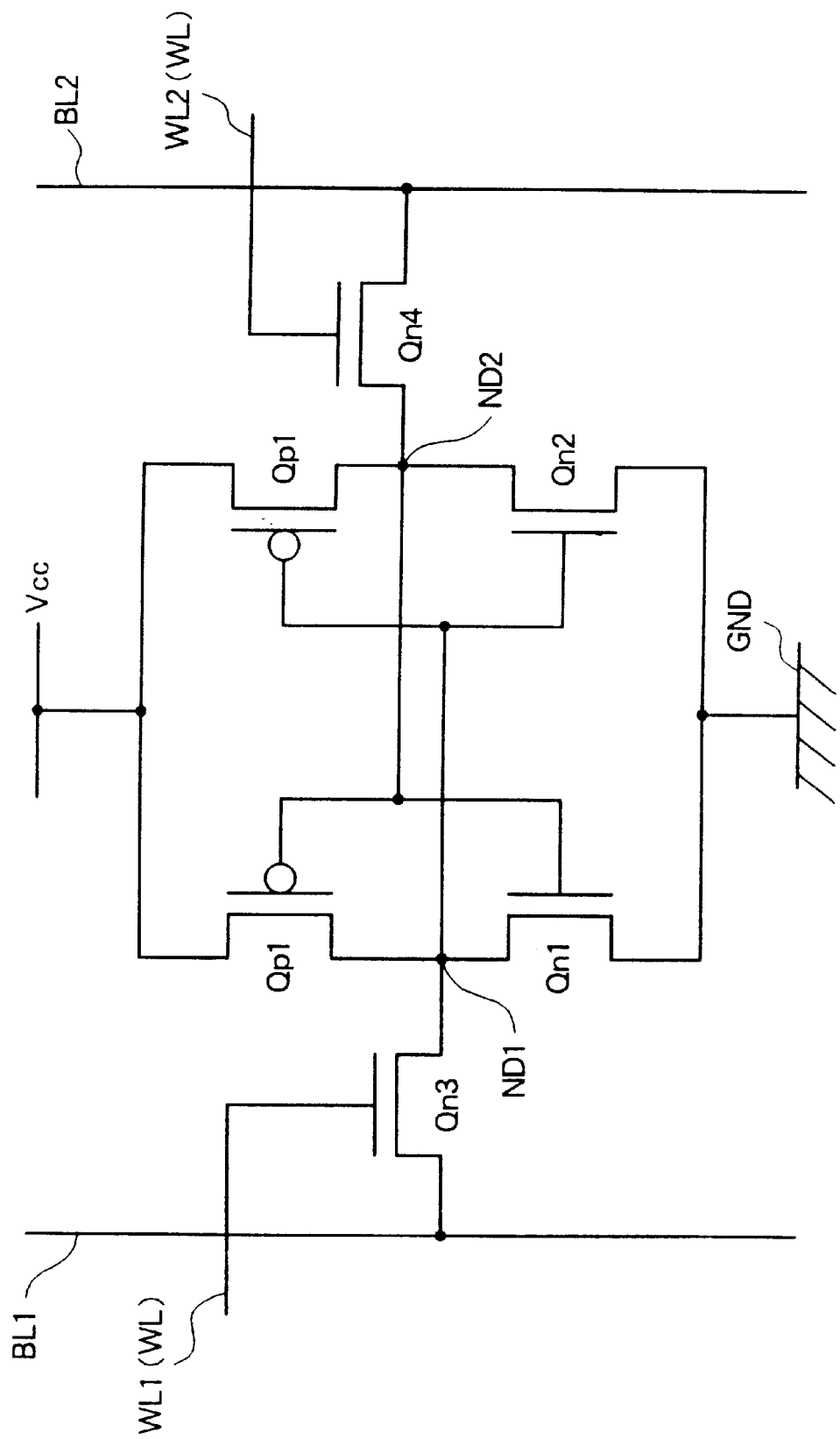
FIG. 1 is a circuit diagram of a p-MOS load type SRAM cell according to an embodiment of the present invention.

FIG. 1 is a circuit diagram of a p-MOS load type SRAM cell according to an embodiment of the present invention.

In FIG. 1, n-MOS's Qn1 and Qn2 indicate drive transistors, and p-MOS's Qp1 and Qp2 indicate load transistors. These constitute two inverters with input lines intersecting with each other, with the input of one connected to an output of the other, and with the input of the other connected to an output of the one. Further, the n-MOS's Qn3 and Qn4 show word transistors which control whether to connect connection points of the inverters (storage nodes ND1, ND2) to bit lines BL1, BL2 in accordance with voltage supplied to the word lines WL1, WL2. This cell configuration is a general one and therefore a more detailed explanation of the connections will be omitted here.

In this p-MOS load SRAM cell, one bit line BL1 is made a high potential level and a predetermined voltage is supplied to the gates of the word transistors Qn3, Qn4 to turn the two transistors Qn3, Qn4 on and store charges at the storage nodes ND1, ND2. The drive transistors Qn1, Qn2 and the load transistors Qp1, Qp2 operate so that when one storage node becomes "high (H)", as a characteristic of the flip-flop configuration, the other storage node becomes "low (L)". For example, when the storage node ND1 is "H" and the storage node ND2 is "L", the transistors Qn2 and Qp1 are in the on-state and the transistors Qn1 and Qp2 are in the off-state. The storage node ND1 is charged from the supply line of a power voltage $V_{cc}$ and the storage node ND2 continues being held at the ground potential. Conversely, if making the word transistor Qn3 on when the bit line BL1 potential is "L" to forcibly make the storage node ND1 shift to "L" or if making the word transistor Qn4 on when the bit line BL2 potential is "H" to forcibly make the storage node ND2 shift to "H", the transistors Qn1, Qn2, Qp1, and Qp2 are invert, the storage-node ND2 is charged from the supply line of the power voltage $V_{cc}$, and the storage node ND1 is held at the ground potential. By holding the charges in a flip-flop manner in this way, it is possible to hold the charges stationarily at the storage nodes ND1, ND2, make whether the potentials are "L" or "H" correspond to the data "1" and "0", and store this data in the six transistors in the cell.

FIGS. 2A to 2D are views for explaining six-transistor type SRAM cells to which the present invention may be applied and are pattern diagrams of the state after the formation of first contacts.

Figure 2A:
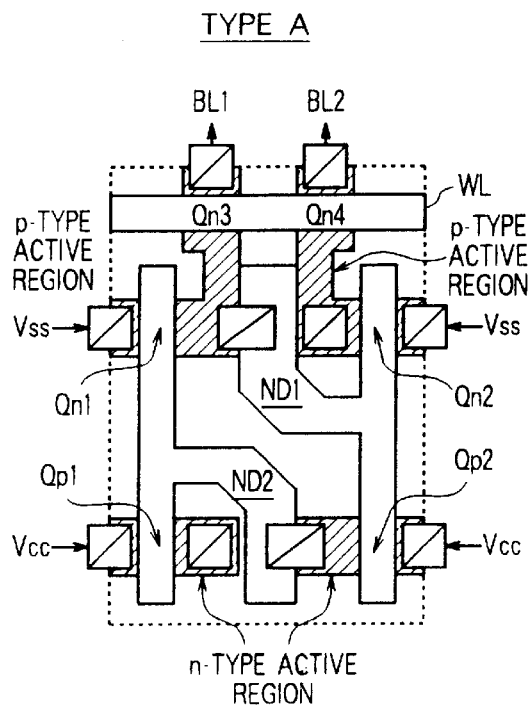
FIGS. 2A to 2D are explanatory views of six-transistor type SRAM cells to which the present invention may be applied.

In the type A shown in FIG. 2A, there are two split p-type active regions in which n-MOS's are to be formed and two split n-type active regions in which p-MOS's are to be formed in the cell. Further, the two p-type active regions are bent and both perpendicularly intersect the same word line WL to form a word transistor. A common potential $V_{ss}$ is supplied from outside ends of the two p-type active regions. In the same way, a power voltage $V_{cc}$ is supplied from outside ends of the two n-type active regions.

Figure 2B:
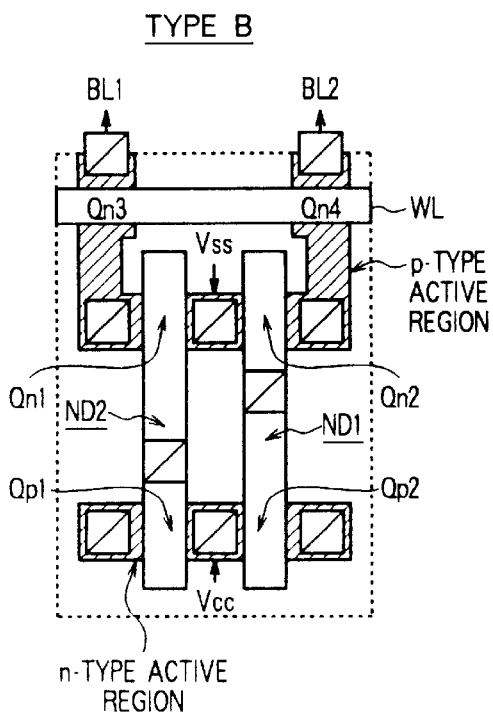

In the type B shown in FIG. 2B, compared with type A, there is only one p-type active region and n-type active region. A common potential $V_{ss}$ or power voltage $V_{cc}$ is supplied from the center portions thereof.

Figure 2C:
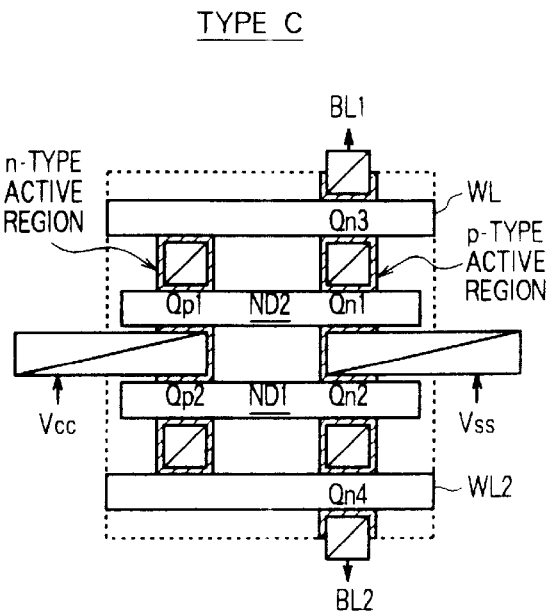
Figure 2D:
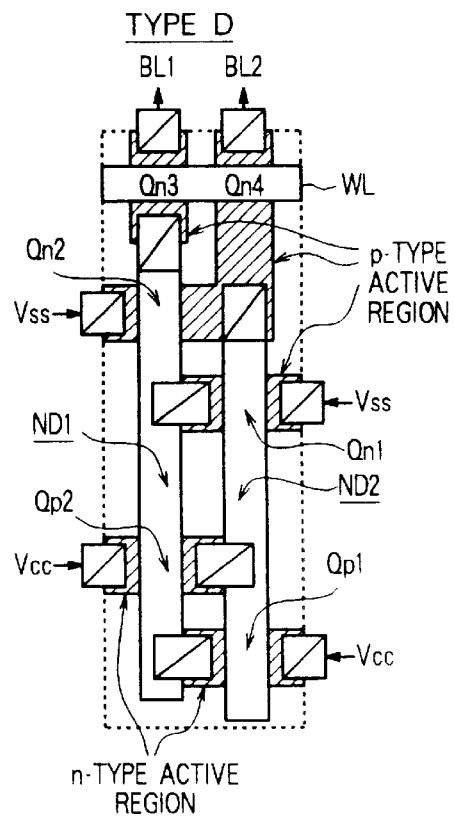

In the type D shown in FIG. 2D, the node interconnections are made by only the first-layer polycrystalline silicon layer and are arranged in parallel, so the p-type active region is separated into three parts and the cell becomes longer in to vertical direction compared with the type A.

The type C shown in FIG. 2C is a so-called "split word line type" where the p-type active region and n-type active region perpendicularly intersect the first-layer polycrystalline silicon layer including the two word lines WL1, WL2, whereby word transistors are formed at the two ends of the p-type active region.

Among these, the present invention applies to the types A to C.

The features of the present invention and the types of SRAM cells to which they apply may be roughly summarized as follows:

[1] The p-type active region and the n-type active region are arranged so that the directions of channel current of the transistors formed in each become parallel and are separate for each cell (type C).

[2] The power voltage supply line is made a trench interconnection formed by a conductive material buried in trench formed through an interlayer insulating layer (types A to C).

[3] The contact structure to a power voltage supply line is formed using two layers of contacts (types A to C).

[4] The bit line connecting interconnection is formed by a trench interconnection (types A to C).

[5] The pattern is made one where when one power voltage supply line is made a trench interconnection, the other is made an upper-layer metal interconnection and these are connected between two cells perpendicular to the direction of their arrangement (preferably type C, but also types A and B).

[6] When making the film for forming two storage node interconnections two layers, forming an upperlayer side etching cover layer by one interconnection pattern, and patterning the lower-layer conductive film by another interconnection pattern, the etching cover layer is made to function as an etching mask and two storage node interconnections are simultaneously formed (preferably type C, but also types A and B).

Below, specific embodiments of the present invention will be explained with reference to the drawings.

Note that in the following explanation, the cell structure will be made clear by describing the method of producing an SRAM cell according to the embodiments.

First Embodiment

FIGS. 3A and 3B to FIG. 8A to 8C are views of patterns and sectional structures in the method of producing an SRAM cell according to a first embodiment of the present invention. FIGS. 3A, 4A, 5A, 6A, 7A, and 8A are overlay views of the patterns, while the other figures are sectional views along the lines A–A' or the lines B–B'.

Figure 3A:
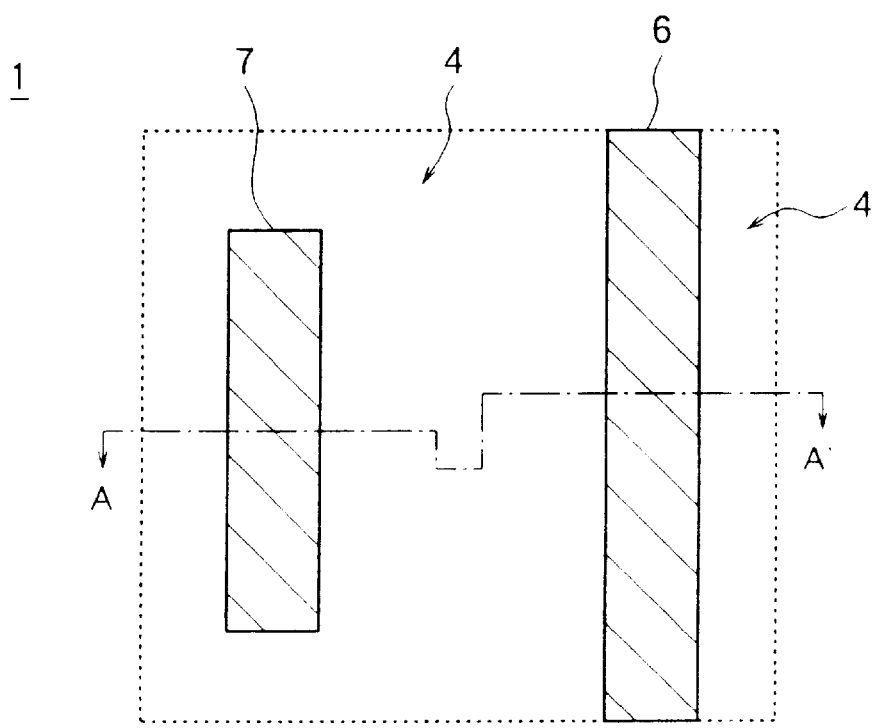
FIGS. 3A and 3B are a plan view and a sectional view of a method of producing an SRAM cell according to a first embodiment of the present invention showing up to the formation of the active regions.
Figure 3B:
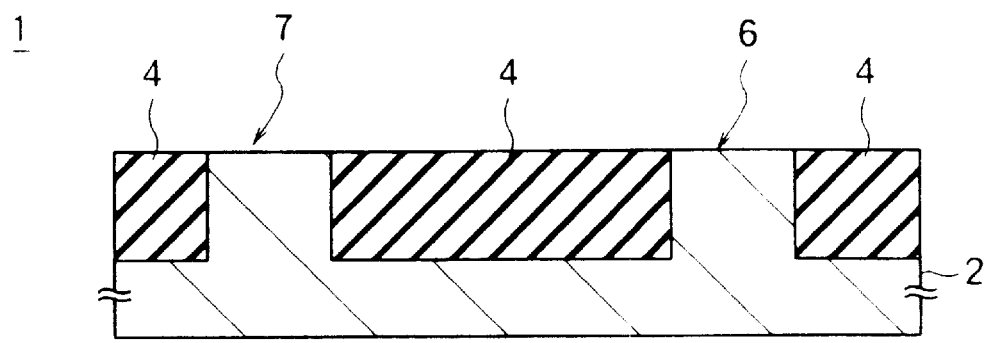

In the state shown FIGS. 3A and 3B, while not particularly illustrated, a p-type well and n-type well are formed in a semiconductor substrate 2 such as a silicon wafer. On the front side of the semiconductor substrate 2, shown as FIGS. 3A and 3B, an element isolation region 4 such as a LOCOS or trench is formed. By this, the surface region of the p-type well where the element isolation region 4 is not formed becomes a p-type active region 6 in which n-MOS channels are to be formed. Further, the surface region of the n-type well where the element isolation region 4 is not formed becomes the n-type active region 7 where p-MOS channels are to be formed. In the illustrated example, the two active regions 6, 7 have rectangular shape patterns and are formed in parallel with each other.

Figure 4A:
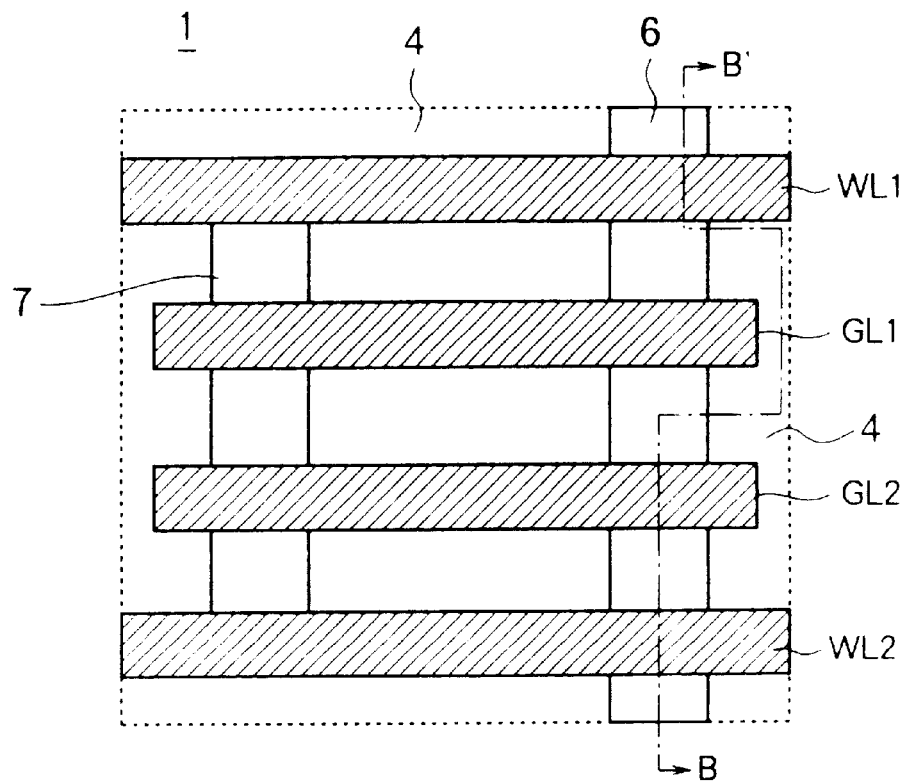
FIGS. 4A and 4B are a plan view and sectional view of a method of producing an SRAM cell according to a first embodiment of the present invention showing up to formation of the gate electrode pattern (word line and common gate lines)
Figure 4B:
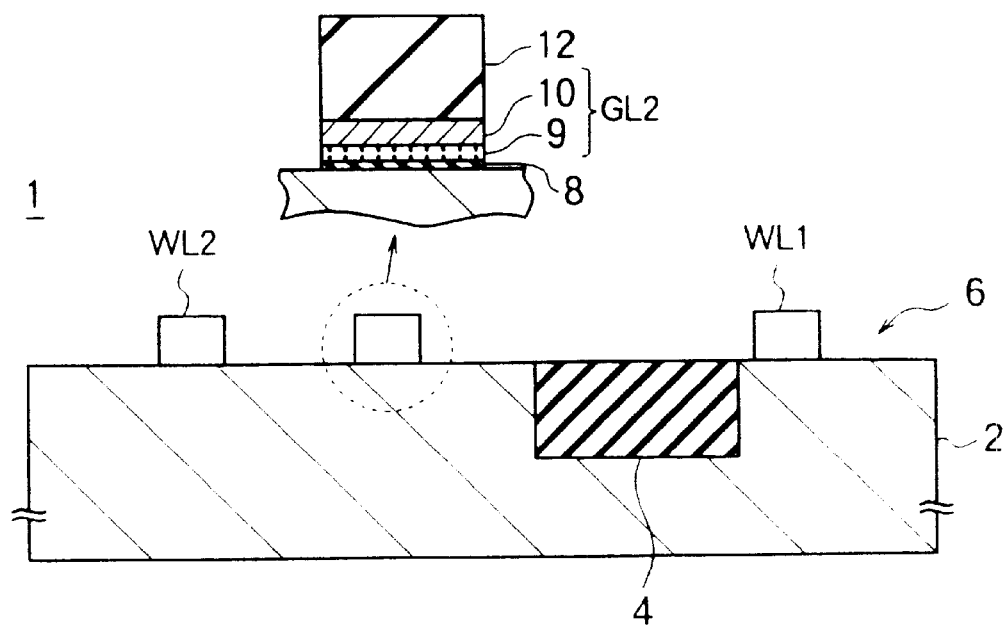

In the step shown in FIGS. 4A and 4B, ion-implantation is performed for adjusting the threshold voltage of the transistors or forming channel stoppers as needed, then a gate oxide film 8, a first-layer polycrystalline silicon or polycide (hereinafter referred to as "1PS"), and an offset insulating film 12 are successively formed over the entire surface. In this example, the 1PS is comprised of a polycrystalline silicon film 9 and a tungsten silicide ($WSi_x$) film 10, while the gate oxide film 8 and the offset insulating film 12 are made of silicon oxide. The thicknesses of both of the polycrystalline silicon film 9 and the tungsten silicide film 10 are made about 70 nm, while the thickness of the offset insulating film 12 is made about 200 nm. The polycrystalline film 9 is doped with impurities at or after the time of forming it to make it conductive.

Next, the offset insulating film 12, 1PS, and gate oxide film 8 are successively processed using the gate electrode pattern. By this, two word lines WL1, WL2 serving also as gate electrodes of the word transistor Qn3 or Qn4, a common gate line GL1 serving also as gate electrodes of the drive transistor Qn1 and the load transistor Qp1, and a common gate line GL2 serving also as gate electrodes of the drive transistor Qn2 and the load transistor Qp2 are formed simultaneously.

In this embodiment, the two word lines WL1, WL2 are arranged in parallel perpendicularly intersecting near the two ends of the p-type active region 6 and passing through the cells. Further, the common gate lines GL1, GL2 are arranged in the space between word lines WL1, WL2 to perpendicularly intersect both of the p-type active region 6 and the n-type region 7 and, in this example, to be parallel with each other so as to be equidistant along with the word lines WL1, WL2. Note that the common gate lines GL1, GL2 are rectangular patterns provided in each cell and are separated from the common gate lines of adjoining cells in the word line direction.

Figure 5A:
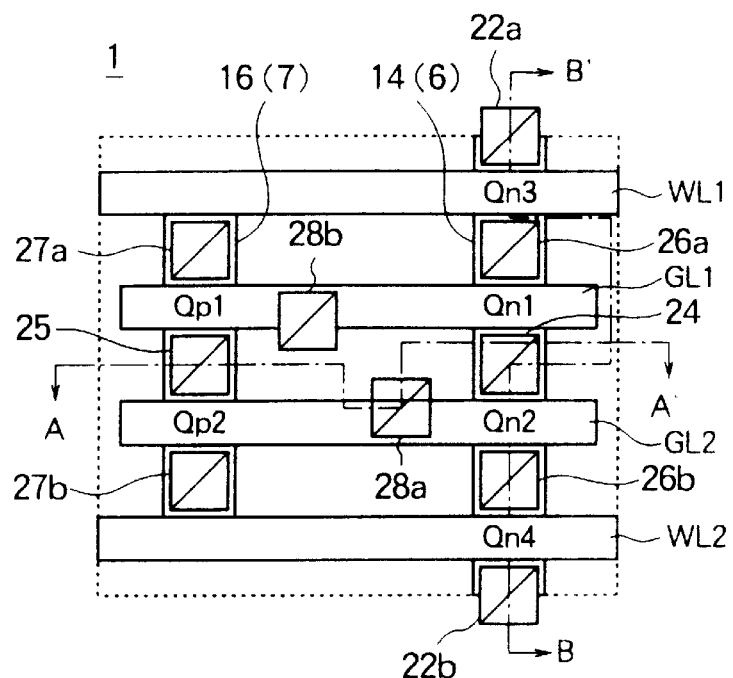
FIGS. 5A to 5C are a plan view and sectional views of a method of producing an SRAM cell according to a first embodiment of the present invention showing up to formation of the first contact.
Figure 5B:
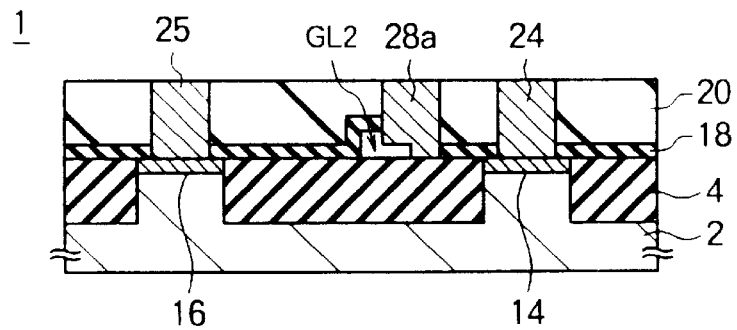
Figure 5C:
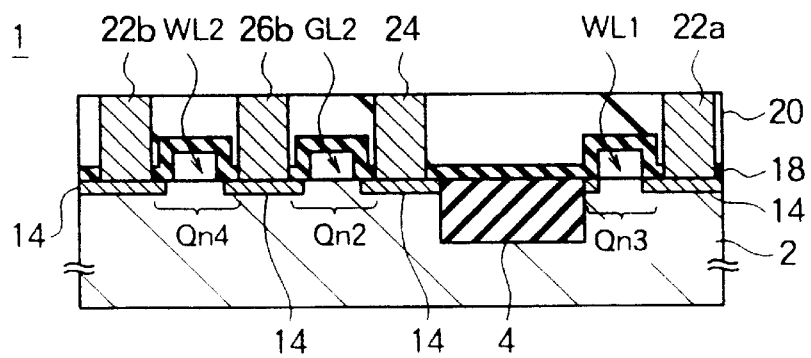

In FIGS. 5A to 5C, source and drain impurity regions of the transistors are formed. Hore specifically, in the state where the n-type active region 7 is covered by for example a resist pattern and using the stacked pattern of the 1PS and the offset insulating film 12 and the element isolation region 4 as a self-alignment mask, n-type impurities are doped at a high concentration at the surface of the p-type region 6 to form $n^+$-impurity regions 14. A similar method is used to dope p-type impurities at the surface of the n-type active region 7 to form $p^+$-impurity regions 16. Due to this, the word transistor Qn3, the drive transistor Qn1, the drive transistor Qn2, and the word transistor Qn4 are simultaneously formed in a state of serial connection in the p-type active region 6, while the load transistors Qp1, Qp2 are simultaneously formed in a state of serial connection in the n-type active region 7.

Next, a first interlayer insulating layer is formed on the entire surface and flattened as needed. In this example, the first interlayer insulating layer is made from two types of films with high etch selectivities, for example, a lower-layer silicon nitride film 18 and an upper-layer silicon oxide film 20, so as to realize the self-aligned contacts explained below. The thickness of the silicon nitride film 18 is made about 100 to 200 nm, while that of the silicon oxide film 20 after flattening is made about 200 to 300 nm above the offset insulating film.

In the first interlayer insulating films 18, 20, two types of contact holes, that is, eight self-aligned contact holes 22A to 27B opening at the impurity regions 14, 16 and gate line contact holes 28A, 28B opening on the common gate lines GL1, GL2, are formed by separate photolithography and producing steps.

Figure 9A:
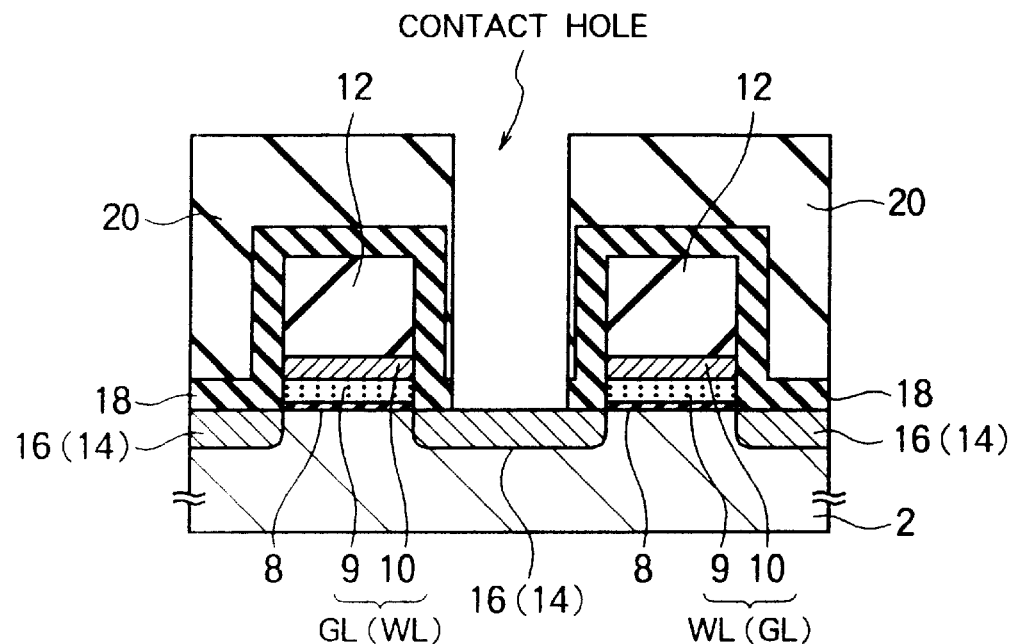
FIGS. 9A and 9B are enlarged sectional views of states after forming a self-aligned contact hole in the step of FIGS. 5A to 5C.
Figure 9B:
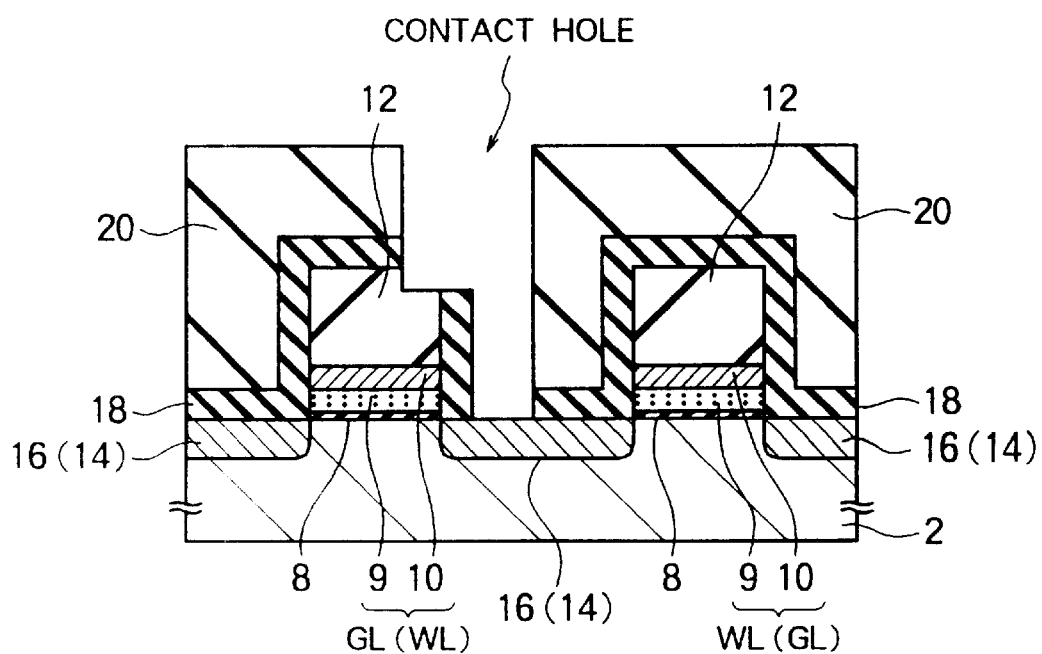
Figure 10:
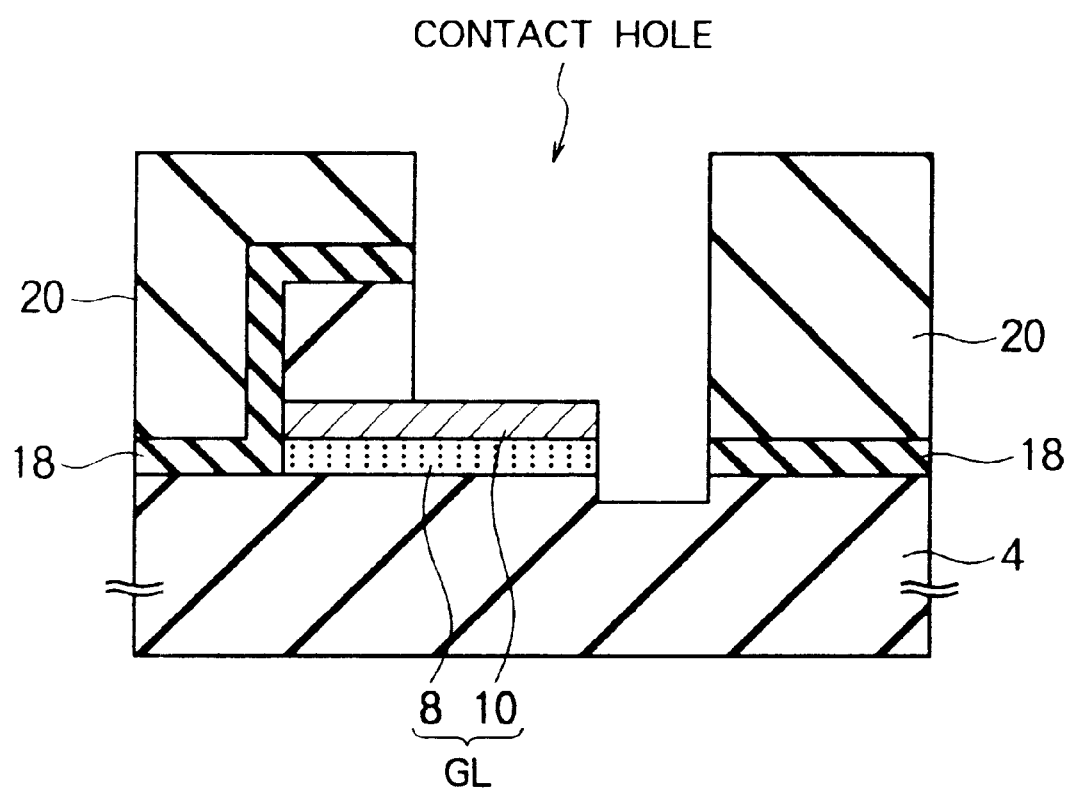
FIG. 10 is an enlarged sectional view of the state after forming a gate line contact hole in the step of FIGS. 5A to 5C.
Figure 11A:
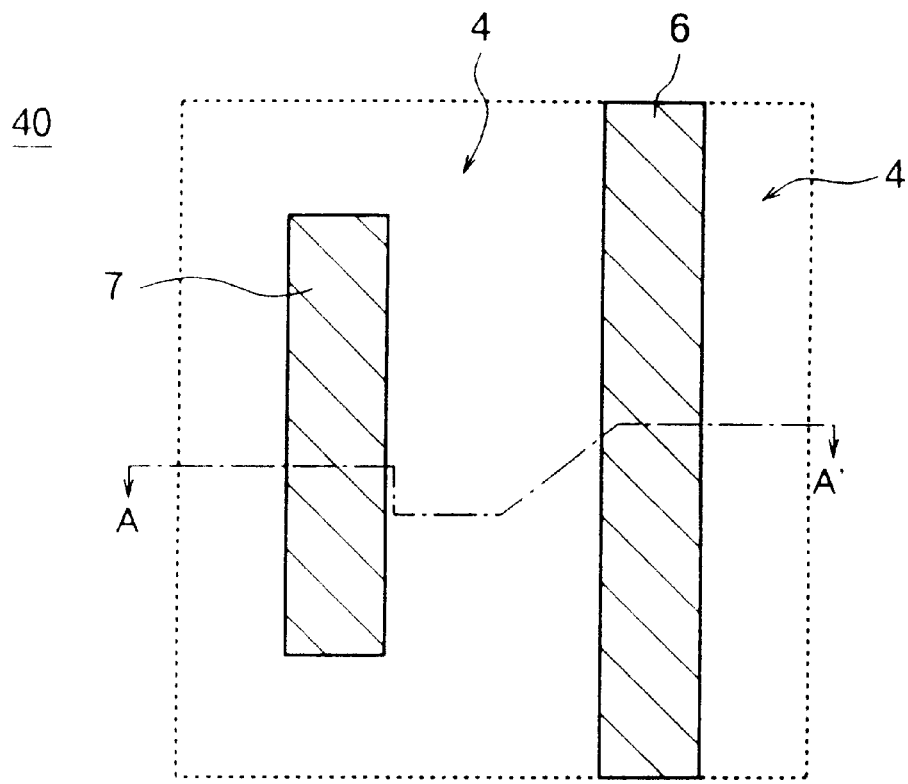
FIGS. 11A and 11B are a plan view and sectional view of a method of producing an SRAM cell according to a second embodiment of the present invention showing up to formation of the active regions.
Figure 11B:
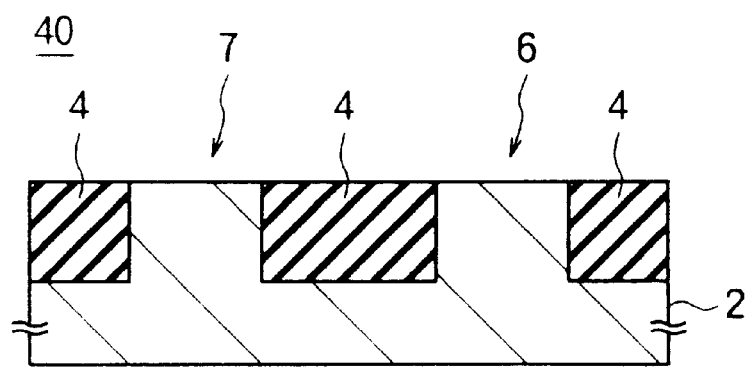
Figure 12A:
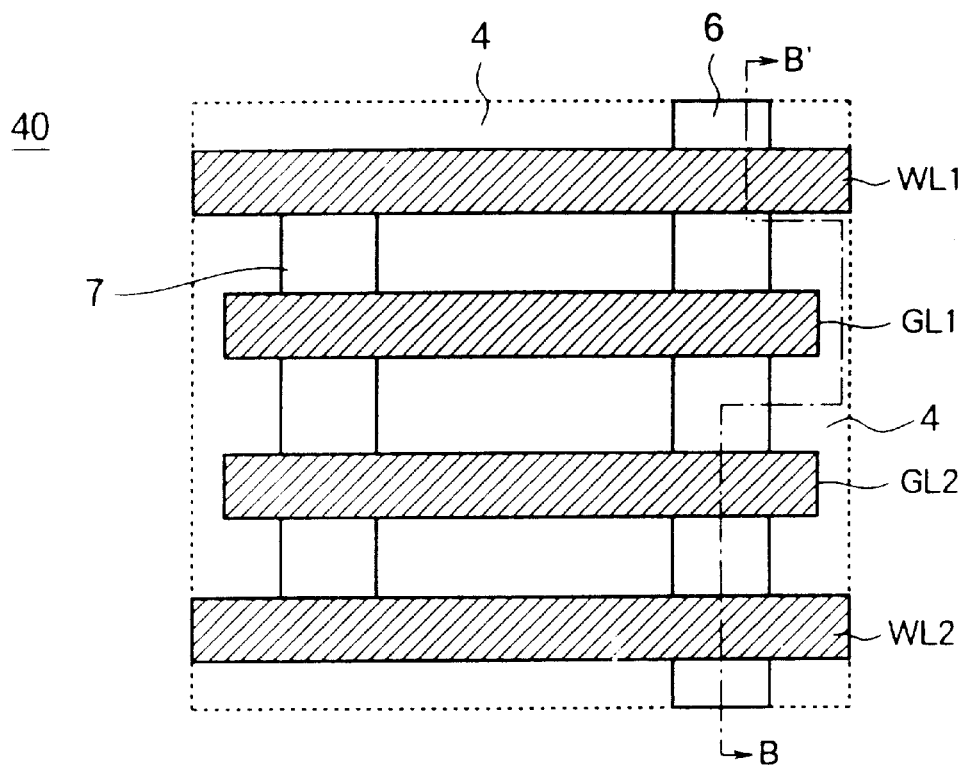
FIGS. 12A and 12B are a plan view and sectional view of a method of producing an SRAM cell according to a second embodiment of the present invention showing up to formation of the gate electrode pattern (word line and common gate lines)
Figure 12B:
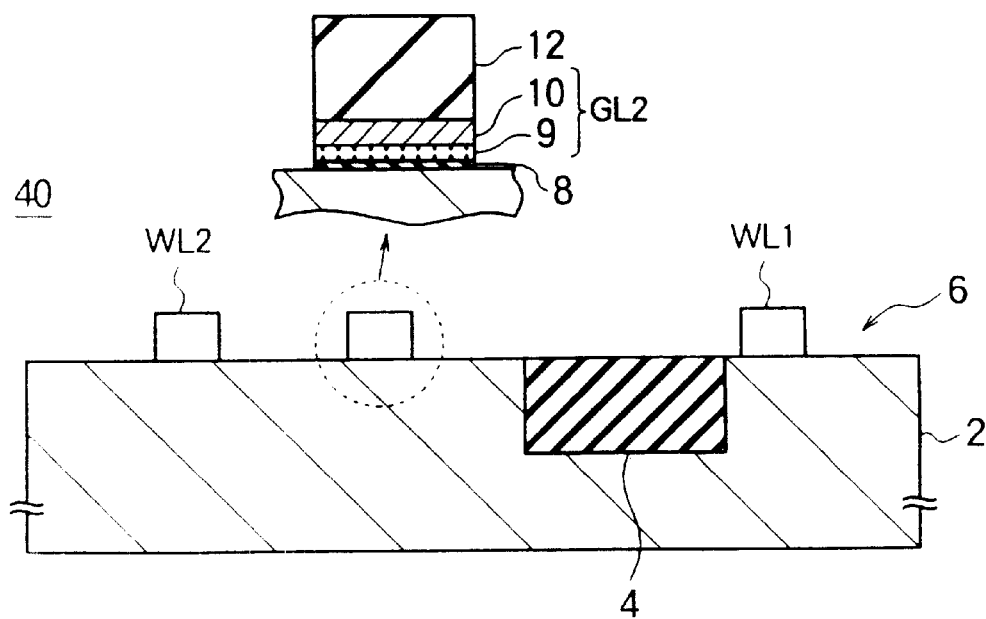

FIGS. 9A and 9B are enlarged sectional views of a self-aligned contact, while FIG. 10 is one of a gate line contact, both in the open state.

In the formation of both of these contact holes, a resist pattern is formed by photolithography, then the resist pattern is used for anistropic etching of the insulating films. In this anisotropic etching, as a first step, the silicon oxide film 20 is etched under conditions giving selectivity with the silicon nitride film 18, then the second step of etching is performed on the silicon nitride film 18.

In forming the self-aligned contact holes, if there is no misalignment when forming the resist pattern, as shown in FIG. 9A, an impurity region surfaces at the entire bottom face of the contact hole. Contrary to this, if there is misalignment, by making the first interlayer insulating layer two layers with a high etch selectivity, as shown in FIG. 9B, it is possible to reduce the amount of etching above the gate electrodes relatively. For example, if the etch selectivity at the time of the above first stage of the etching under the previously mentioned film forming conditions is "10", with this etching, while the part of the silicon oxide film 20 of the thickness of about 540 to 640 nm above the impurity region is being removed completely, the part of the silicon oxide film 20 of the thickness of about 200 to 300 nm above the gate electrode is removed, then the silicon nitride film 18 is etched only to about half of its thickness. Next, if the second stage of etching is performed with the etch selectivity of "1", the impurity region surfaces, but above the gate electrode, the top portion of the offset insulating film 12 is further etched slightly (about 50 to 100 nm). By increasing the anisotropy by these two stages of etching, part of the silicon nitride film 18 is left as a separating spacer layer the side of the gate electrode.

Next, plugs are simultaneously formed in these contact holes using a usual plug formation technique.

Due to this, as shown in FIG. 5A, the bit line contacts 22a, 22b are formed by self-alignment on the two $n^+$-impurity regions sandwiched by the word lines between adjoining cells. Further, storage node contacts 26a, 26b are formed by self-alignment on the two $n^+$-impurity regions sandwiched by the word line WL1 or WL2 and common gate line GL1 or GL2, while the storage node contacts 27a, 27b are formed on the two $p^+$-impurity regions. Further, a common potential line contact 24 is formed by self-alignment on the $n^+$-impurity region sandwiched between the common gate lines, while a power supply line contact 25 is formed on the $p^+$-impurity region.

On the other hand, gate line contacts 28a, 28b are formed on the common gate lines GL1 and GL2, respectively.

In this way, in the present example, by providing the offset insulating film 12, making the first interlayer insulating layer two layers of a high etch selectivity, and performing two stage etching when simultaneous forming the holes for the storage node contacts, power supply line contact, and common potential line contact, self-alignment of contacts (strictly speaking, self-alignment relating to avoidance of electrical short-circuits) is achieved.

Further, from the viewpoint of ensuring enough space for arrangement of the upper-layer interconnections mention below, the gate contacts 28a, 28b are superposed with the common gate line at their inside portions in the width directions. To prevent an increase in the contact resistance along with this, as shown in FIG. 10, the contacts 28a, 28b are structured to ensure a certain contact area at the upper face and side faces of the common gate line.

Figure 6A:
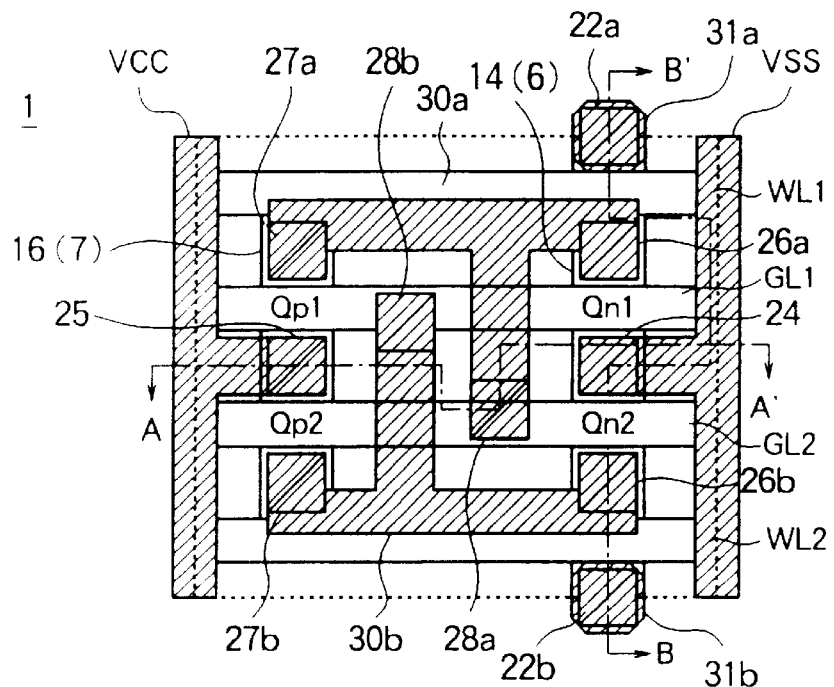
FIGS. 6A to 6C are a plan view and sectional views of a method of producing an SRAM cell according to a first embodiment of the present invention showing up to formation of the second-layer interconnections (storage node interconnections, power supply line, and common potential line)
Figure 6B:
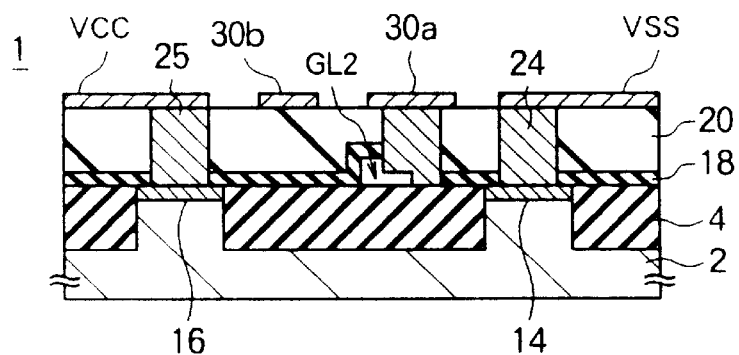
Figure 6C:
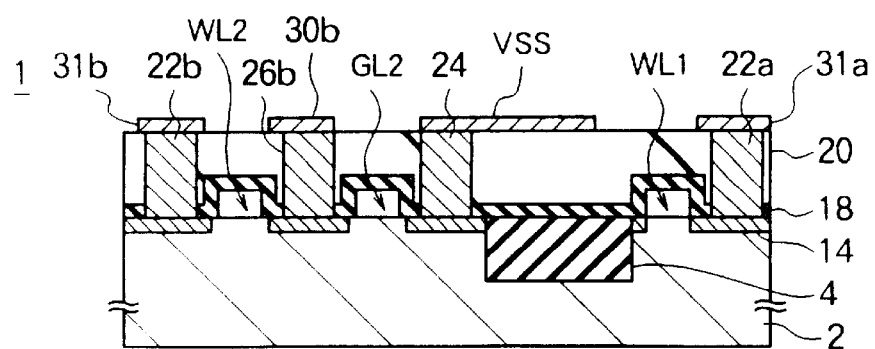

In FIGS. 6A to 6C, the second-layer inter connections are formed by an ordinary method.

Due to this, a first storage node interconnection 30a connecting the storage node contacts 26a, 27a and the gate line contact 28a to form the storage node ND1 of FIG. 1 and a second storage node interconnection 30b connecting the storage node contacts 26b, 27b and the gate line contact 28b to form the storage node ND2 in FIG. 1 are formed on the first interlayer insulating layer 20. Further, the two power voltage supply lines arranged in the bit line direction (vertical direction of FIGS. 6A to 6C), namely, the common potential line $V_{ss}$ connecting common potential line contacts 24 between cells and the power supply line $V_{cc}$ connecting power supply line contacts 25 between cells, are formed at the two sides of the cells in the word line direction. These power voltage supply lines $V_{ss}$ and $V_{cc}$ are shared between adjoining cells in the word line direction.

Further, in this example, landing pad layers 31a, 31b are provided as independent patterns on the bit line contacts 22a, 22b. These are provided to prevent the inter-plug resistance from increasing even if there is some mismatch at the time of forming the contacts for the next upper-layer plugs.

Figure 7A:
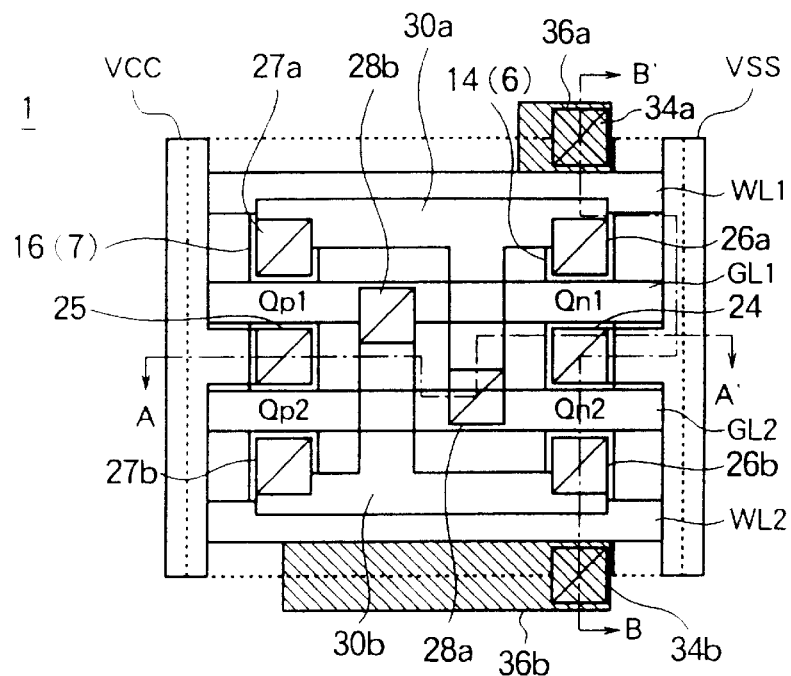
FIGS. 7A to 7C are a plan view and sectional views of a method of producing an SRAM cell according to a first embodiment of the present invention showing up to formation of the third-layer interconnections (bit line connecting interconnections)
Figure 7B:
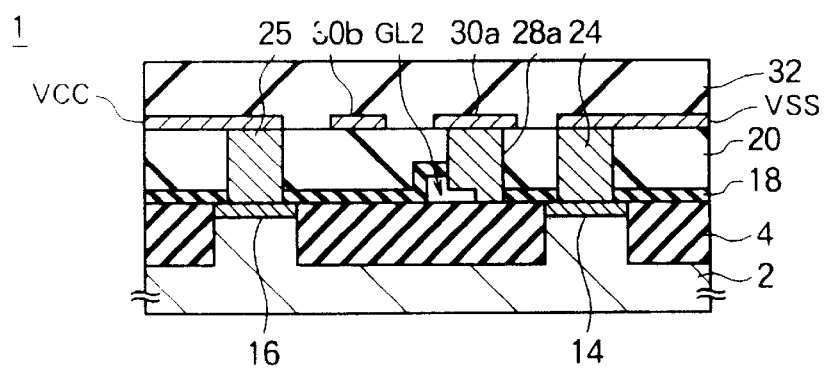
Figure 7C:
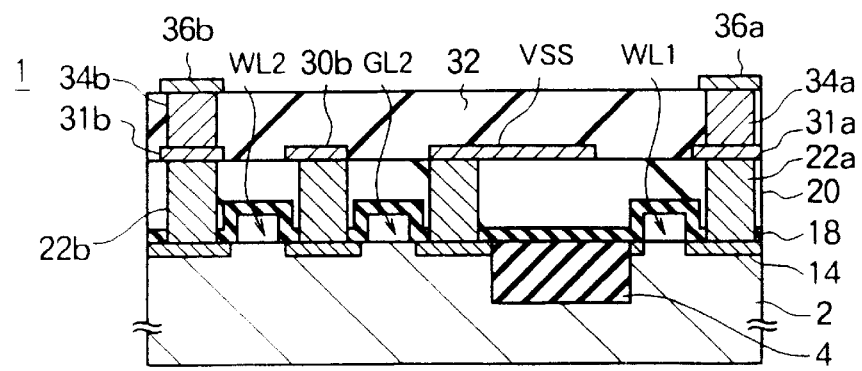

In FIGS. 7A to 7C, first a second interlayer insulating layer 32 is formed over the entire surface, then contact holes are formed above the landing pad layers 31a, 31b provided at the bit line contact portions and a conductive material is buried in them to form the second-layer plugs 34a, 34b. Next, bit line connecting interconnections 36a, 36b contacting the second-layer plugs 34a, 34b are formed. For example, as illustrated, only one is formed by a pattern extending in the word line direction.

Figure 8A:
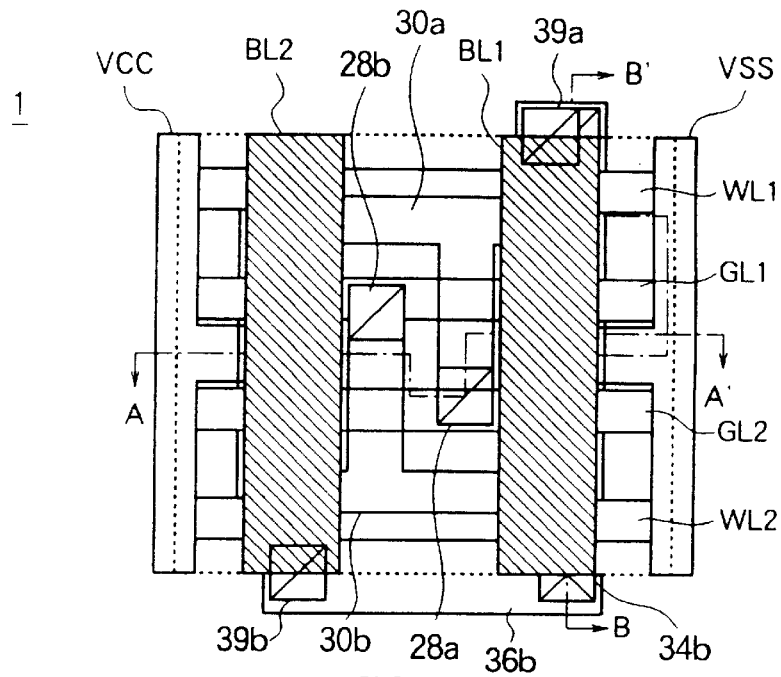
FIGS. 8A to 8C are a plan view and sectional views of a method of producing an SRAM cell according to a first embodiment of the present invention showing up to formation of the fourth-layer interconnections (bit lines)
Figure 8B:
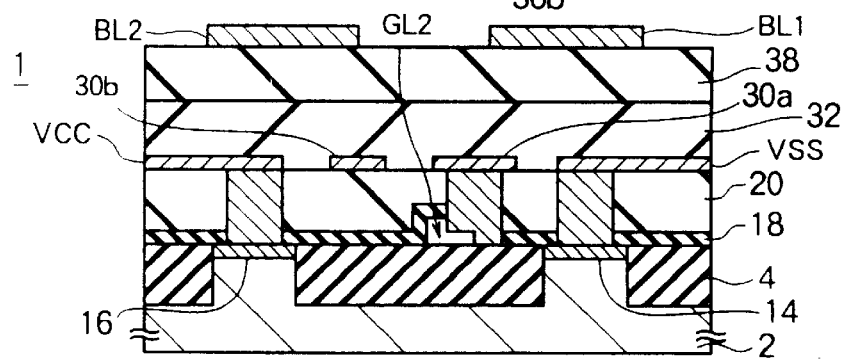
Figure 8C:
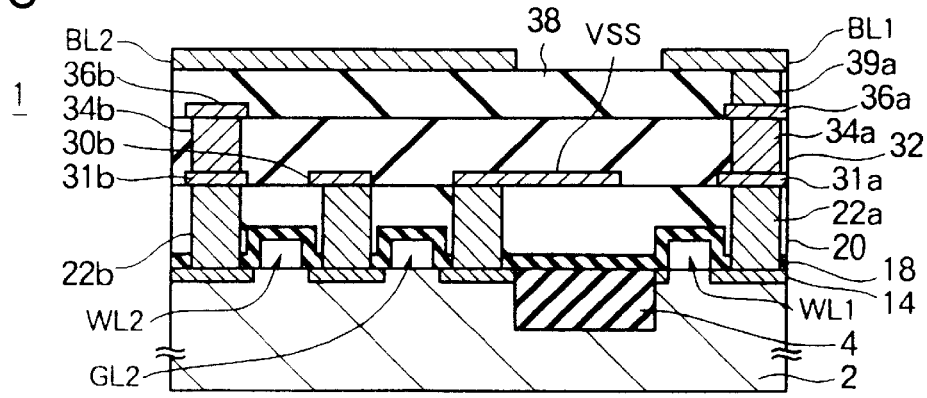

In FIGS. 8A to 8C, similarly, a third interlayer insulating layer 38 and third-layer plugs 39a, 39b are formed. At that time, one plug 39b is provided at the front end portion of the bit line connecting interconnection 36b extending in the word line direction.

Then, bit lines BL1, BL2 connecting on the third-layer plugs 39a, 39b are arranged away from each other and running through the cell in a direction perpendicularly intersecting the word lines.

Next, while not particularly illustrated,. when needed, a further upper-layer interconnection is formed, then an overcoat film is formed, pad windows are formed, and other steps gone through to complete the SRAM.

Note that the semiconductor memory device according to the first embodiment is not limited to the pattern and structure of the SRAM cell explained above and can be modified in a variety of ways. Further, the method of producing it is not limited to that explained above.

In the above explanation, the active regions 6, 7 were made simple rectangular patterns, but for example when desiring to make the gate widths of the drive transistors greater than the gate widths of the word transistors to increase the ratio of capability of the drive transistors and thereby stabilize the cell operation, it is possible to provide a step difference on the pattern at the portion of the active region 6 between two transistors.

Further, in formation of contacts of FIGS. 5A to 5C, the contacts 22b to 27b may be formed not as self-aligned contacts, but by a method of positioning by photo mask alignment. In this case, while the offset insulating film 12 and the silicon nitride film 18 are not needed and therefore the producing process is simple, since it is necessary to ensure a sufficient area for alignment with the gate electrodes, this is disadvantageous in terms of reducing the cell area.

It is also possible to adopt a method of forming self-aligned contacts not requirement alignment by forming side walls and other separating insulating layers at the side faces of the gate electrodes and the offset insulating layer. In this case, since the contact area becomes smaller by the amount of the separating insulating layer, it is necessary to make the distance between gate electrodes larger in advance in order to ensure a certain contact area.

Further, the gate line contacts 28a, 28b may be connected on only the upper face of the gate lines. In the pattern of this example, the predetermined distance from the storage node interconnections shown in FIGS. 6A to 6C can no longer be maintained due to these gate line contacts, but in this case, the storage node interconnections 30a, 30b formed in the step of FIGS. 6A to 6C may be arranged to detour above the word lines to avoid the gate line contacts.

Further, in the above explanation, the word lines and the common gate lines were made the first-layer interconnections serving also as gate electrodes, but these may be formed by second-layer and higher interconnections as well.

Note that the landing-pad layers 31a, 31b shown in FIGS. 6A to 6C may be omitted as well. In this case, in the step of FIGS. 6A to 6C, the bit line connecting interconnections 36a, 36b may be formed simultaneously with the other second-layer interconnections 30a, 30b, $V_{ss}$, and $V_{cc}$.

In the SRAM cell according to the present embodiment, the two active regions 6, 7 in the cell are formed by simple rectangular patterns or substantially rectangular patterns with step differences arranged so that the channel directions of the transistors become parallel and gate electrode patterns formed lying over the same (word lines WL1, WL2 and common gate lines GL1, GL2) are arranged in parallel with each other.

Due to this, the sizes of all transistors in the cell (sizes of overlap regions of gate electrode patterns and active regions) change uniformly due to mismatch at the time of forming the gate electrode patterns. In alignment, there may be not only offsets of the patterns in the x- and y-directions, but rotation error (θ error), but the sizes of all of the transistors change uniformly both in the case of offset in the x- and y-directions and e error.

Especially, since the active regions do not have any bent portions unlike in the related art, they are resistant to effects of deformation of the pattern shapes caused by too much or too little of an exposure intensity. That is, so long as there is no major misalignment affecting up to the ends of the active regions 6, 7 of the rectangular shape pattern, it is possible to effectively avoid the situation of the size of just a particular transistor changing like in the past.

Therefore, since no imbalance occurs in the transistor characteristics in a cell due to mismatch between patterns, the inverter characteristics of the memory cell become stabilized. Therefore, the superior cell characteristic of the charge retention characteristic of an SRAN cell not deteriorating during the producing process can be achieved. Further, since the resistance does not increase at a particular place in the cell current path as in the related art, the write or read speed will not fall either. Further, there is also no variation in the cell characteristics in a memory cell array or between chips due to differences in the amount of mismatch caused by different locations in a wafer.

The cell pattern according to the present embodiment has the following advantages relating to application of the phase shift method.

The phase shift method is a technology for achieving a high resolution of patterns by providing a means for causing a shift in phase, called a "shifter", at the time of formation of the device pattern and using the interference action between the light passing through the shifter and the light passing through its surroundings at the time of exposure to strengthen the intensity of the light at one side of the pattern to cancel out the difference with the other. The prejudicing effect on the distribution of light intensity due to the shifter depends on the size of the shifter (width, thickness, etc.) On the other hand, there is an optimal size according to the positions and shapes of the high resolution pattern and its surrounding patterns. Shifters, however, are usually formed all together, so it is difficult to change the size in accordance with the pattern shape. Further, if the patterns have bent portions or are complicated, phase contradictions will occur and sometimes the shifters will not be able to be provided. Accordingly, for effective improvement of the resolution by the phase shift method, a rectangular repeating pattern with high resolution patterns arranged in one direction is most preferred.

In the present embodiment, the active regions and the word lines and other first-layer inter connections are such rectangular repeating patterns arranged in one direction, therefore miniaturization of the patterns by the phase shift method can be easily realized.

Further, unlike in the first related art, there is no "shared contact" which contacts both an active region and an adjoining polycrystalline silicon layer at the end of that active region. If there is a shared contact, when a mismatch occurs at the time of patterning of the shared contact for both of the active region and the adjoining polycrystalline silicon layer, poor contact can easily occur due to the deformation of the active region in a configuration for establishing contact with the end of the active region such as in the first related art. In this example, there is no need for a shared contact susceptible to this sort of contact problem.

Second Embodiment

The second embodiment shows for example a case of application of the features [1] to [3] of the present invention to the pattern type C.

FIGS. 11A and 11B to FIGS. 17A to 17C are views of patterns and sectional structures of the method of producing an SRAM cell according to the second embodiment. FIGS. 11A, 12A, 13A, 14A, 15A, 16A, and 17A are overlay views of patterns, while the other figures are sectional views along the line A–A' or the line B–B'. Note that, in the present embodiment, parts similar to those in the first embodiment are given the same reference numerals and explanations thereof are omitted.

The steps shown in FIGS. 11A and 11B and FIGS. 12A and 12B are the same as in the previous first embodiment.

Figure 13A:
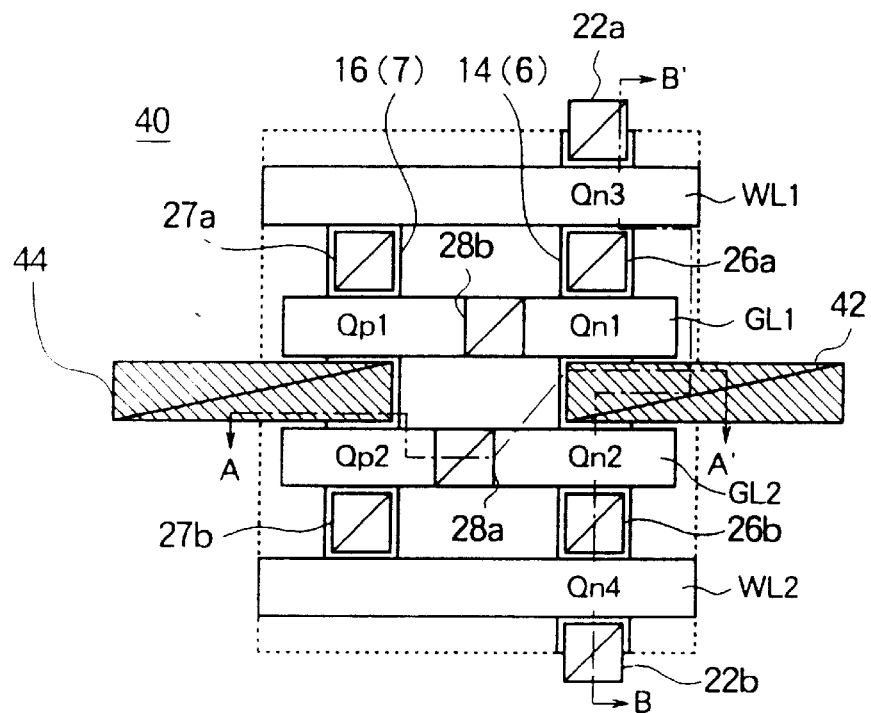
FIGS. 13A to 13C are a plan view and sectional views of a method of producing an SRAM cell according to a second embodiment of the present invention showing up to formation of the first contact.
Figure 13B:
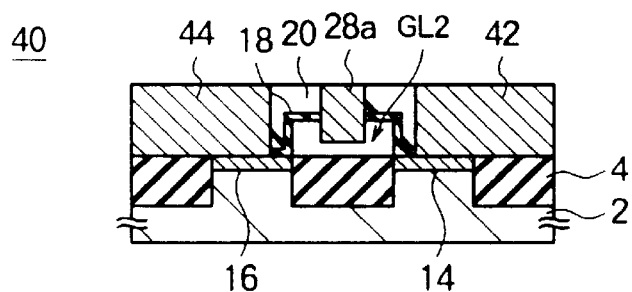
Figure 13C:
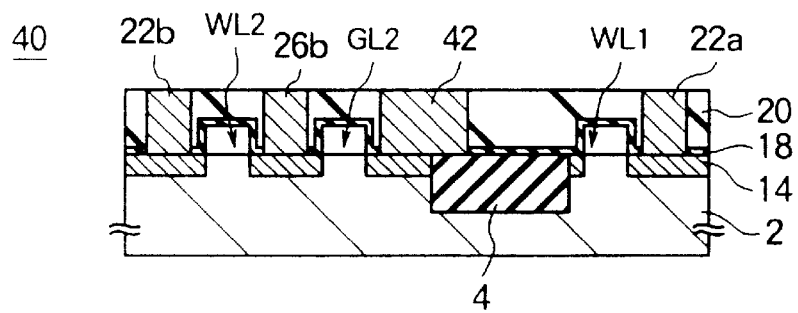

In FIGS. 13A to 13C, the contacts to the common impurity regions between the two inverters, that is, the $n^+$-impurity region to be supplied with a common potential and a $p^+$-impurity region to be supplied with a power voltage, are formed not by plugs, but by rectangular trench interconnections 42, 44 formed buried in the interlayer insulating layer in the same way as plugs. The first-layer trench interconnections 42, 44 are arranged along the common gate lines GL1, GL2 and are shared between two cells adjoining each other in the word line direction. The trench interconnections 42, 44 are formed by a similar method as for the plugs 22a to 27a constituting the self-aligned contacts in the same interlayer insulating layer.

Further, in the present embodiment, gate line contacts 28a, 28b are formed in contact with the upper face of the word lines as explained as a modification of the first embodiment.

Figure 14A:
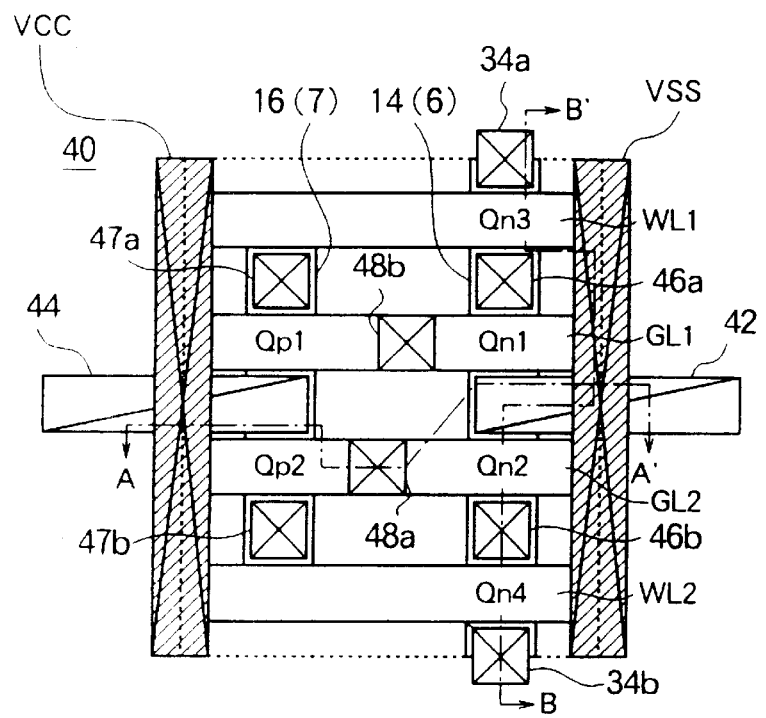
FIGS. 14A to 14C are a plan view and sectional views of a method of producing an SRAM cell according to a second embodiment of the present invention showing up to formation of the second-layer interconnections (power supply line, and common potential line)
Figure 14B:
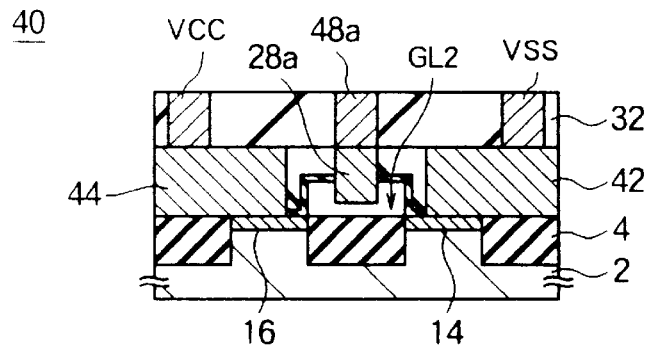
Figure 14C:
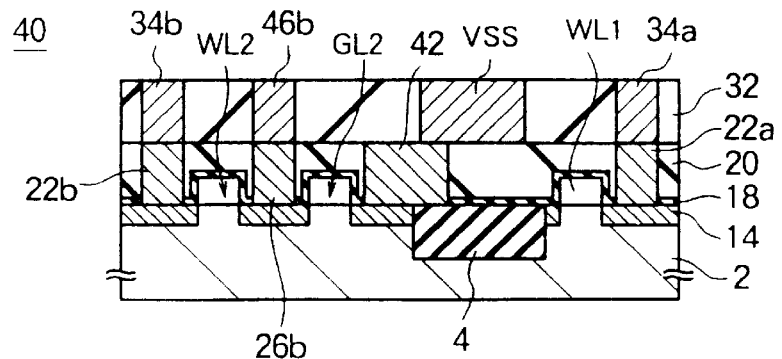

In FIGS. 14A to 14C, the common potential line $V_{ss}$ and a power supply line $V_{cc}$ are formed by second-layer trench interconnections perpendicularly intersecting the first-layer trench interconnection 42 or 44 and contacting its top face. More specifically, the interconnections are not formed on the first interlayer insulating layer 20 unlike in the first embodiment, but a second-layer interlayer insulating layer 32 is formed. In the second-layer interlayer insulating layer 32, the trench interconnection common potential line $V_{ss}$ and the power supply line $V_{cc}$ are formed along the cell boundary in the bit line direction at the same time as forming the second-layer plugs 34a, 34b.

In the present embodiment, unlike in the first embodiment, interconnections (storage node interconnections 30a, 30b in FIGS. 5A to SC) are not formed on the first interlayer insulating layer 20, but are formed on the second-layer interlayer insulating layer. Accordingly, in the step shown in FIGS. 14A to 14C, it is necessary to provide in advance some means of connection for the storage node interconnections. Therefore, at the same time as forming the common potential line $V_{ss}$ and the power supply line $V_{cc}$ made of the trench interconnections and the plugs 34a, 34b, second-layer plugs 46a, 46b, 47a, 47b, 48a, and 48b are formed on the first-layer plugs (storage node contacts or gate line contacts). The plug 46a is formed on the storage node contact 26a, the plug 47a is formed on the storage node contact 27a, and the plug 48a is formed on the gate line contact 28a. Similarly, the plug 46b is formed on the storage node contact 26b, the plug 47a is formed on the storage node contact 27b, and the plug 48b is formed on the gate line contact 28b.

Figure 15A:
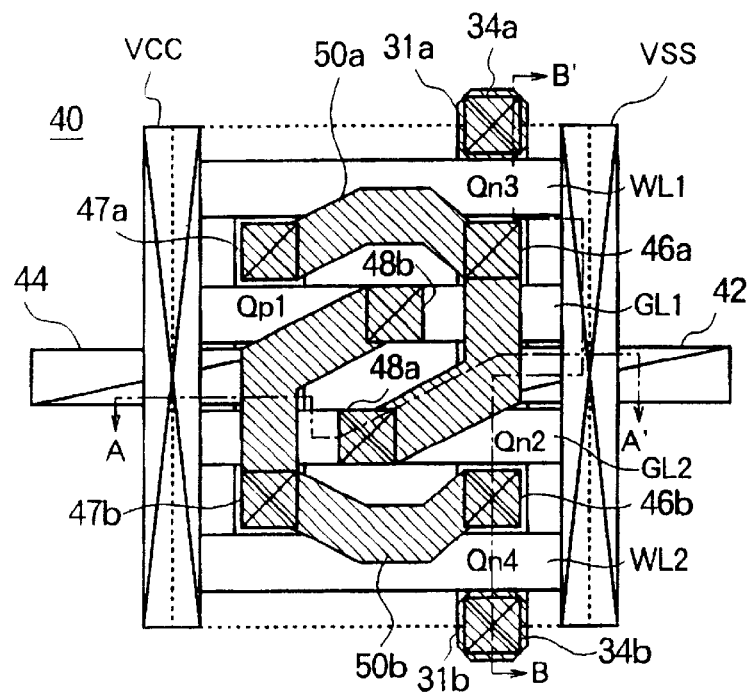
FIGS. 15A to 15C are a plan view and sectional views of a method of producing an SRAM cell according to a second embodiment of the present invention showing up to formation of the third-layer interconnections (storage node interconnections)
Figure 15B:
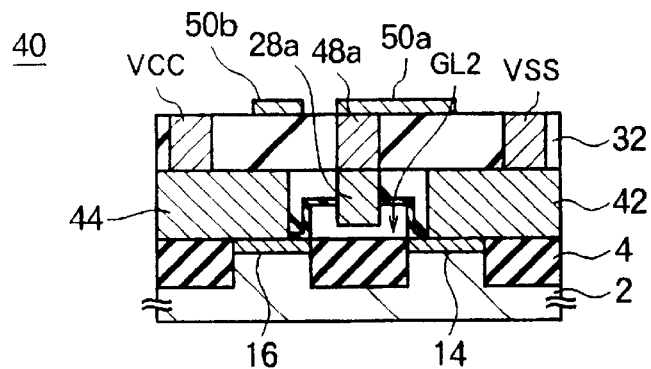
Figure 15C:
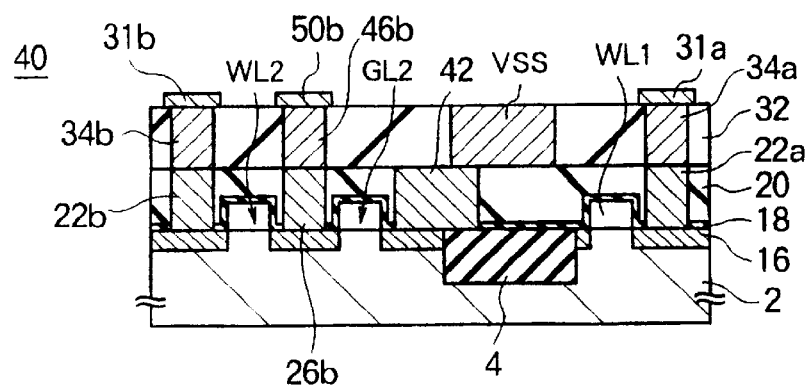

In FIGS. 15A to 15C, storage node interconnections 50a, 50b and landing pad layers 31a, 31b are formed on the second interlayer insulating layer 32 simultaneously as the second-layer interconnections.

The storage node interconnection 50a connects the plugs 46a, 47a, and 48a, while the storage node interconnection 50b connects the plugs 46b, 47b, and 48b. This is similar to the first embodiment in terms of the electrical connections with the transistors, but differs from the first embodiment in the pattern of the storage node interconnections. The storage node interconnection 50a of this embodiment is made to detour above the first-layer trench interconnection 42 and to partially overlap the first-layer trench interconnection 42 through the second interlayer insulating layer 32 so as to avoid becoming close in distance to the plug 48b connected to another gate line contact at a connecting portion of the plug 48a and plug 46a. Similarly, the storage node interconnection 50b is made to detour above the first-layer trench interconnection 44 and to partially overlap the trench interconnection 44 through the second interlayer insulating layer 32 so as to avoid becoming close in distance to the plug 48a at the connecting portion of the plug 48b and the plug 46b. Further, due to the gate line contacts being formed in contact with the top face, the storage node interconnections 50a, 50b are arranged to detour above the word lines at the connecting portion with the plug 47a or 47b.

The subsequent steps are substantially the same as the first embodiment although there is the difference that the layers of the interconnections used are exactly one layer higher than in the first embodiment.

Figure 16A:
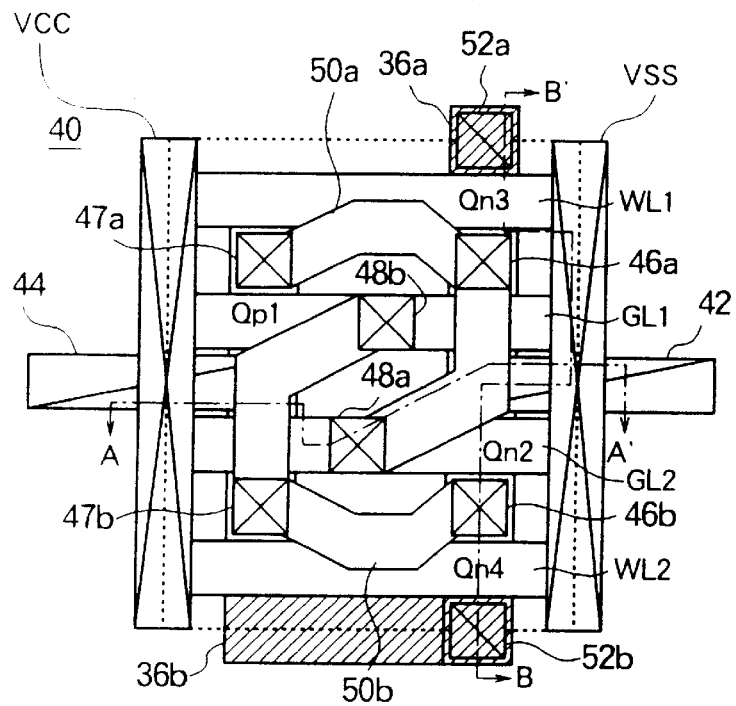
FIGS. 16A to 16C are a plan view and sectional views of a method of producing an SRAM cell according to a second embodiment of the present invention showing up to formation of the fourth-layer interconnections (bit line connecting interconnections)
Figure 16B:
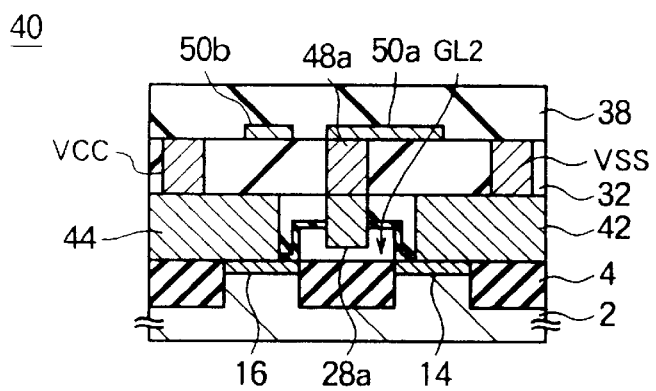
Figure 16C:
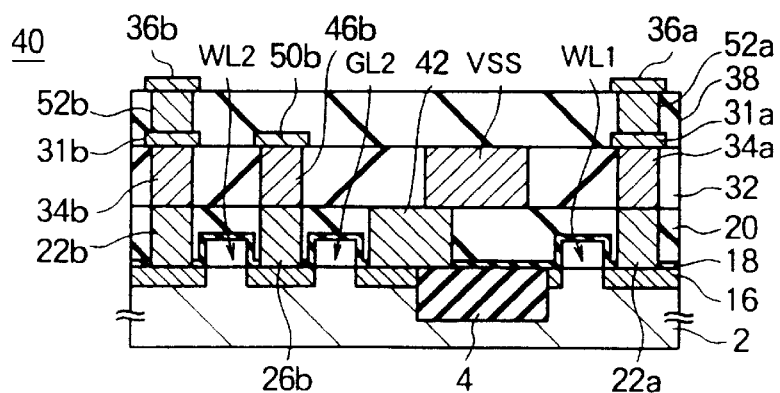
Figure 17A:
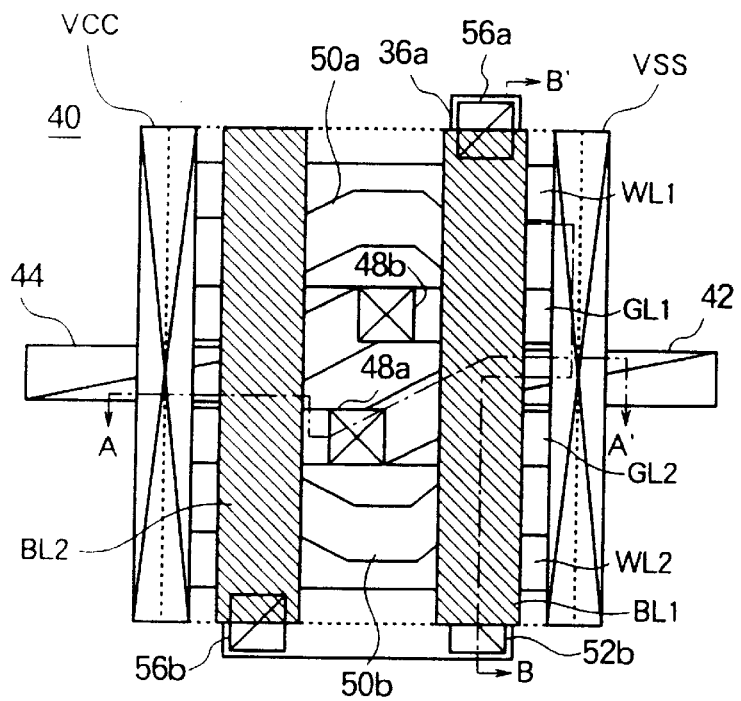
FIGS. 17A to 17C are a plan view and sectional views of a method of producing an SRAM cell according to a second embodiment of the present invention showing up to formation of the fifth-layer interconnections (bit lines)
Figure 17B:
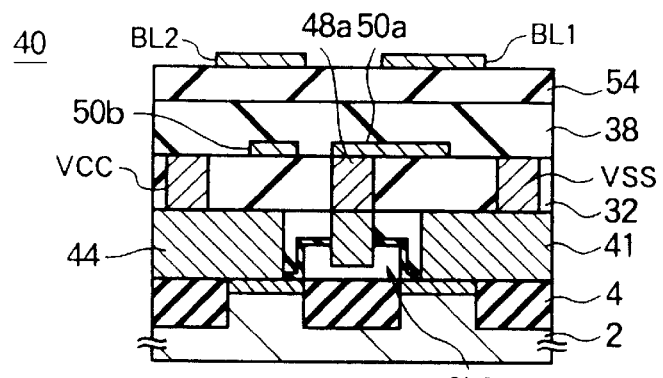
Figure 17C:
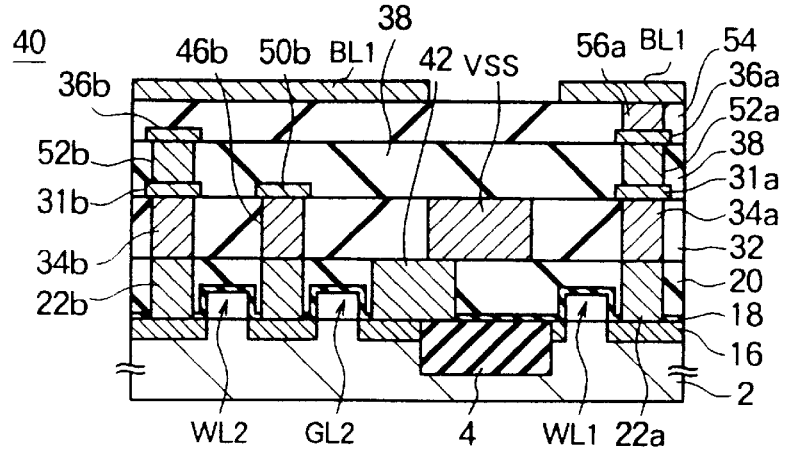

That is, a third interlayer insulating layer 38 is formed, plugs 52a, 52b for bit contact are formed in this, then bit line connecting interconnections 36a, 36b are formed on the third interlayer insulating layer 38 (FIGS. 16A to 16C). Further, a fourth-layer interlayer insulating layer 54 is formed, plugs 56a, 56b for bit contact are formed in this, then bit lines BL1, BL2 are formed on the fourth interlayer insulating layer 54 (FIGS. 17A to 17C). Similar steps as in the first embodiment are then followed to complete the SRAM device.

Note that in this embodiment as well, the various modifications given as examples with reference to the first embodiment may be made or the modification made of leaving the gate line contacts and the upper-layer plugs in the same positions, but rotating them axially to make the pair of parallel sides match the direction of arrangement of the upper-layer storage node interconnections.

In the semiconductor memory device (SRAM device) according to the present embodiment as well, there are advantages same as the first embodiment, that is, there is no deterioration in the data retention characteristic and operating speed due to mismatch of alignment when forming the gate electrode patterns, the characteristics become highly uniform in the memory cell array or between chips, and application of the phase shift method becomes easy and miniaturization simple.

In the SRAM device according to the present embodiment, compared to the first embodiment, there is a difference in the storage node interconnection pattern.

The storage node interconnections, both in the first embodiment and the second embodiment, have to pass on the pattern between the two contacts which are supposed to be kept from contacting the storage node interconnections, that is, the gate line contact and the common potential line or power supply line contact. In the first embodiment, taking for example the storage node interconnection 30a, as shown in FIGS. 6A to 6C, the gate line contact 28b and the common potential line contact 24 were formed by plugs. Since it was necessary to avoid contact with these on the planar pattern, it was necessary to pass the storage node interconnection 30b between these plugs. Therefore, a relatively large space was taken between the two active regions 6, 7 and the storage node interconnection 30A was passed straight in the vertical direction (bit line direction) between the two contacts 24 and 28a on the element isolation region. Accordingly, in the first embodiment, even if the interconnections were formed by the limit resolution and the pattern pitch kept as small as possible, if the minimum pitch was P, at least 5P was necessary as the size in the word line direction and therefore it was hard to reduce the size of the cell beyond that.

As opposed to this, in the present embodiment, as shown in FIGS. 14A to 14C, the contact structure of the common potential line or the power supply line is made two layers. That is, the contact structure is comprised of the first-layer trench interconnections 42, 44 formed buried in the first interlayer insulating layer 20 in the same way as plugs and the second-layer trench interconnections (common potential line $V_{ss}$ or power supply line $V_{cc}$) in contact on the same near the cell boundaries. Further, the storage node interconnections 50a, 50b are laid on the second interlayer insulating layer 32 just one layer. higher than the case of the first embodiment. In this case, the storage node interconnections 50a, 50b need only avoid contact with the upper-layer trench interconnections (common potential line or power supply line) and therefore the flexibility of layout becomes greater compared with the first embodiment the more toward the outside of the cell. Accordingly, in this embodiment, it becomes possible to arrange the storage node interconnections to detour above the common impurity region between the inverters. For example, the storage node interconnections 50a, 50b shown in the figures have the portions laid from the storage node contacts to the gate line contacts inclined to pass above the common impurity region between the inverters and the first-layer trench interconnection 42 or 44 to reach the element isolation region. By making these portions inclined, it is possible to secure a sufficient distance from the other gate line contacts which are not supposed to be contacted even if making the space between active regions smaller and therefore it is possible to reduce the cell size in the word line direction compared to the first embodiment.

Further, in the present embodiment, by making the power voltage supply lines $V_{ss}$ and $V_{cc}$ trench interconnections, while some alignment margin is needed to prevent contact with the storage node interconnections 50a, 50b, the alignment margin can be made smaller than the space between interconnections of the same level. Therefore, the size of the cell in the word line direction can be made smaller by that amount or the power voltage supply lines $V_{ss}$, $V_{cc}$ can be made that much wider.

Figure 81:
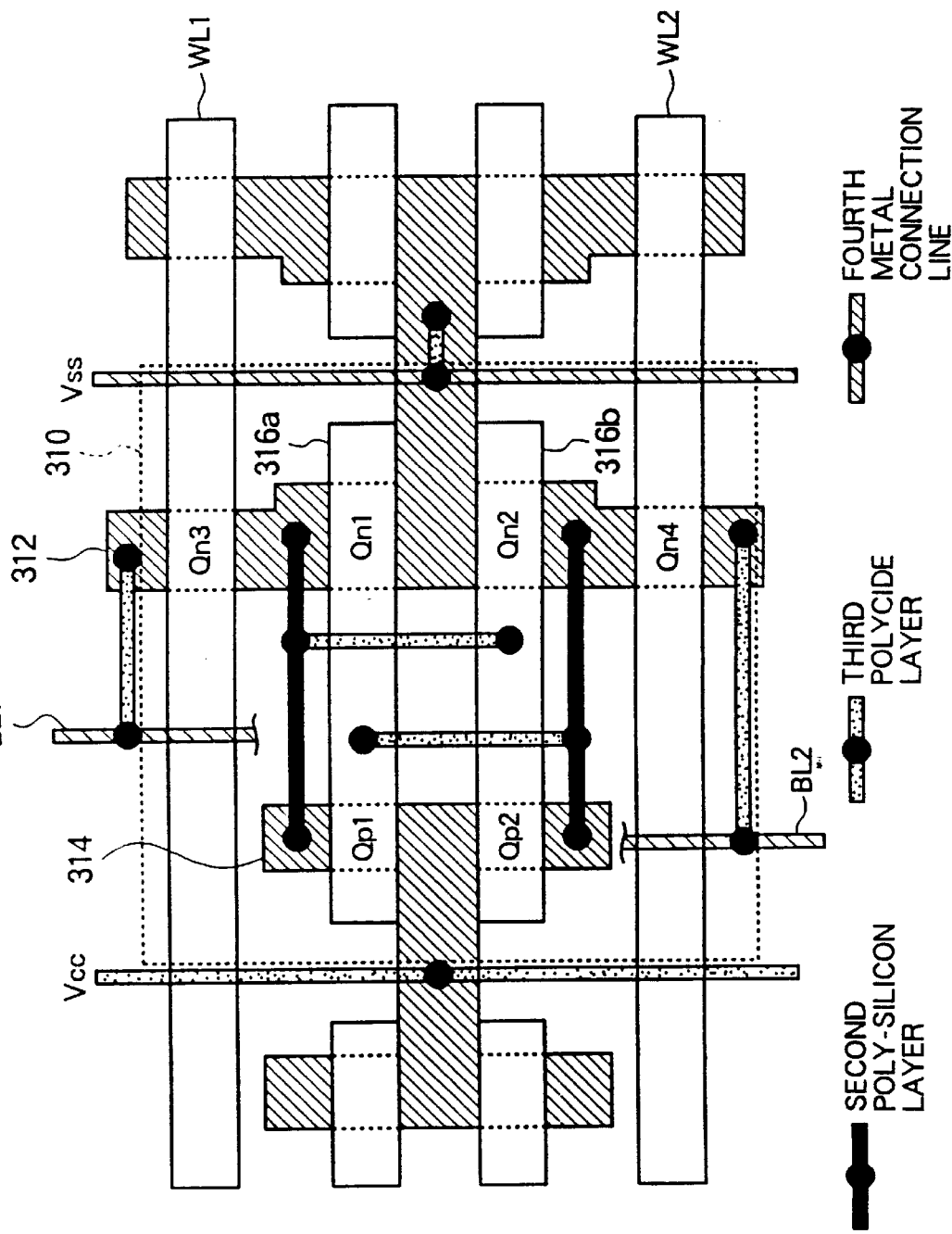
FIG. 81 is a plan view of a p-MOS load type SRAM cell according to a second related art.

On the other hand, in the second related art (FIG. 81), the power voltage supply lines were formed by metal interconnection layers, but it was necessary to lay the power voltage supply lines at about the same pitch as the LOCOS or first-layer polycrystalline silicon interconnections (word lines or common gate lines). In this case, in high-resolution patterning, the resist film is made thin, but it is not possible to make a metal interconnection for forming the power voltage supply line that thick due to the need to secure a residual thickness of the resist after etching.

For example, assume that the thickness of resist is made 0.7 μm the same at when forming a LOCOS or first-layer polycide interconnection. At this time, the mask layer (SiN layer) for the selective oxidation for formation of a LOCOS or polycide layer sometimes have a relatively large thickness of 100 to 400 nm, but since the etch selectivity with respect to the resist is a relatively large 5 to 10, there is little reduction in the resist film even if etching for a long period. As opposed to this, the etch selectivity of metal to a resist is 2 to 3 or less than half that of a polycide etc., so the metal can be made a only 200 nm in thickness even at a maximum in view of the need to secure a certain amount of residual thickness of the resist. Further, with a thin metal interconnection of less than 200 nm, the material of the interconnection would be limited to a titanium-based material in view of the EM resistance and as a result it would not be possible to reduce the resistance of the power voltage supply line.

As opposed to this, if the power voltage supply lines are made trench interconnections as in the present embodiment, in the case of the same interconnection pitch (thickness of resist used: 0.7 μm), the etch selectivity with respect to the resist becomes that of the interlayer insulating layer. In the case of silicon dioxide, this is 5 to 10 or equal to polycide, so it is possible to make the thickness of the interlayer insulating layer (that Is, thickness of trench interconnections) a thick 400 nm. Further, the material is not limited to a titanium-based material (specific resistivity: 55 μΩ-cm). It is also possible to use a tungsten-based one (specific resistivity: 10 μΩ-cm).

According to this, even with the same pitch of interconnections as the related art, by just changing the power voltage supply lines $V_{ss}$, $V_{cc}$ from metal interconnections to trench interconnections, it is possible to reduce the interconnection resistance to less than ½ the past. Further, it is possible to use a tungsten-based material and in this case to reduce the interconnection resistance to less than ¹⁄₁₀.

On the other hand, to realize an interconnection resistance equal to that of a trench interconnection using an ordinary metal interconnection, an aluminum-based interconnection becomes necessary. Further, to realize a fine aluminum interconnection, a three-layer structure of a main interconnection layer of aluminum sandwiched by titanium-based films above and below it such as usually used has to be use. The lower-layer titanium-based film (thickness of for example about 100 nm) is introduced to improve the crystallinity of the aluminum layer stacked above it and increase the EM resistance of the aluminum layer created as a result. Further, the upper-layer titanium-based film (thickness of for example about 50 nm) is introduced for preventing reflection of incident light at the time of exposure for patterning the aluminum interconnections.

With this three-layer structure aluminum interconnection, however, aluminum-titanium alloy layers were formed at the interfaces of the upper and lower titanium-based films with the aluminum layer. While the thickness depended on the heat history of the wafer process, it could reach as high as 50 to 100 nm at one side. This aluminum-titanium alloy has a specific resistivity higher than that of the aluminum layer. For this reason, it trying to realize the same interconnection resistance as with a trench interconnection by using an aluminum interconnection, it is necessary to make the initial thickness after deposition of the aluminum layer at the minimum 150 nm or 250 nm in a conventional wafer process. If making the initial thickness of the aluminum layer 250 nm and making the total thickness of the three-layer structure aluminum interconnection 400 nm, the resist thickness at the time of patterning must be made at least two times more than that of the first-layer polycrystalline silicon (for example, at least 1.4 µm). Therefore, it is necessary to make the pitch of the aluminum interconnections at least 1.5 times that of the first-layer polycrystalline silicon.

Due to the above, it is not possible to use aluminum interconnections as power voltage supply lines in the second related art or the first embodiment since the cell size would increase.

In this way, in the present embodiment, by making the power voltage supply lines trench interconnections, it is possible to provide an SRAM device having the various advantages of the reduction of the interconnection resistance and the accompanying stabilization of the cell operation or greater miniaturization of the memory cells.

Third Embodiment

The third embodiment shows for example a case of changing the power voltage supply lines of the first embodiment to trench interconnections as an example of another application of the features [1] to [3] of the present invention to the pattern type C.

FIGS. 18A, 19A, 20A, 21A, 22A. 23A, 24A. and 25A are pattern diagrams of the method of producing an SRAM cell according to the present embodiment. The corresponding "B" figures show the first embodiment as a comparative example. The same parts as those in the first embodiment are given the same reference numerals and explanations thereof are omitted.

Figure 18A:
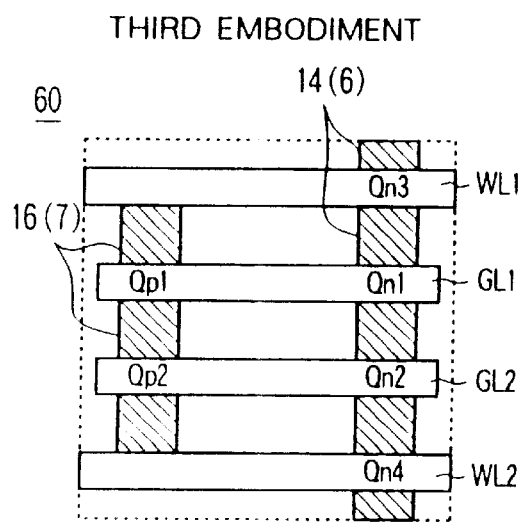
FIGS. 18A and 18B are pattern diagrams of a method of producing an SRAM cell according to a third embodiment of the present invention showing up to formation of the gate electrode pattern (word line and common gate lines) and a comparative example.
Figure 18B:
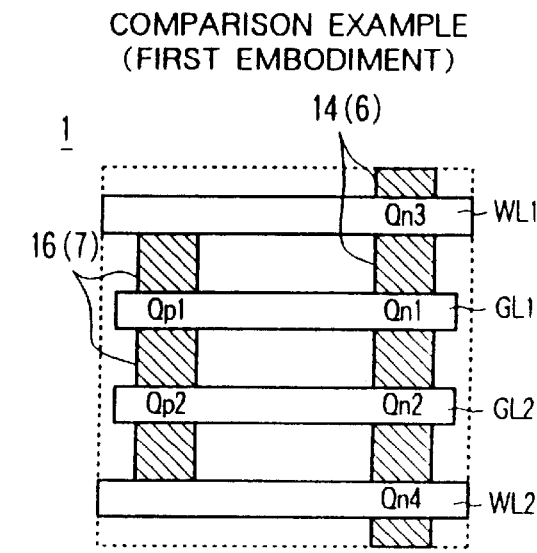

In FIGS. 18A and 18B, in the same way as the first embodiment, the active regions 6, 7, first-layer polycrystalline silicon layers (word lines WL1, WL2 and common gate lines GL1, GL2) serving also as the gate electrodes, and source or drain impurity regions are formed in that order.

Figure 19A:
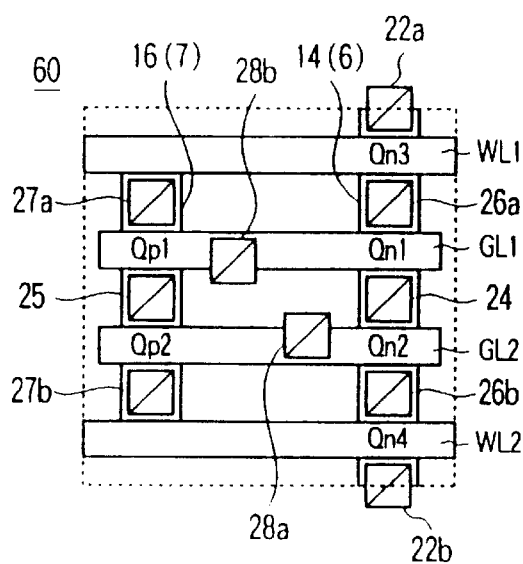
FIGS. 19A and 19B are pattern diagrams of a method of producing an SRAM cell according to a third embodiment of the present invention showing up to formation of the first contact and a comparative example.
Figure 19B:
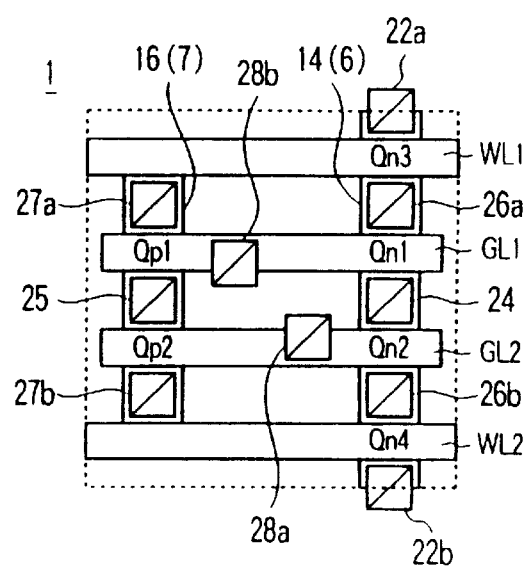

Further, in FIGS. 19A and 19B, the self-aligned contacts 22a to 27b and the word line contacts 28a and 28b are formed.

Figure 20A:
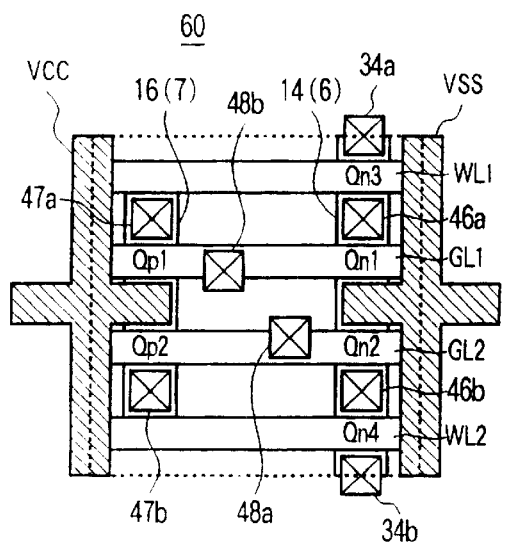
FIGS. 20A and 20B are pattern diagrams of a method of producing an SRAM cell according to a third embodiment of the present invention showing up to formation of the first contact and a comparative example.
Figure 20B:
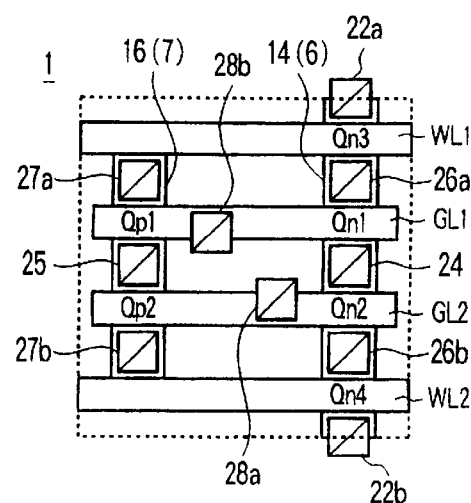

Next, in FIG. 20A, the present embodiment, the second-layer interlayer insulating layer is formed, then the power voltage supply lines $V_{ss}$, $V_{cc}$ are formed on this second-layer interlayer insulating layer by trench interconnections. The power voltage supply lines $V_{ss}$, $V_{cc}$ are arranged along the cell sides in the bit line direction perpendicularly intersecting the word lines and are shared between adjoining cells. Further, the power voltage supply lines $V_{ss}$, $V_{cc}$ have branches in the middle at the two sides in the word line direction to the contacts for the power voltage supply of the adjoining cells (common potential line contacts 24 or power supply line contacts 25) and are connected on these power voltage supply line contacts. Thereof, the two-layer contact structure in the present embodiment is achieved. Here, the power voltage supply contacts 24, 25 correspond to the "first buried conductive layers" in the present invention, while the power voltage supply lines $V_{ss}$, $V_{cc}$ correspond to the "second buried conductive layers" in the present invention.

Note that, at the same time as these trench interconnections, as illustrated, the second-layer plugs 34a, 34b, and 46a to 48b are formed on the first-layer plugs 22a, 22b, and 26a to 28b as various contacts.

Figure 21A:
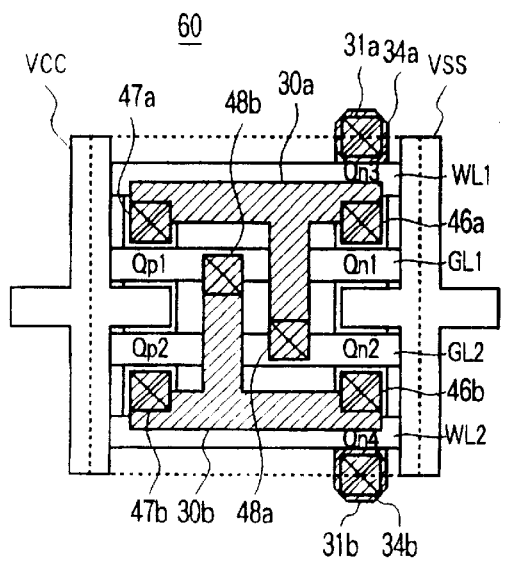
FIGS. 21A and 21B are pattern diagrams of a method of producing an SRAM cell according to a third embodiment of the present invention showing up to formation of the second-layer interconnections (storage node interconnections) and a comparative example.
Figure 21B:
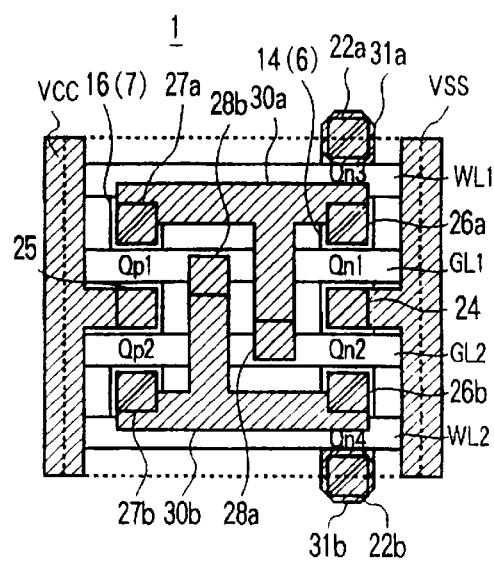

In FIGS. 21A and 21B, two storage node interconnections 30a, 30b are formed on the second-layer interlayer insulating layer. The storage node interconnection 30a connects the second-layer plugs 46a, 47a, and 48a, while the storage node interconnection 30b connects the second-layer plugs 46b, 47b, and 48b.

Simultaneously, landing pad layers 31a, 31b are formed on the second-layer plugs 34a, 34b for the bit contacts.

The subsequent steps are performed in the same way as the first embodiment except that the layers of the parts are exactly one level higher compared with the first embodiment.

Figure 22A:
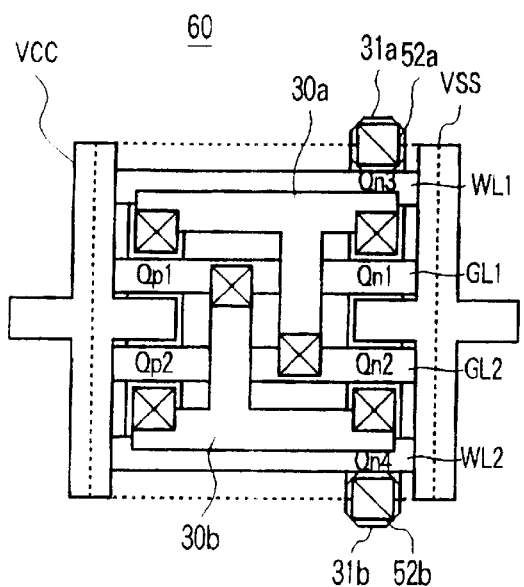
FIGS. 22A and 22B are pattern diagrams of a method of producing an SRAM cell according to a third embodiment of the present invention showing up to formation of a third-layer plug and a comparative example.
Figure 22B:
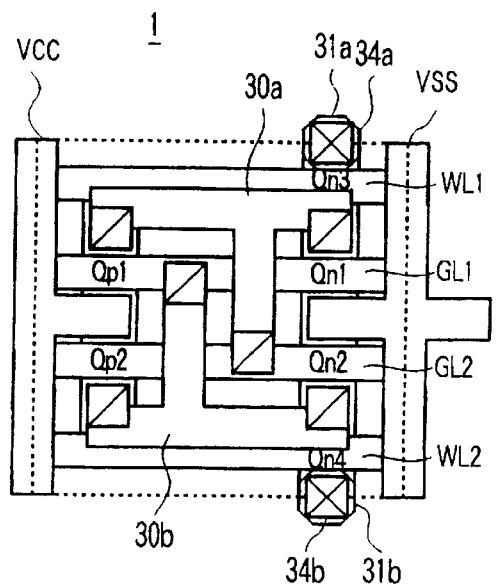
Figure 23A:
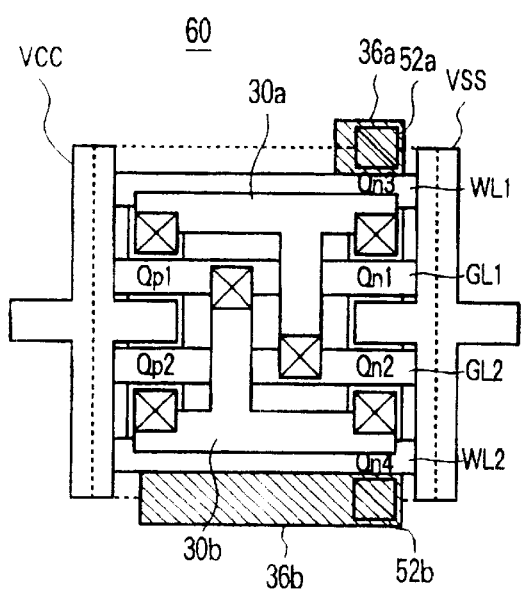
FIGS. 23A and 23B are pattern diagrams of a method of producing an SRAM cell according to a third embodiment of the present invention showing up to formation of third-layer interconnections (bit line connecting interconnections) and a comparative example.
Figure 23B:
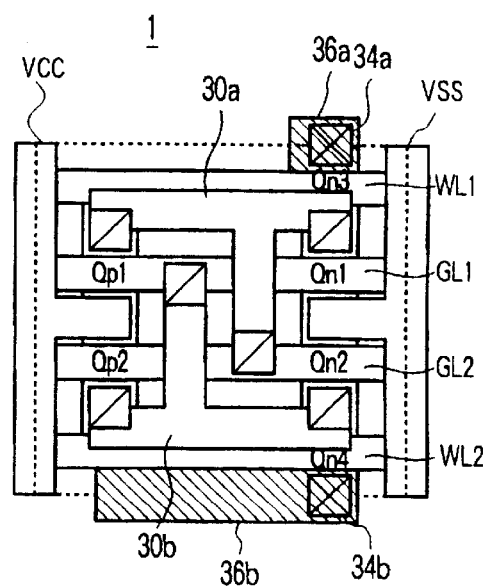
Figure 24A:
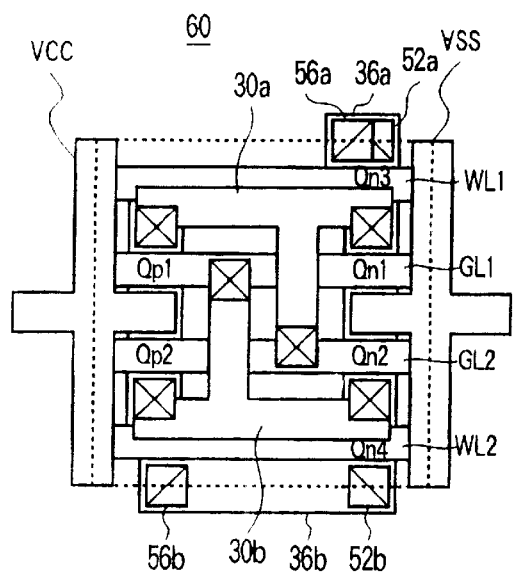
FIGS. 24A and 24B are pattern diagrams of a method of producing an SRAM cell according to a third embodiment of the present invention showing up to formation of a fourth-layer plug and a comparative example.
Figure 24B:
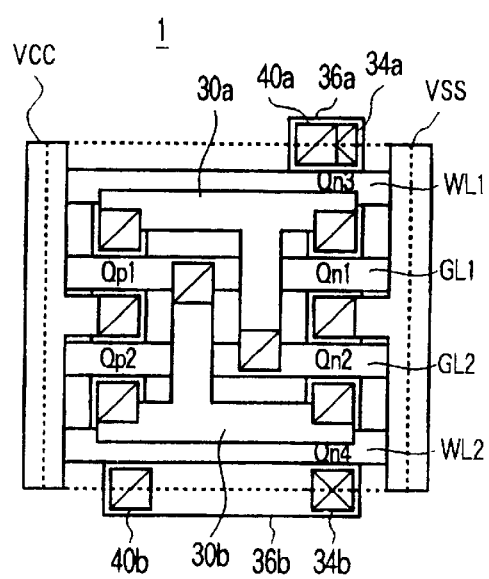
Figure 25A:
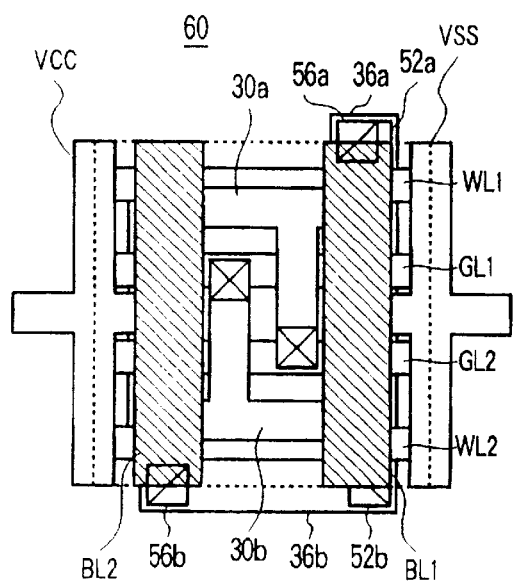
FIGS. 25A and 25B are pattern diagrams of a method of producing an SRAM cell according to a third embodiment of the present invention showing up to formation of fourth-layer interconnections (bit lines) and a comparative example.
Figure 25B:
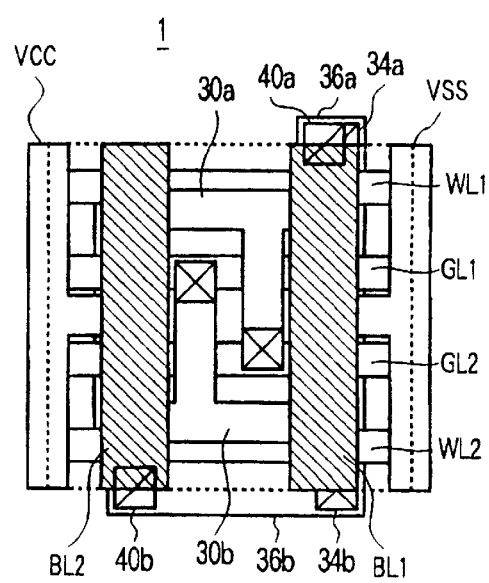

That is, a third-layer interlayer insulating layer is formed, then third-layer plugs 52a, 52b for bit contacts are formed on the landing pad layers 31a, 31b (see FIGS. 22A and 23B). The bit line interconnections 36a, 36b connecting to these are formed on the third-layer interlayer insulating layer (FIGS. 23A and 23B). A fourth-layer interlayer insulating layer is formed, then fourth-layer plugs 56a, 56b for bit contacts are formed (FIGS. 24A and 24B). Bit lines BL1, BL2 are formed connecting to these (FIGS. 25A and 25B).

After this, predetermined steps are followed to complete the SRAM device.

Figure 26:
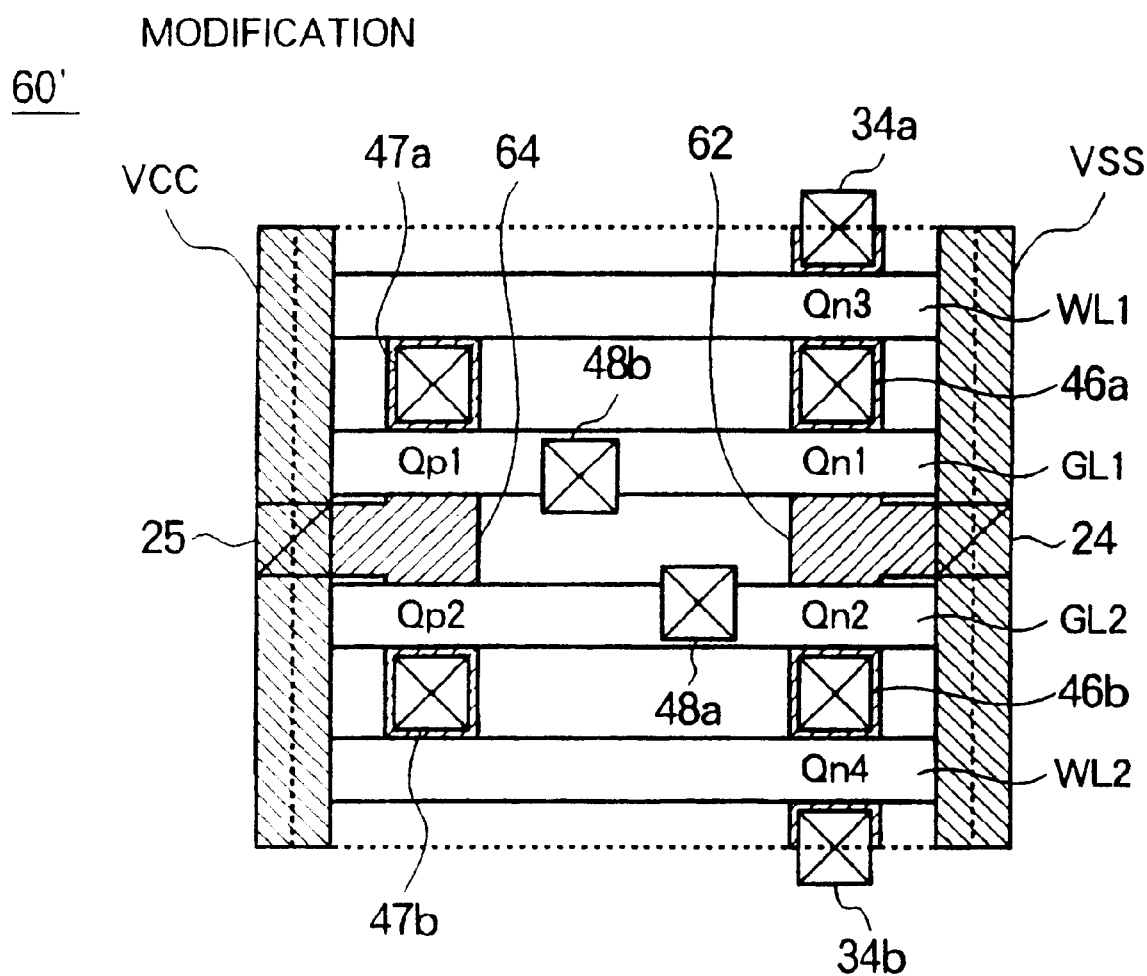
FIG. 26 is a pattern diagram of the state after formation of a second-layer buried conductive layer (trench interconnection) showing a modification of the third embodiment.

FIG. 26 is a pattern diagram of the state after forming trench interconnections according to a modification of the present embodiment.

In this modification, the trench interconnections are made simple stripes, so the active regions 62, 64 are connected between adjoining cells in the same way as the second related art and the power voltage supply contacts 24, 25 are arranged at the centers of the connecting parts.

In the SRAM device of the present embodiment, in the same way as the above second embodiment, various advantages can be obtained by making the power voltage supply lines $V_{ss}$, $V_{cc}$ trench interconnections. Among these, regarding the reduction of the cell area, as clear from a comparison of the steps of the embodiment with the comparative example, the cell size in the word line direction is shortened compared with the first embodiment.

Further, in the present embodiment, excluding the modification shown in FIG. 26, various advantages relating to the active region patterns are obtained in the same way as in the first embodiment.

Fourth Embodiment

The fourth embodiment shows the case of applying the features [2] and [3] of the present invention to the pattern type A.

FIGS. 27A, 28A, 29A, 30A, 31A, 32A, 33A, and 34A are pattern diagrams of the method of producing an SRAM cell according to the present embodiment. Note that the corresponding "B" figures show layout patterns of the first related art having a larger cell size than the "A" figures, while the "C" figures show layout patterns of the second related art having an equivalent cell size as the "A" figures. The first related art is shown together as comparative example showing the effect of reduction of the cell size of the present embodiment, while the second related art is shown as a comparative example showing the simplicity of the process of the present embodiment. Note that the basic process routine or basic producing method of the type A is same as the type C of the first and second embodiments. Below, the explanation will be made focusing on the points of difference of the process routine and the pattern.

Figure 27A:
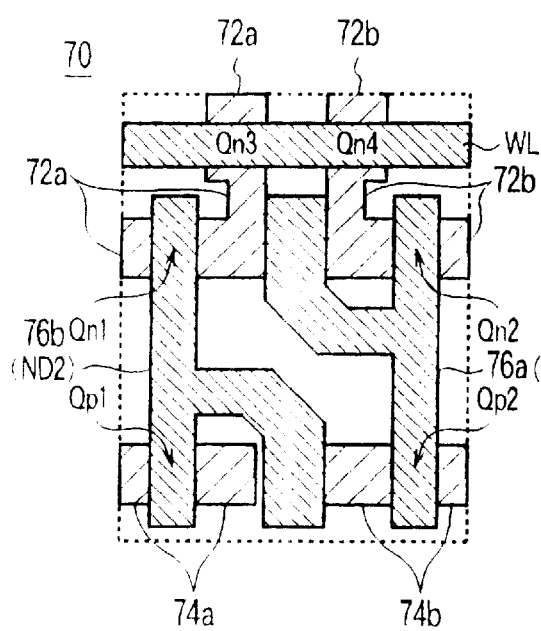
FIGS. 27A to 27C are pattern diagrams of a method of producing an SRAM cell according to a fourth embodiment of the present invention showing up to formation of the gate electrode pattern (word line and common gate lines) and comparative examples.
Figure 27B:
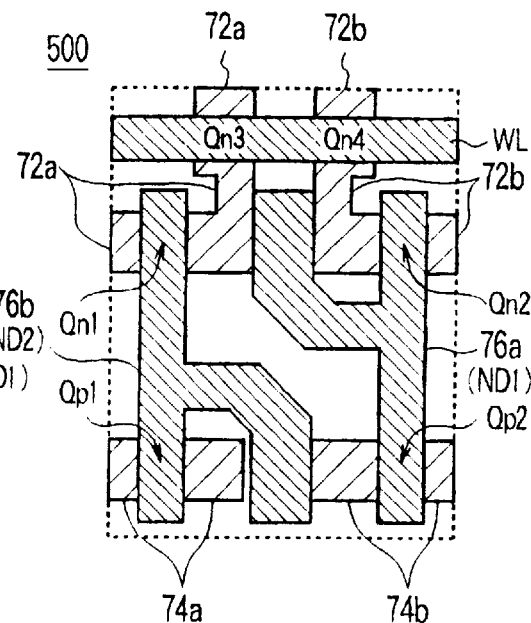
Figure 27C:
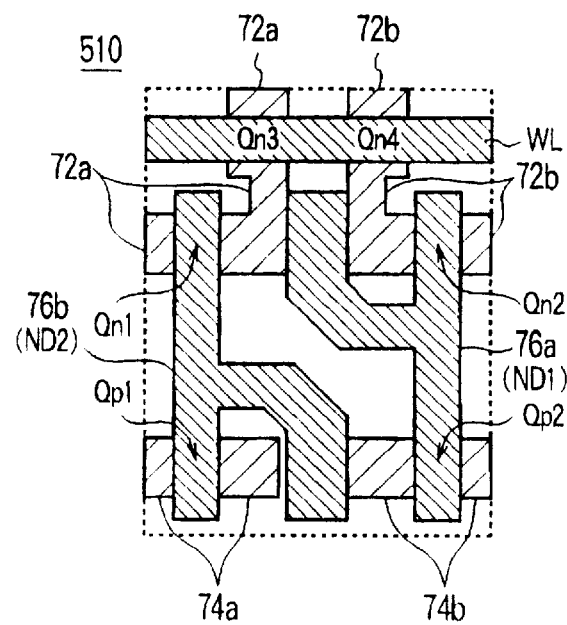

FIGS. 27A to 27C are pattern diagram of the state after forming the transistors. Here, a similar routine as in the first embodiment is used to successively form the active regions, first-layer polycrystalline silicon layers acting also as gate electrodes (word lines and common gate lines), and source or drain impurity regions. The p-type active region in this embodiment, however, is split into two in the cell. The two resultant p-type active regions 72a, 72b have facing ends at portions running along the word line bent and extending parallel in one direction (upward in the figure). The common word line WL perpendicularly intersects the parallel parts to form word transistors Qn3 and Qn4. Further, the n-type active region in this embodiment is also split into two in the cell.

A common gate line 76b is arranged perpendicularly insecting both of the one n-type region 74a and p-type region 72a to form a storage node ND2. Due to this, a drive transistor Qn1 and load transistor Qp1 are formed. Similarly, a common gate line 76a is arranged perpendicularly intersecting the other n-type region 74b and p-type region 72b to form a storage node ND1. Due to this, a drive transistor Qn2 and load transistor Qp2 are formed. The common gate line 76b has a branch near the midpoint thereof extending to the adjoining area of the n-type active region 74b. In the same way, the common gate line 76a has a branch near the midpoint thereof extending to the adjoining area of the p-type active region 72a.

Figure 28A:
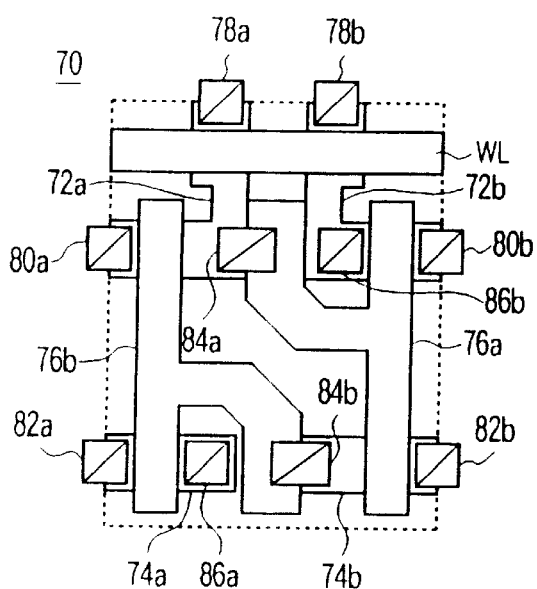
FIGS. 28A to 28C are pattern diagrams of a method of producing an SRAM cell according to a fourth embodiment of the present invention showing up to formation of the first contact and comparative examples.
Figure 28B:
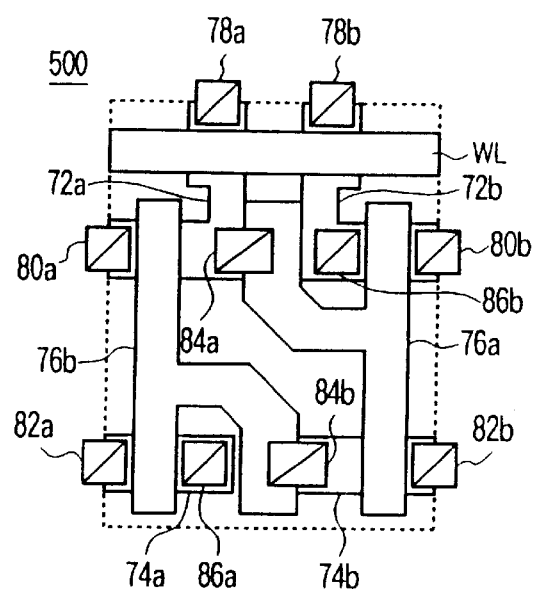
Figure 28C:
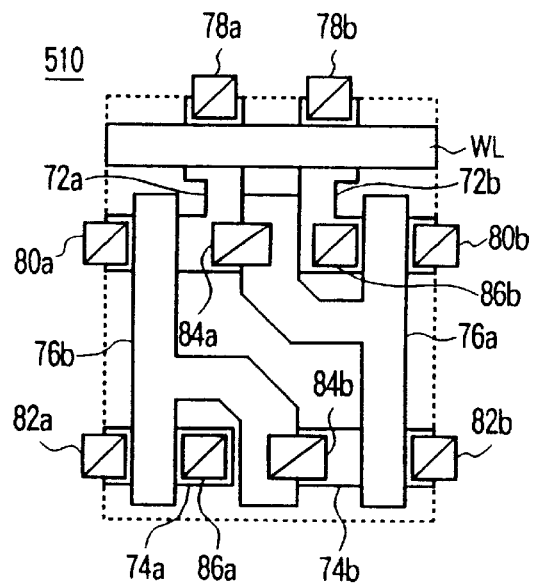

In FIGS. 28A to 28C, the first-layer insulating layer is formed, then various contacts 78a to 86b are formed by first-layer plugs. Among these, reference numerals 78a, 78b show bit contacts, 80a, 80b common potential line contacts, 82a, 82b power supply line contacts, and 84a to 86b storage node contacts. Among those, the storage node contacts 84a, 84b are "shared contacts" overlapping both the common gate line and the active region adjoining thereto.

Figure 29A:
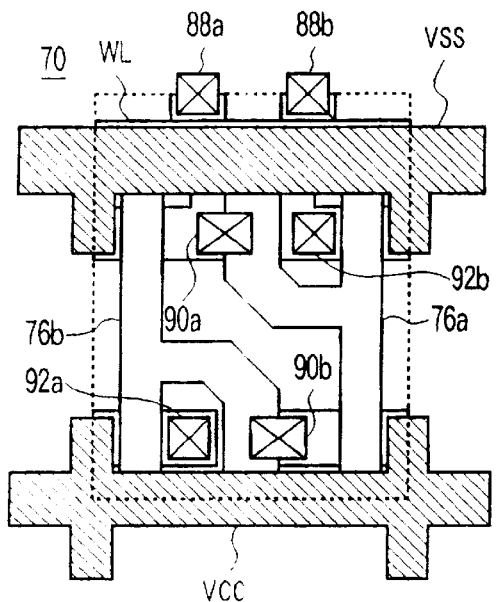
FIGS. 29A to 29C are pattern diagrams of a method of producing an SRAM cell according to a fourth embodiment of the present invention showing up to formation of power voltage supply lines (power voltage line and common potential lines) by trench interconnections formed buried in a second-layer interlayer insulating layer and comparative examples.
Figure 29B:
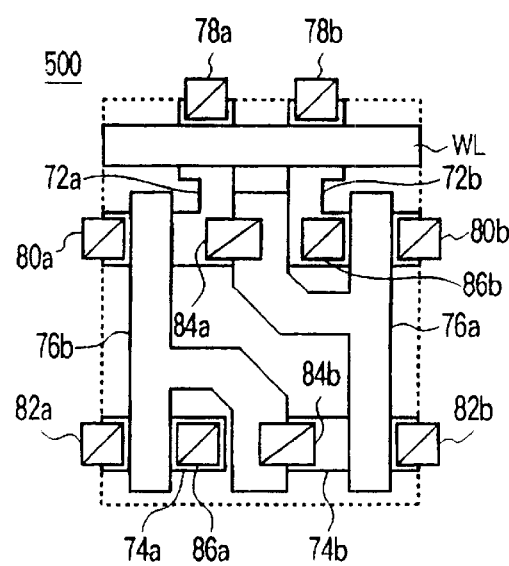
Figure 29C:
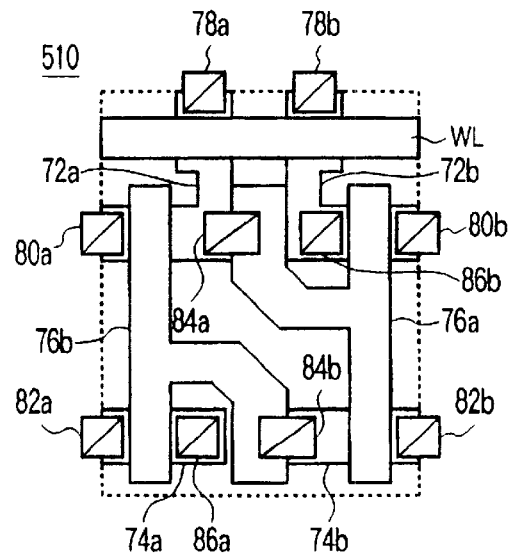

In FIG. 29A, the present embodiment, the second-layer interlayer insulating layer is formed, then the power voltage supply lines $V_{ss}$, $V_{cc}$ are formed in the second-layer interlayer insulating layer by trench interconnections. The power voltage supply lines $V_{ss}$, $V_{cc}$ are arranged in the word line direction. Among these, the common potential line $V_{ss}$ is connected on the common potential line contacts 80a, 80b by branches extending from its trunk. On the other hand, the power supply line $V_{cc}$ is arranged along the cell side in the word line direction positioned at the p-MOS side and is shared by adjoining cells. The power supply line $V_{cc}$ is connected on the power supply line contacts 82a, 82b by branches extending from the middle of its trunk to the two sides of the adjoining cells. Due to this, the two-layer contact structure in the present invention is realized.

Note that at the same time as the trench interconnections, as illustrated, the second-layer plugs 88a to 92b are formed on the first-layer contacts 78a, 78b, and 84a to 86b.

Figure 30A:
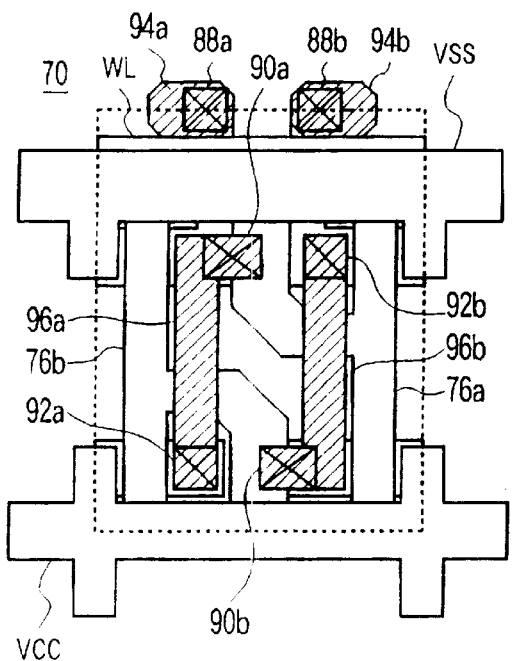
FIGS. 30A to 30C are pattern diagrams of a method of producing an SRAM cell according to a fourth embodiment of the present invention showing up to formation of the second-layer interconnections (storage node interconnections) and comparative examples.
Figure 30B:
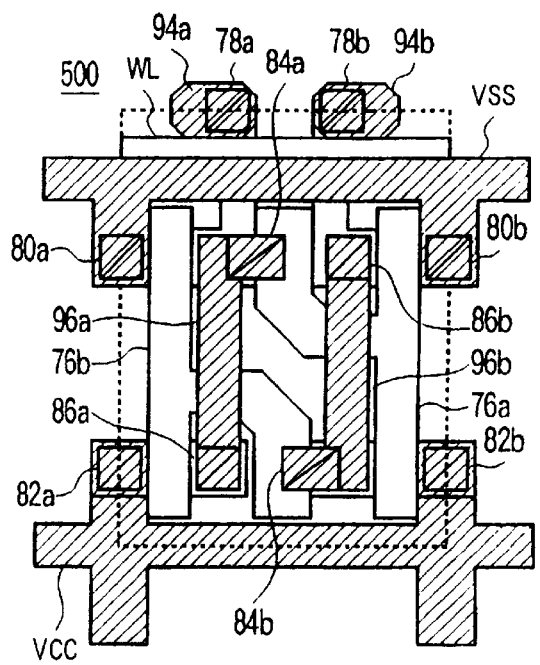
Figure 30C:
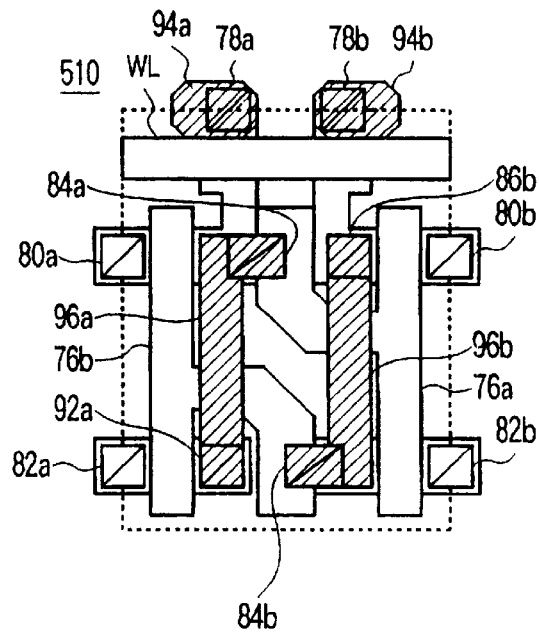

In FIGS. 30A to 30C, two storage node interconnections 96a, 96b are formed on the second-layer (first-layer in first and second related arts) interlayer insulating layer. In the SRAM cell 70 according to the present embodiment, the storage node interconnection 96a connects the second-layer plugs 90a and 92a, while the storage node interconnection 96b connects the second-layer plugs 90b and 92b. At this time, in the first and second related arts, the first-layer plugs 84a, 86a are connected by the storage node interconnection 96a, while the first-layer plugs 84b, 86b are connected by the storage node interconnection 96b.

Simultaneously, the landing pad layers 94a, 94b are formed on the second-layer plugs 88a, 88b for bit contacts (or first-layer bit contacts 78a, 78b)

Further, only in the first related art, the power voltage supply lines $V_{ss}$, $V_{cc}$ are formed by ordinary interconnections at the same positions and in the same electrical connections as in the case of the trench connections already formed in the present embodiment (see FIG. 30A).

Figure 31A:
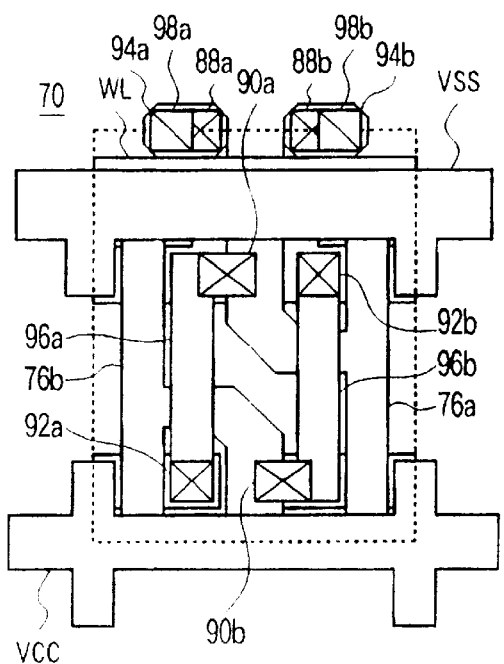
FIGS. 31A to 31C are pattern diagrams of a method of producing an SRAM cell according to a fourth embodiment of the present invention showing up to formation of a third-layer plug and comparative examples.
Figure 31B:
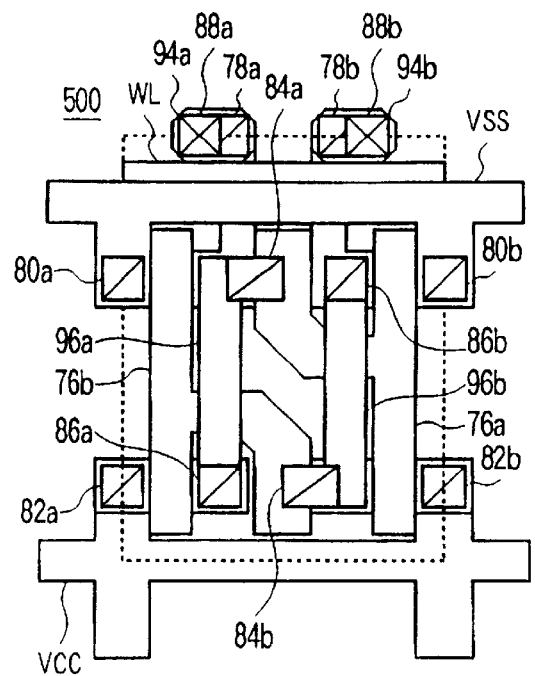
Figure 31C:
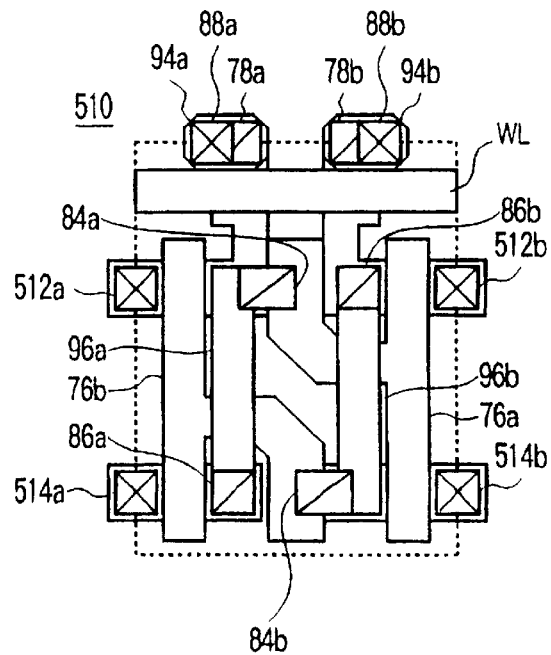

In FIG. 31A, the third-layer interlayer insulating layer is formed, then bit contact use third-layer plugs 98a, 98b are formed therein. At this time, in the first related art, the second-layer plugs 88a, 88b are formed in the second-layer interlayer insulating layer and, in the second related art, the second-layer plugs 88a, 88b, and 512a to 514b are formed in the second-layer interlayer insulating layer.

Figure 32A:
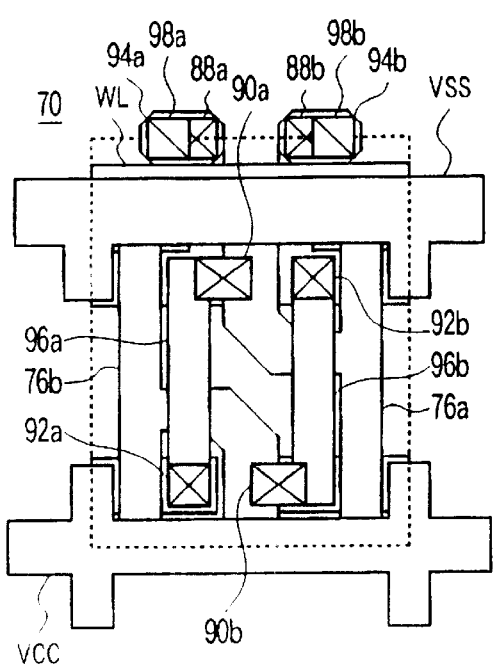
FIGS. 32A to 32C are pattern diagrams of a method of producing an SRAM cell according to a fourth embodiment of the present invention showing up to formation of third-layer interconnections (power supply line and common potential lines) in comparative examples.
Figure 32B:
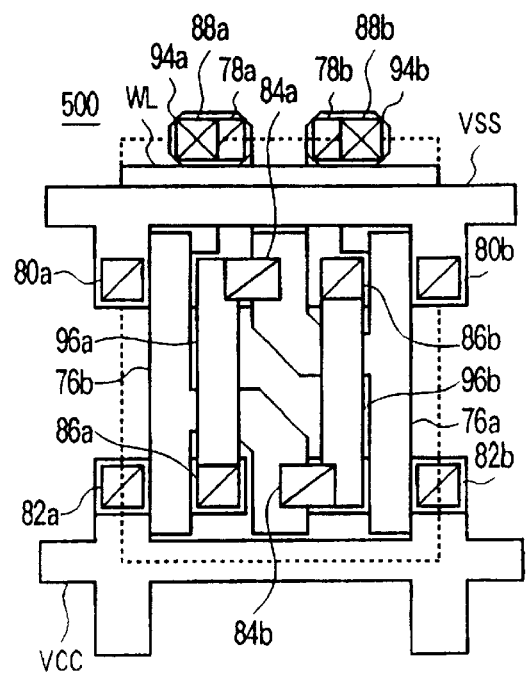
Figure 32C:
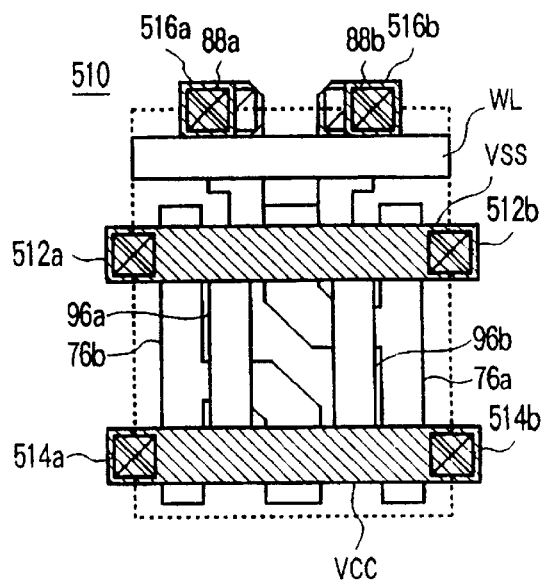

In FIG. 32C, the second related art, a common potential line $V_{ss}$ for connecting the bit contact use landing pad layers 516a, 516b and the second-layer plugs 514a, 514b and a power supply line $V_{cc}$ for connecting the second-layer plugs 514a, 514b are formed simultaneously on the second-layer interlayer insulating layer.

Figure 33A:
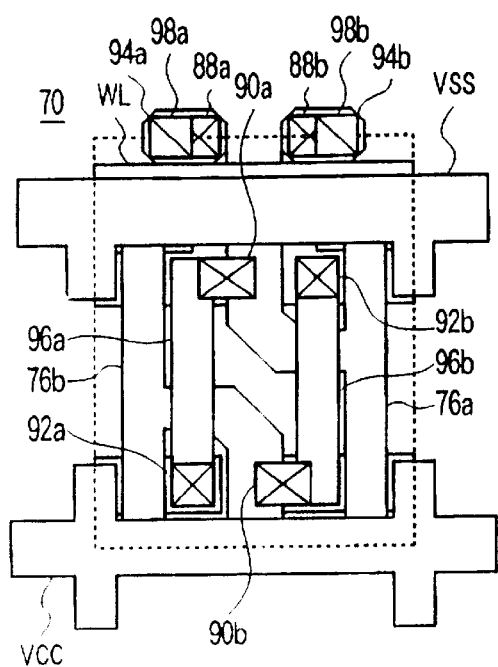
FIGS. 33A to 33C are pattern diagrams of a method of producing an SRAM cell according to a fourth embodiment of the present invention showing up to formation of a fourth-layer plug in comparative examples.
Figure 33B:
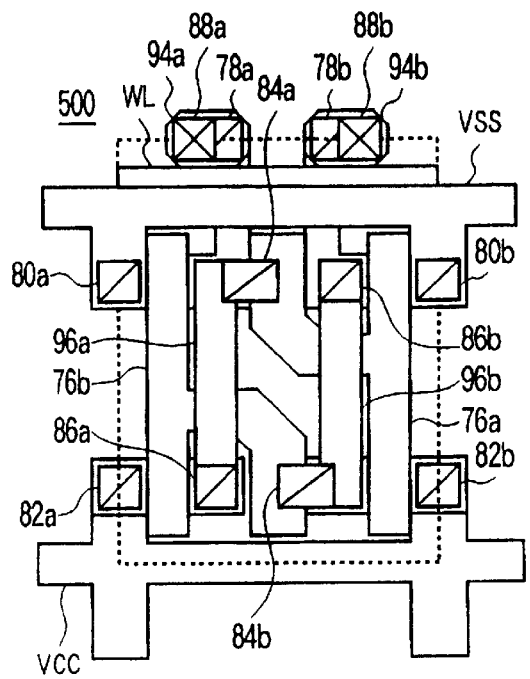
Figure 33C:
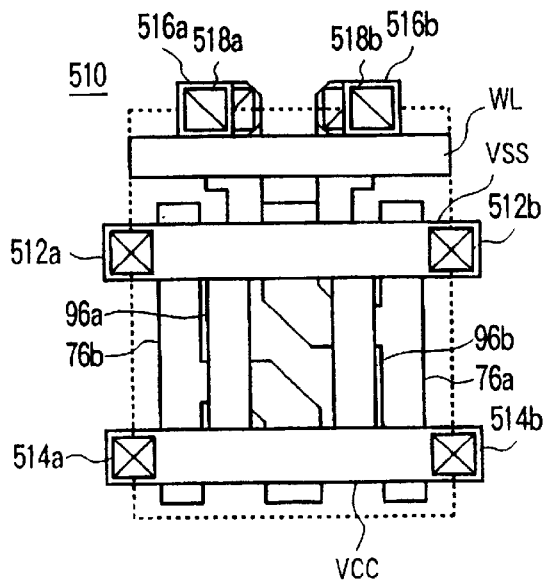

In FIG. 33C, the second related art, a third-layer interlayer insulating layer is formed, then bit contact use third-layer plugs 518a, 518b are formed on the landing pad layers 516, 516b.

Figure 34A:
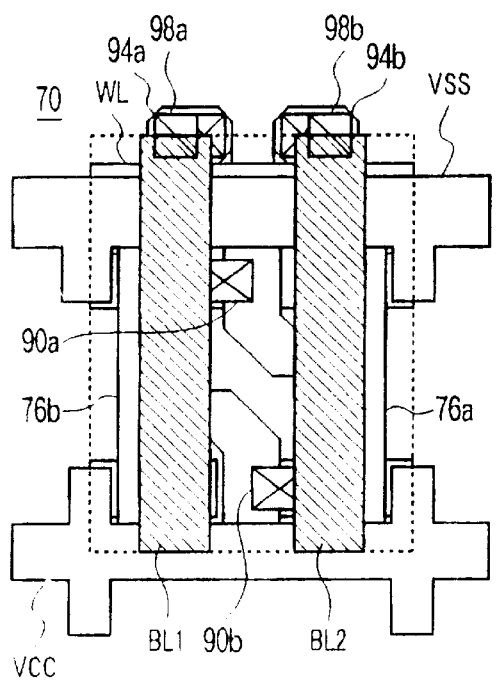
FIGS. 34A to 34C are pattern diagrams of a method of producing an SRAM cell according to a fourth embodiment of the present invention showing up to formation of bit lines and comparative examples.
Figure 34B:
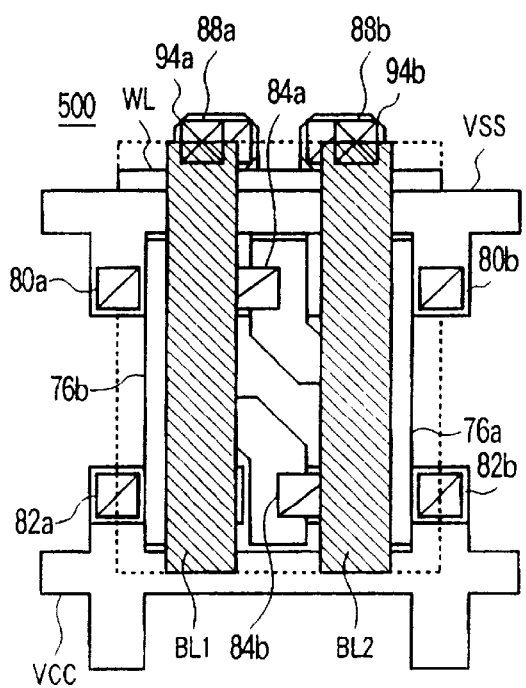
Figure 34C:
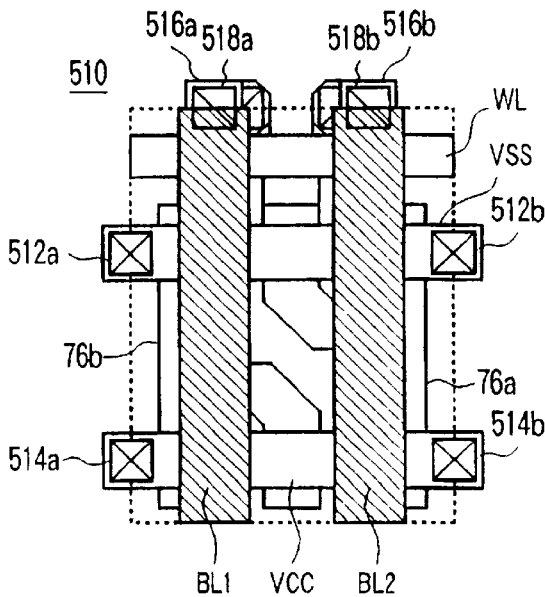

In FIGS. 34A to 34C, bit lines BL1, BL2 are formed connected to the second or third-layer bit contact use plugs.

The predetermined steps are then followed to complete the SRAM device.

Figure 35:
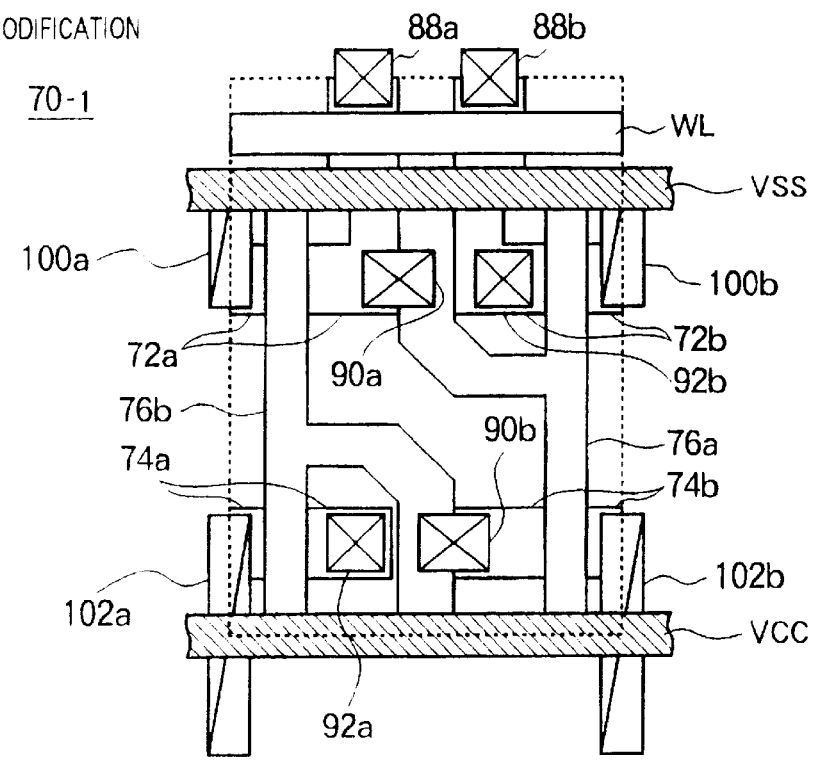
FIG. 35 is a pattern diagram of the state after formation of a second-layer buried conductive layer (trench interconnection) showing a first modification of the fourth embodiment.
Figure 36:
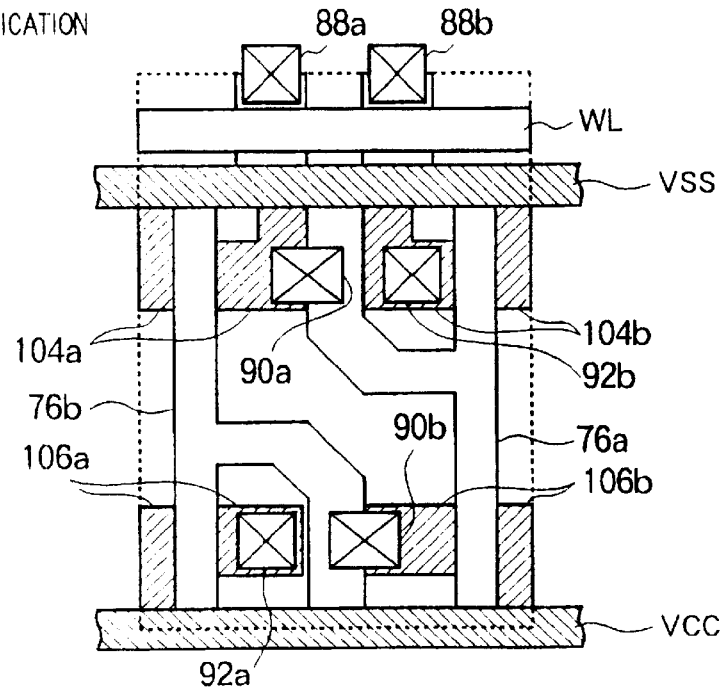
FIG. 36 is a pattern diagram of the state after formation of a second-layer buried conductive layer (trench interconnection) showing a second modification of the fourth embodiment.

FIGS. 35 and 36 are pattern diagrams of the state after forming the trench interconnections according to modifications of the present embodiment.

In the first modification shown in FIG. 35, when forming the first-layer contacts, the power voltage supply contacts are formed by the trench interconnections 100a to 102b, while the power voltage supply lines $V_{ss}$, $V_{cc}$ are formed as simple stripes.

Further, in the second modification shown in FIG. 36, not only the facing ends of the split active regions 104a and 104b or 106a and 106b, but also the outer ends are bent so as to make the power voltage supply lines $V_{ss}$, $V_{cc}$ simple stripes.

In the SRAM of the present embodiment, in the same way as the above second embodiment, various advantages are obtained by making the power voltage supply lines $V_{ss}$, $V_{cc}$ trench interconnections, such as the reduction of the cell area and the reduction of the interconnection resistance of the power voltage supply lines.

Among these, regarding the reduction of the cell area, in the example shown in this embodiment, it is clear that the cell size can be reduced in the bit line direction in comparison with the first related art and that the number of steps can be made smaller, assuming the same area, in comparison with the second related art.

Regarding the reduction of the interconnection resistance, in the present embodiment, the interconnection resistance can be lowered from the viewpoints of the width of the interconnections, the thicknesses of the interconnections, and the materials used.

As clear from a comparison with FIG. 30A and 30B, in the present embodiment, the widths of the power voltage supply lines are increased about 2-fold. The power voltage supply lines in the related art (FIG. 30B) are arranged at a predetermined separating space between close patterns, that is, a storage node interconnection and a bit contact use landing pad layer comprised of the same level interconnection layer. As opposed to this, if the power voltage supply lines are made trench interconnections (FIG. 30A), it is enough to provide a margin for alignment to avoid contact with the adjoining pattern, so the widths of the power voltage supply lines can be increased by that amount. Therefore, if the widths of the power voltage supply lines are the same, the size of the cell in the bit line direction can be reduced further by that amount.

Further, by using trench interconnections, the thickness of power voltage supply lines can be increased about 2-fold or more and, even with the same interconnection material, the interconnection resistance will become less than ½.

Further, a material having a smaller specific resistivity than the related art can be selected and the interconnection resistance reduced in this respect as well.

Fifth Embodiment

The fifth embodiment shows a modification of the fourth embodiment (type A) relating to the connection between storage nodes.

FIGS. 37A, 38A, 39A, 40A, 41A, 42A, 43A, and 44A are layout pattern diagrams of a method of producing an SRAM cell according to the present embodiment. Note that here, corresponding to the first related art and the second related art in the fourth embodiment, the corresponding "B" figures show a third related art and the corresponding "C" figures show a fourth related art. The same parts as those in the fourth embodiment are given the same reference numerals and explanations thereof are omitted.

Figure 37A:
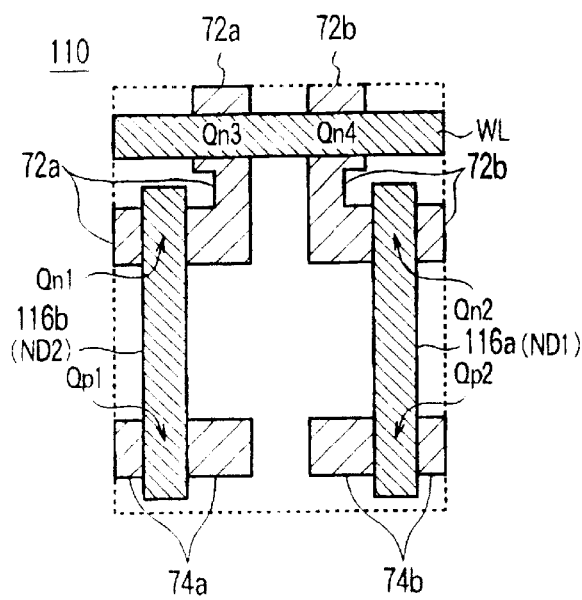
FIGS. 37A to 37C are pattern diagrams of a method of producing an SRAM cell according to a fifth embodiment of the present invention showing up to formation of the gate electrode pattern (word line and common gate lines) and comparative examples.
Figure 37B:
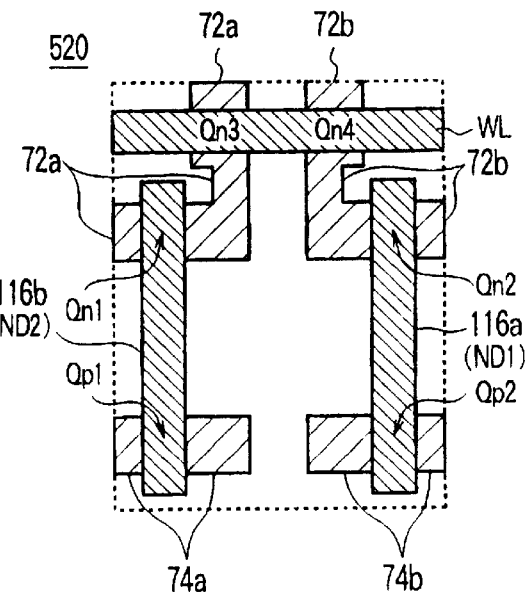
Figure 37C:
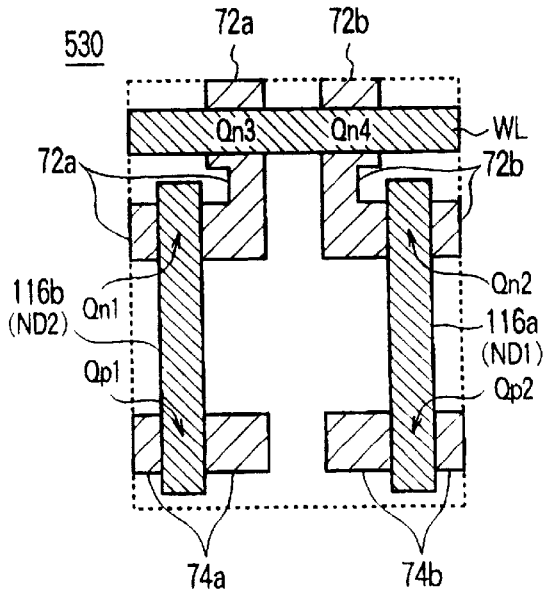

In FIGS. 37A to 37C, the difference from the fourth embodiment is that the common gate lines 116a, 116b are made simple stripe patterns.

Next, first-layer contacts and node interconnections are formed. In the present embodiment, the two storage node interconnections are constructed from two layers. A first layer thereof is formed by a trench interconnection in the interlayer insulating layer, while a second layer is formed by an ordinary interconnection on the upper-layer interlayer insulating layer.

Figure 38A:
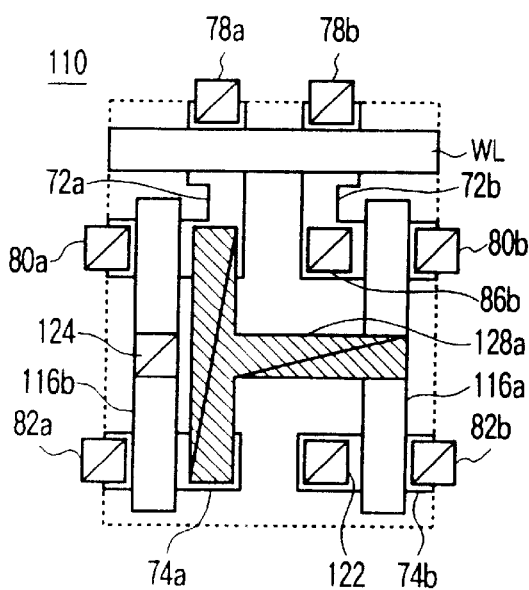
FIGS. 38A to 38C are pattern diagrams of a method of producing an SRAM cell according to a fifth embodiment of the present invention showing up to formation of the first contact and comparative examples.
Figure 38B:
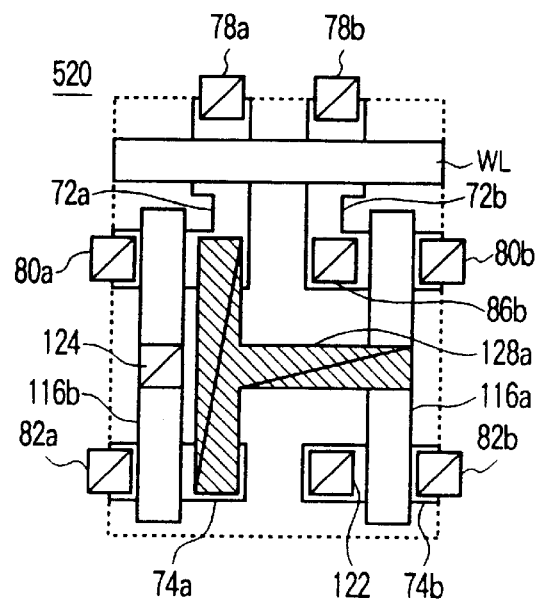
Figure 38C:
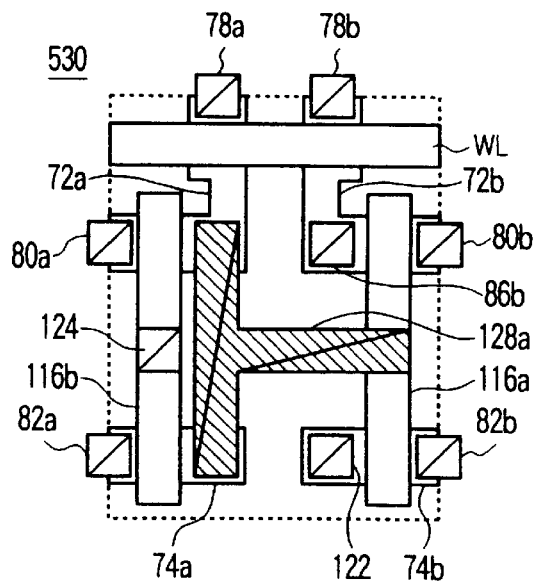

In FIGS. 38A to 38C, among these, the lower-layer storage node interconnection is formed by a trench interconnection. Specifically, two storage node contacts at one inverter side are omitted, while a storage node interconnection 128a for connecting the two impurity regions for which the storage node contact were omitted and the common gate line of the other inverter is formed by a trench interconnection. At this time, various first-layer contacts 78a to 82b, 86b, 122, and 124 are formed simultaneously. Among these contacts, the contact indicated by reference numeral 122 is made not a shared contact, but an ordinary contact, while the contact indicated by reference numeral 124 is formed on the common gate line 116b.

Figure 39A:
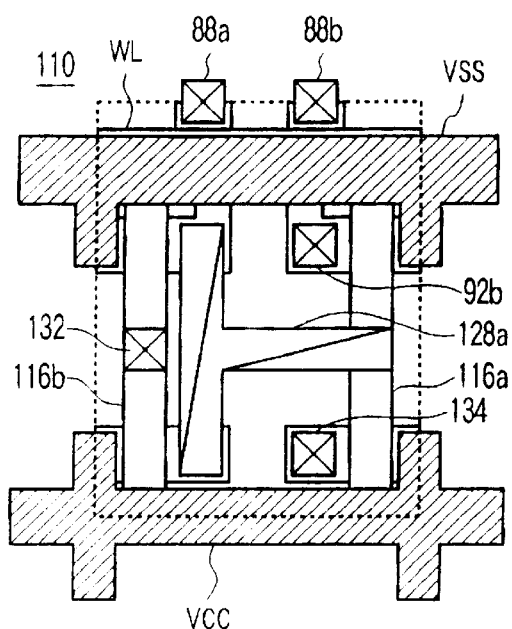
FIGS. 39A to 39C are pattern diagrams of a method of producing an SRAM cell according to a fifth embodiment of the present invention showing up to formation of power voltage supply lines (power voltage line and common potential lines) by trench interconnections formed buried in a second-layer interlayer insulating layer and comparative examples.
Figure 39B:
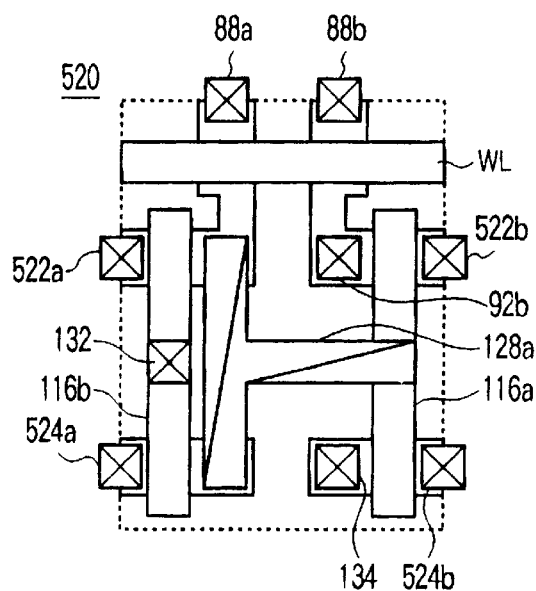
Figure 39C:
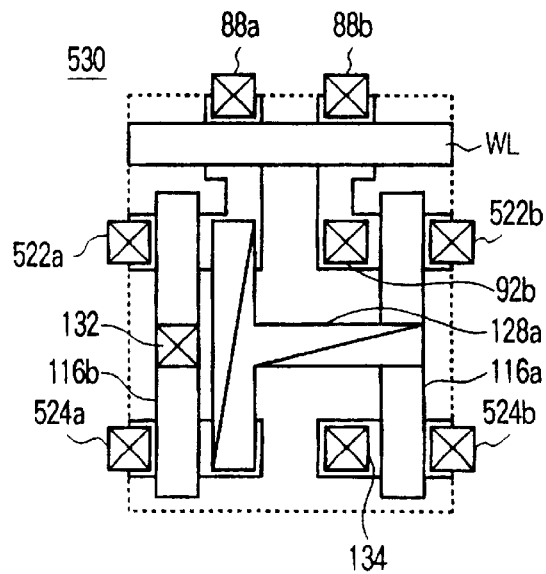

In FIGS. 39A to 39C, in the second-layer interlayer insulating layer, the trench insulation power voltage supply lines $V_{ss}$, $V_{cc}$ and the second-layer plugs 88a, 88b, 92b, 132, and 134 are formed in the same way as the fourth embodiment. At this time, in the third and fourth related arts, the second-layer plugs 88a, 88b, 92b, 132, 134, and 522a to 524b are formed.

Figure 40A:
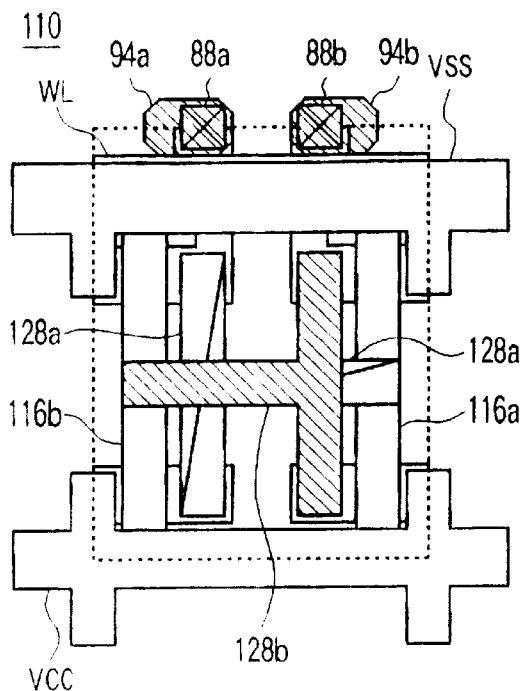
FIGS. 40A to 40C are pattern diagrams of a method of producing an SRAM cell according to a fifth embodiment of the present invention showing up to formation of the second-layer interconnections (storage node interconnections) and comparative examples.
Figure 40B:
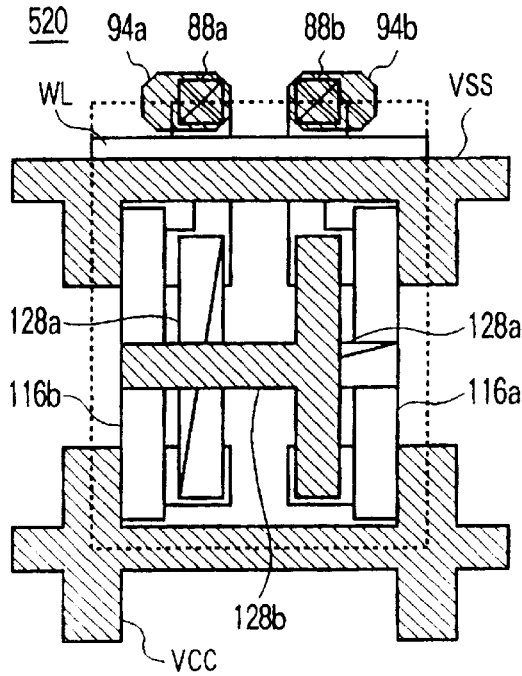
Figure 40C:
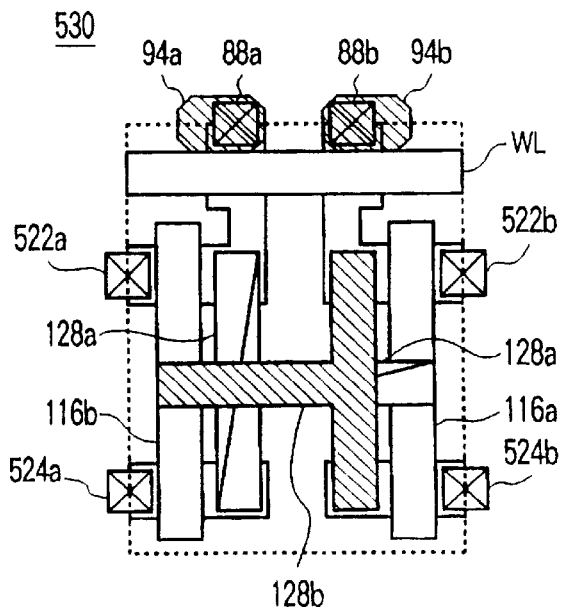

In FIGS. 40A to 40C, the upper-layer storage node interconnection 128b is formed on the second-layer interlayer insulating layer and the bit contact use landing pad layers 94a, 94b are formed. At this time, in the third related art, the power voltage supply lines $V_{ss}$, $V_{cc}$ are formed.

Figure 41A:
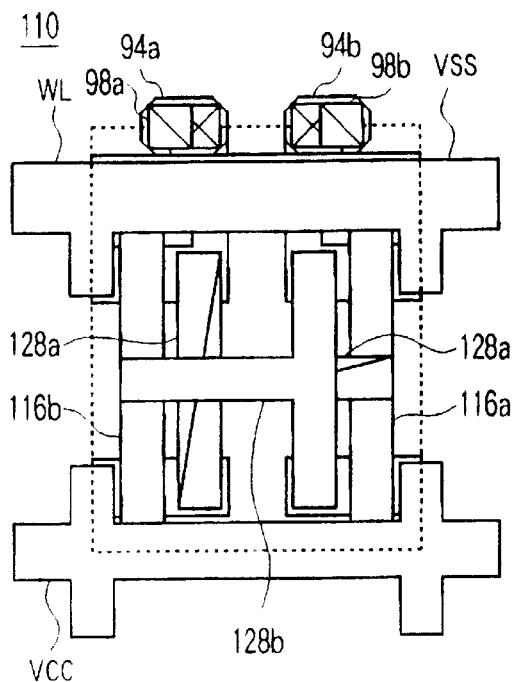
FIGS. 41A to 41C are pattern diagrams of a method of producing an SRAM cell according to a fifth embodiment of the present invention showing up to formation of a third-layer plug and comparative examples.
Figure 41B:
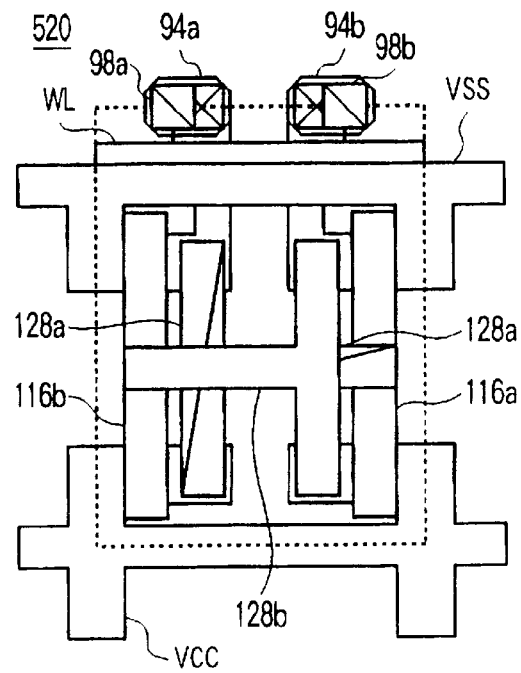
Figure 41C:
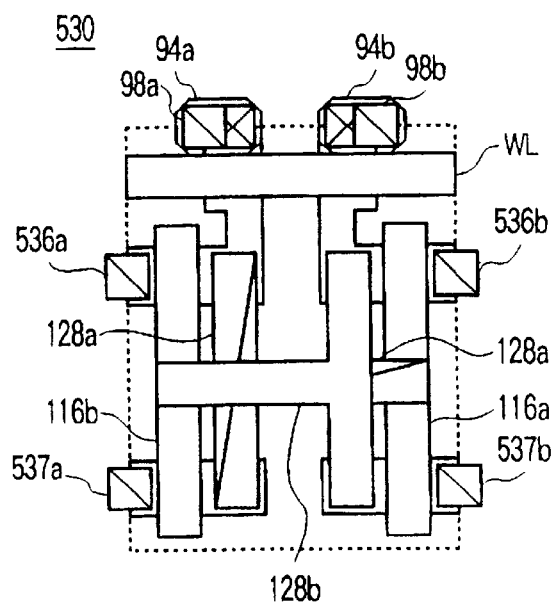
Figure 42A:
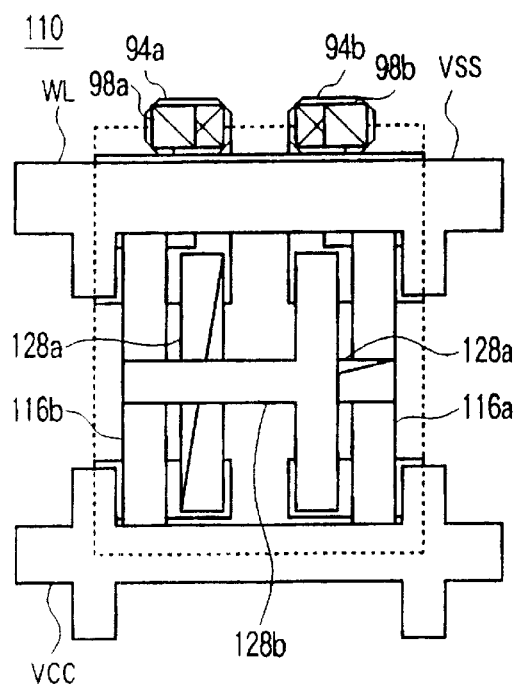
FIGS. 42A to 42C are pattern diagrams of a method of producing an SRAM cell according to a fifth embodiment of the present invention showing up to formation of third-layer interconnections (power supply line and common potential lines) in comparative examples.
Figure 42B:
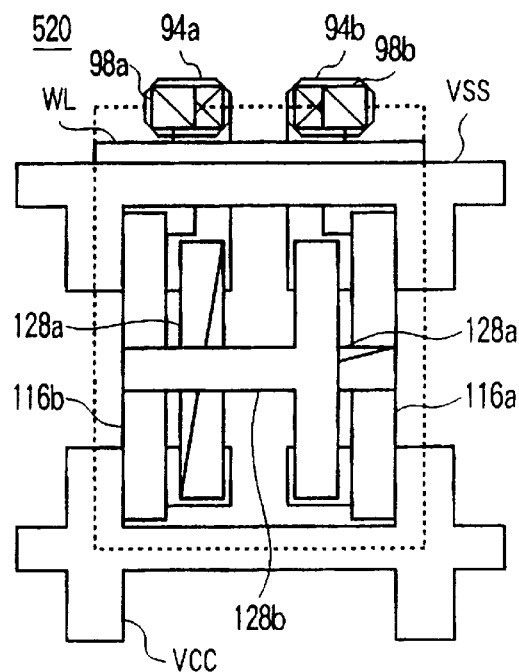
Figure 42C:
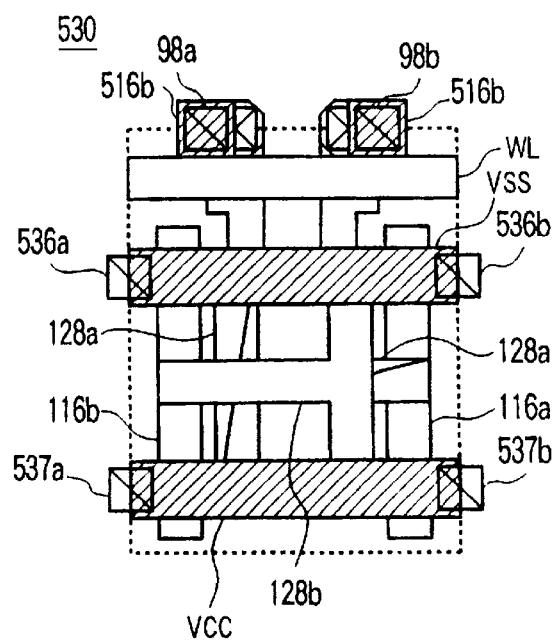
Figure 43A:
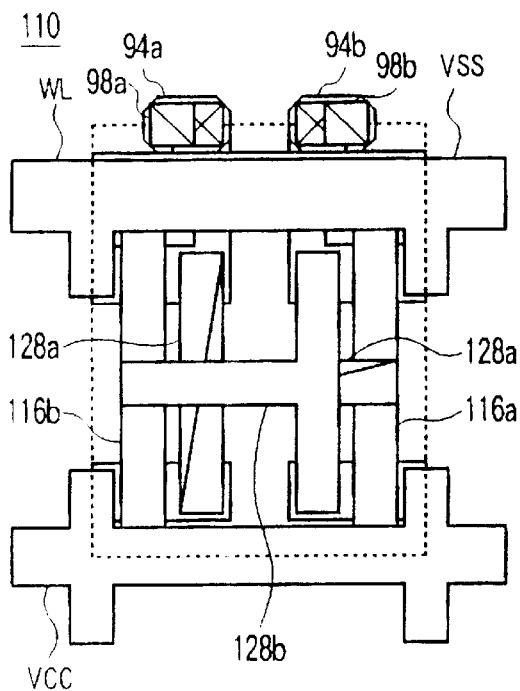
FIGS. 43A to 43C are pattern diagrams of a method of producing an SRAM cell according to a fifth embodiment of the present invention showing up to formation of a fourth-layer plug in comparative examples.
Figure 43B:
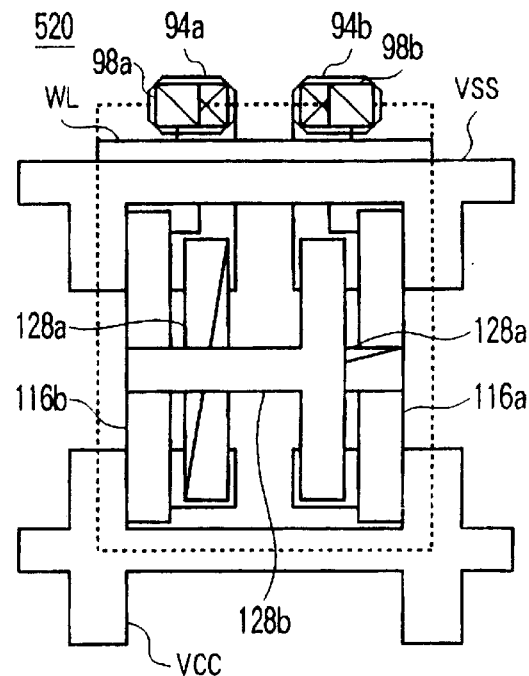
Figure 43C:
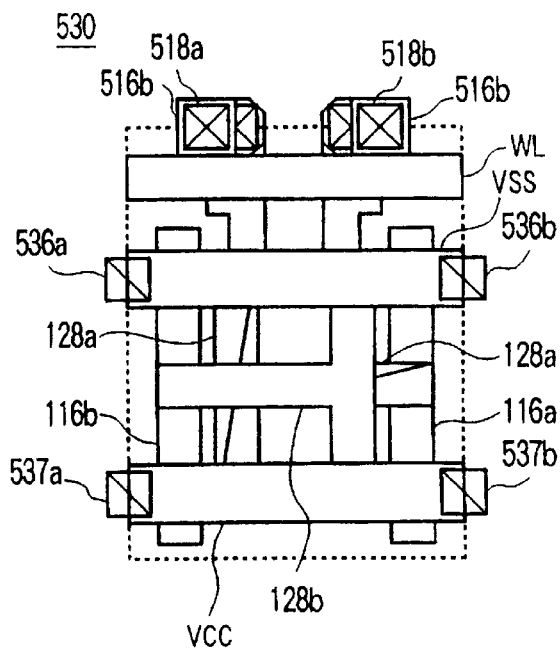
Figure 44A:
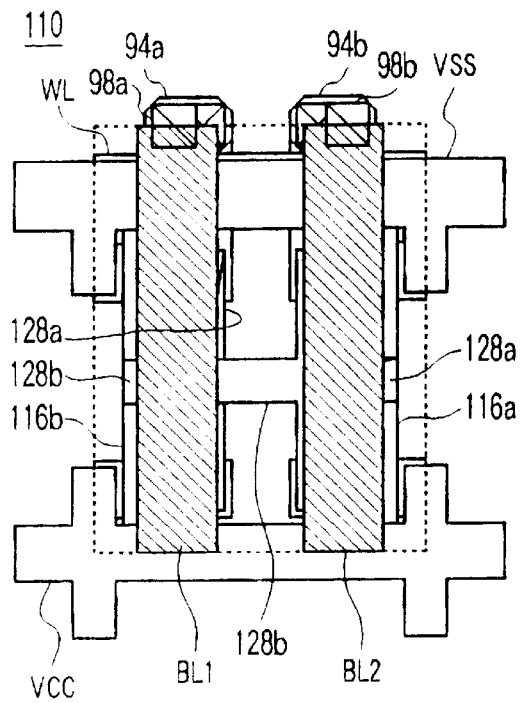
FIGS. 44A to 44C are pattern diagrams of a method of producing an SRAM cell according to a fifth embodiment of the present invention showing up to formation of bit lines and comparative examples.
Figure 44B:
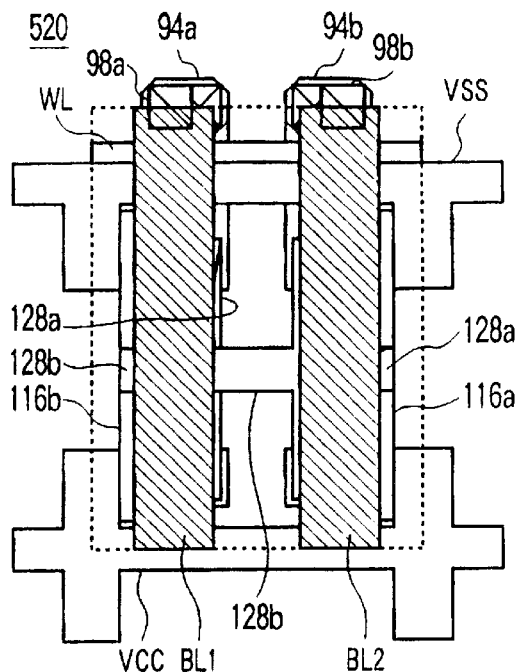
Figure 44C:
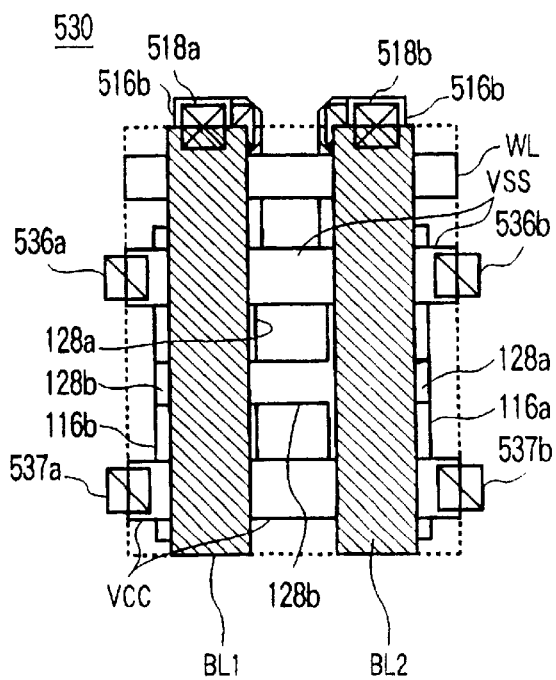
Figure 45A:
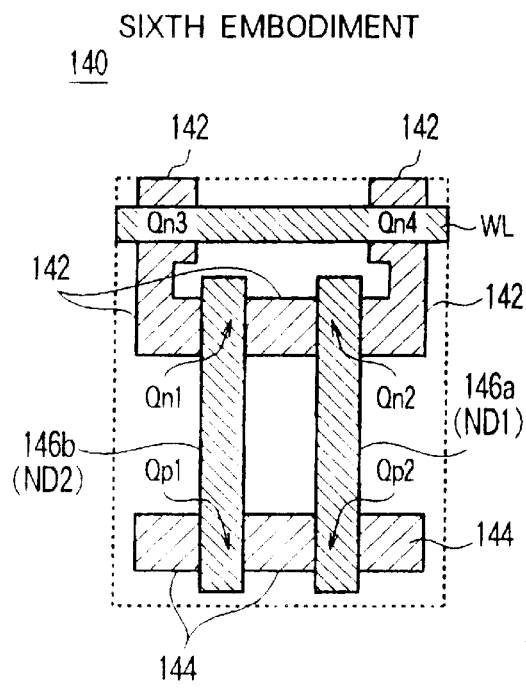
FIGS. 45A to 45D are pattern diagrams of a method of producing an SRAM cell according to a sixth embodiment of the present invention and a first modification showing up to formation of the gate electrode pattern (word line and common gate lines) and comparative examples.
Figure 45C:
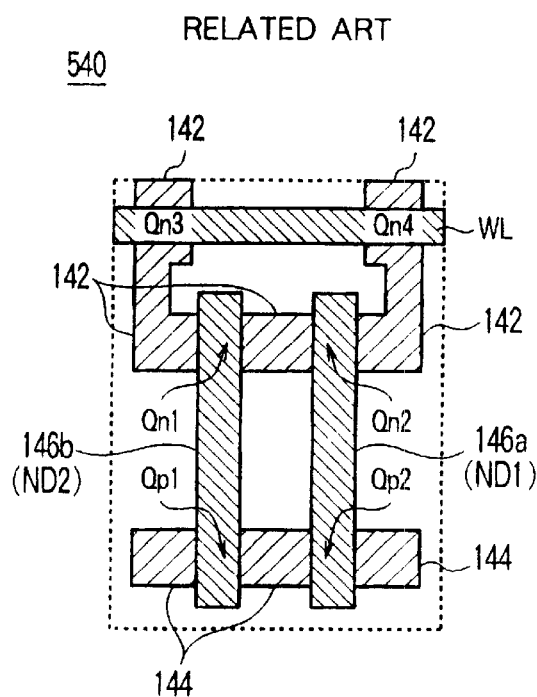
Figure 45B:
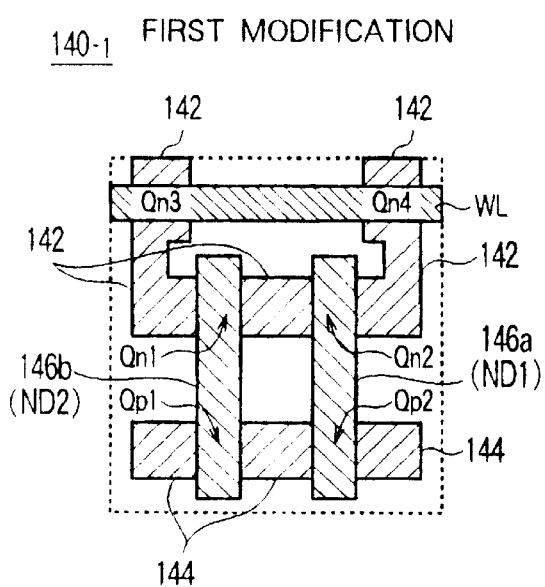
Figure 45D:
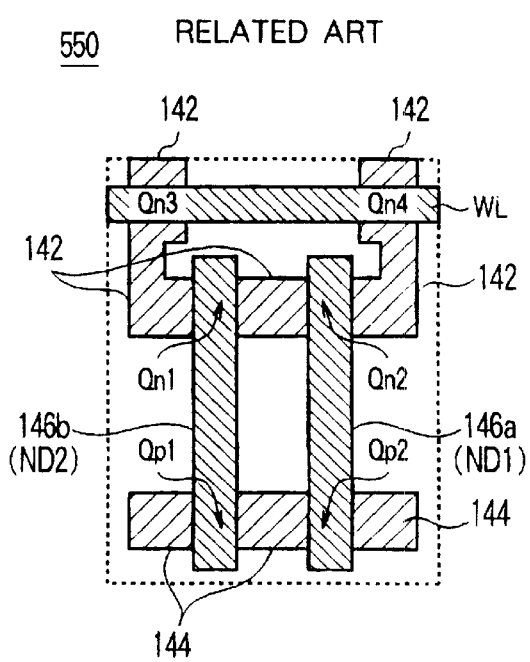

After this, in the same way as the fourth embodiment, the bit contact plugs 98a, 98b are formed on the third-layer interlayer insulating layer (FIGS. 41A to 41C), in only the fourth related art the power voltage supply lines $V_{ss}$, $V_{cc}$ are formed by ordinary interconnections (FIG. 42C), in only the fourth related art the fourth-layer interlayer insulating layer is formed and bit contact use plugs 518a, 518b are formed (FIG. 43C), and the bit lines BL1, BL2 are formed (FIG. 44A to 44C).

The present embodiment may be modified in the same way as in FIG. 35 or 36 in the fourth embodiment.

Further, in the present embodiment, like in the fourth embodiment, the effects resulting from forming the power voltage supply lines by trench interconnections can be obtained.

Sixth Embodiment

The sixth embodiment shows a case of application of the features [2] and [3] of the present invention to type C.

FIGS. 45A, 46A, 47A, 48A, 49A, 50A, 51A, and 52A are layout pattern diagrams in the method of producing an SRAM cell according to the present embodiment. Further, the corresponding "B" figures show a first modification of the sixth embodiment relating to the node interconnection patterns. Note that here, as comparative examples corresponding to the first and second related arts in the fourth embodiment, the corresponding "C" figures and "D" figures show fifth and sixth related arts. The same parts as those in the fourth embodiment are given the same reference numerals and explanations thereof are omitted.

In FIGS. 45A to 45D, active regions, first-layer polycrystalline silicon layers acting also as gate electrodes (word lines, common gate lines), and source or drain impurity regions are successively formed. The active regions 142, 144 in the present example, however, comprise the bisected regions of the fourth embodiment repeating line symmetrically and connected at the proximate facing ends. The relation of the word line WL with respect to the bent and parallel portions of the p-type active region 142 is the same as in the fourth embodiment. Further, the common gate lines 146a, 146b in the present embodiment are simple stripe patterns in the bit line direction.

Figure 46A:
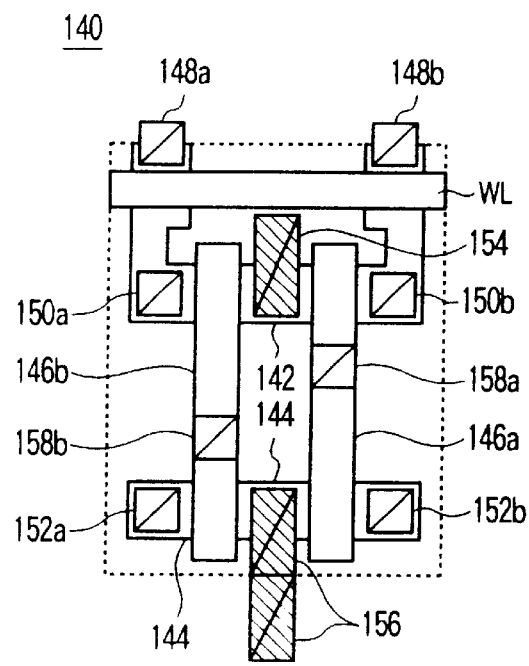
FIGS. 46A to 46D are pattern diagrams of a method of producing an SRAM cell according to a sixth embodiment of the present invention and a first modification showing up to formation of the first contact and comparative examples.
Figure 46C:
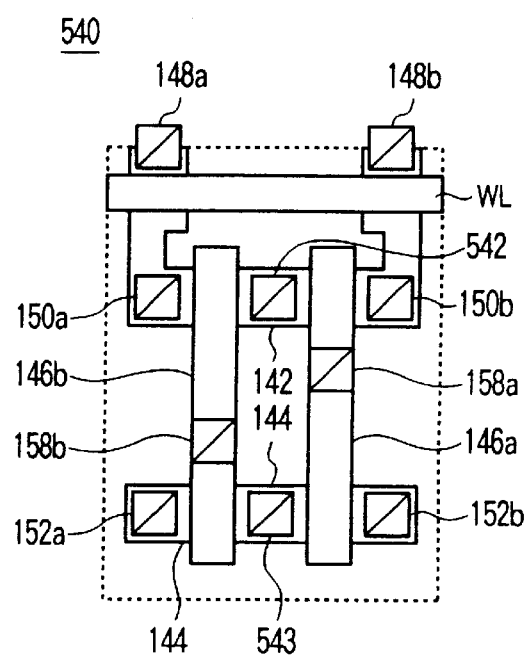
Figure 46B:
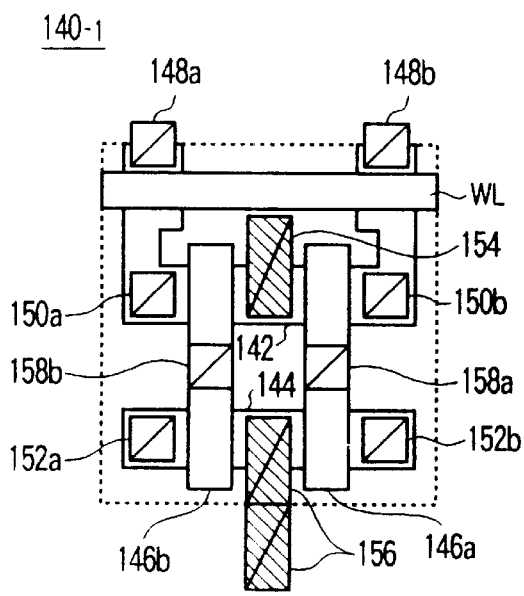
Figure 46D:
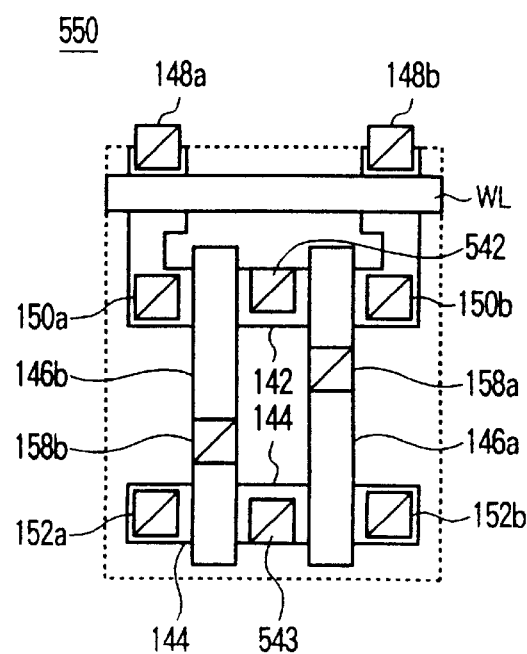

In FIGS. 46A to 46D, a first-layer interlayer insulating layer is formed, then various first-layer contacts 148a to 152b, 158a, and 158b are formed. Among these, the contacts indicated by reference numerals 158a, 158b are formed on the common gate lines 146a, 146b. Further, at the same time, in this embodiment, as shown in FIGS. 46A and 46B, first-layer trench interconnections 154, 156 are formed extending toward the outside from the center portions of the active regions 142, 144. Note that in the fifth and sixth related arts, ordinary plugs 542, 543 were formed for power voltage supply at the center portions of these active regions.

Figure 47A:
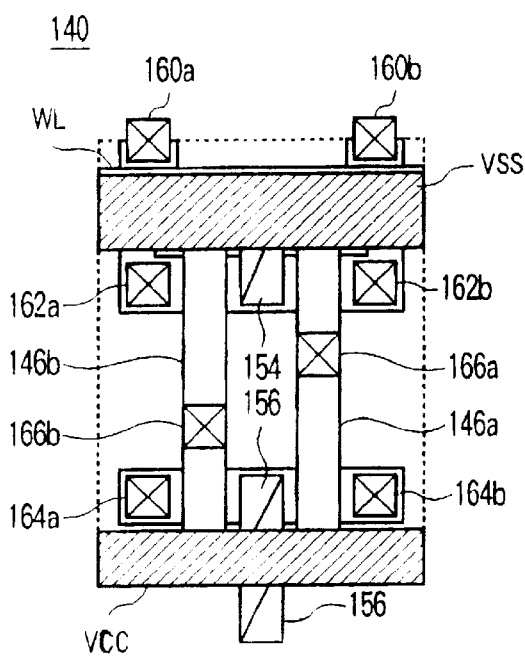
FIGS. 47A to 47D are pattern diagrams of a method of producing an SRAM cell according to a sixth embodiment of the present invention and a first modification showing up to formation of power voltage supply lines (power voltage line and common potential lines) by trench interconnections formed buried in a second-layer interlayer insulating layer and comparative examples.
Figure 47C:
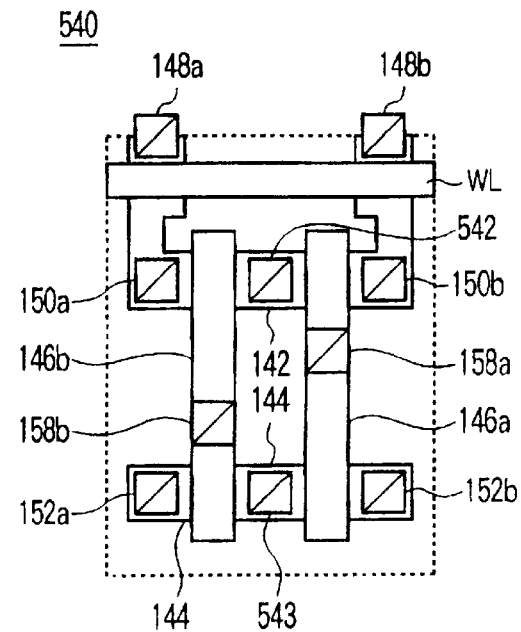
Figure 47B:
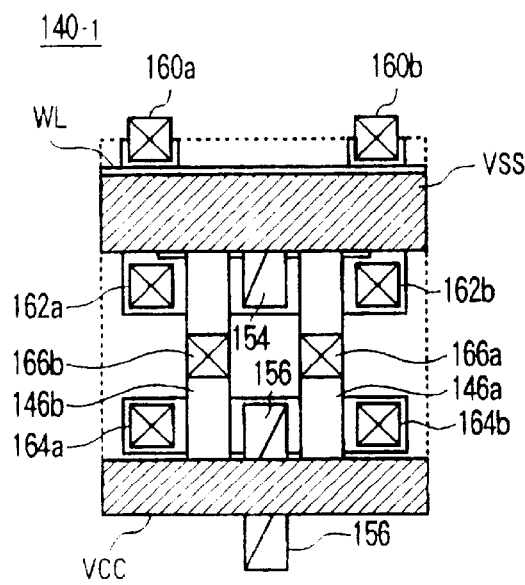
Figure 47D:
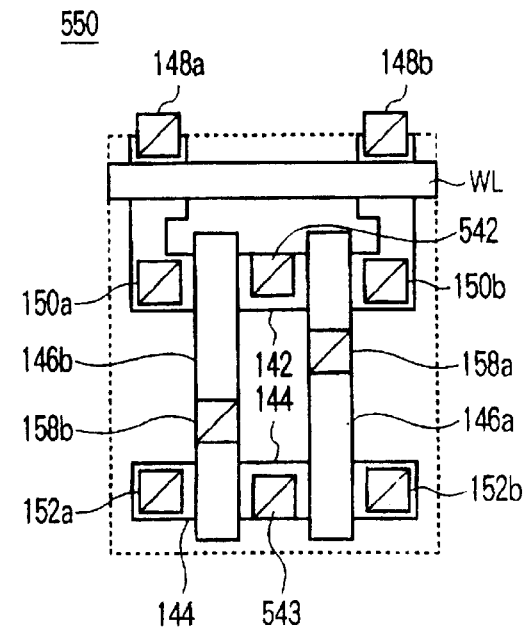

In FIGS. 47A and 47B, the SRAM cells 140, 140$_{-1}$ of the present embodiment, the second-layer interlayer insulating layer is formed, then the power voltage supply lines $V_{ss}$, $V_{cc}$ are formed by second-layer trench interconnections in the second-layer interlayer insulating layer. The power voltage supply lines $V_{ss}$, $V_{cc}$ are laid in the word line direction and are connected to an end portion of the lower-layer trench interconnection 154 or 156. Among these, the power supply line $V_{cc}$ is arranged along a cell side in the word line direction positioned at the p-MOS side and is shared among adjoining cells.

The two-layer contact structure in the present embodiment is realized by the these two layers of trench interconnections.

Note that, at the same time as forming the trench interconnections, second-layer plugs 160a to 166b are formed on the predetermined the first-layer contacts as shown.

In FIGS. 48A to 48D, two storage node interconnections are formed on the second-layer (in fifth or sixth related art, first-layer) interlayer insulating layer.

Figure 48A:
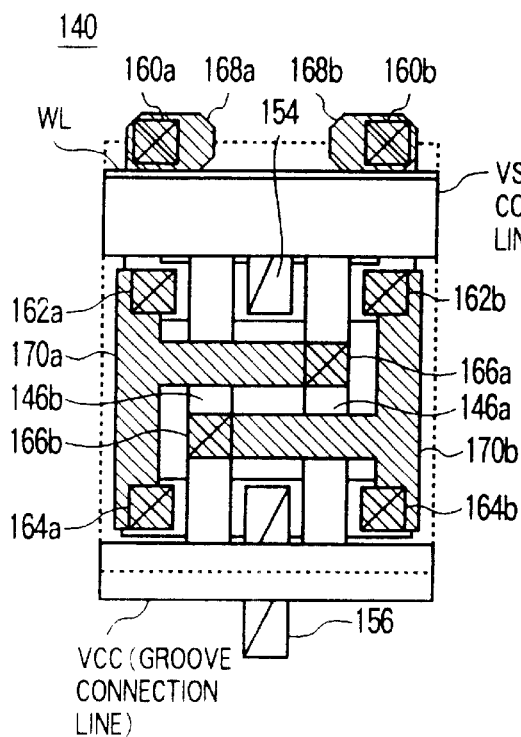
FIGS. 48A to 48D are pattern diagrams of a method of producing an SRAM cell according to a sixth embodiment of the present invention and a first modification showing up to formation of the second-layer interconnections (storage node interconnections) and comparative examples.
Figure 48C:
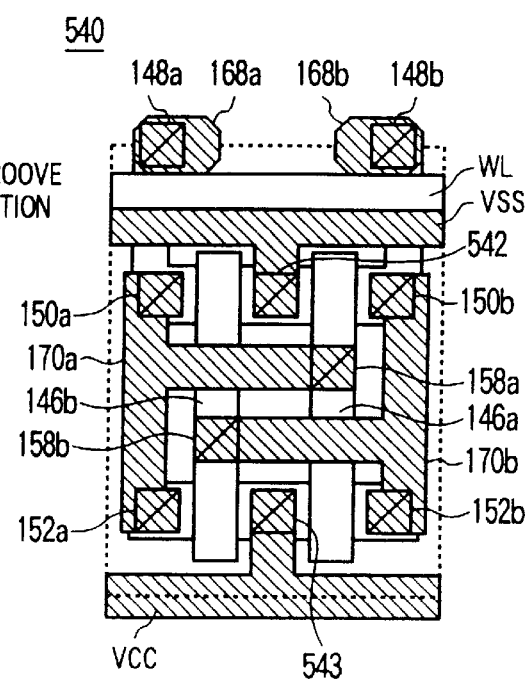
Figure 48B:
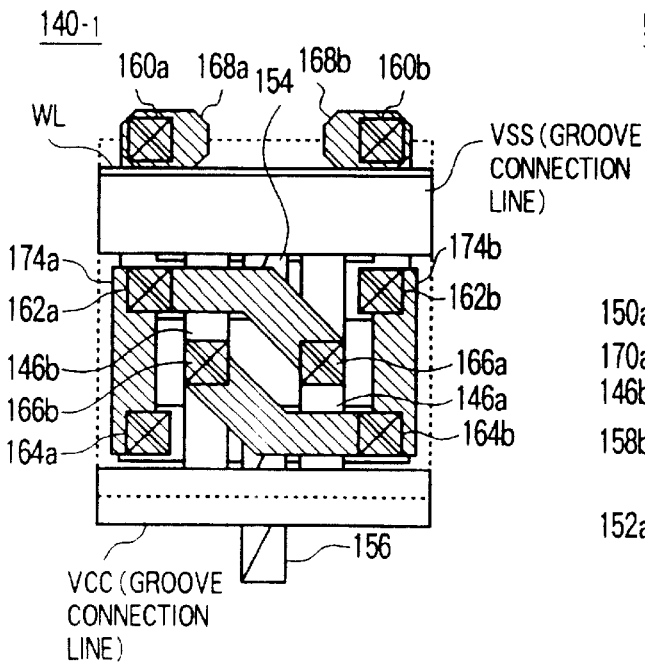
Figure 48D:
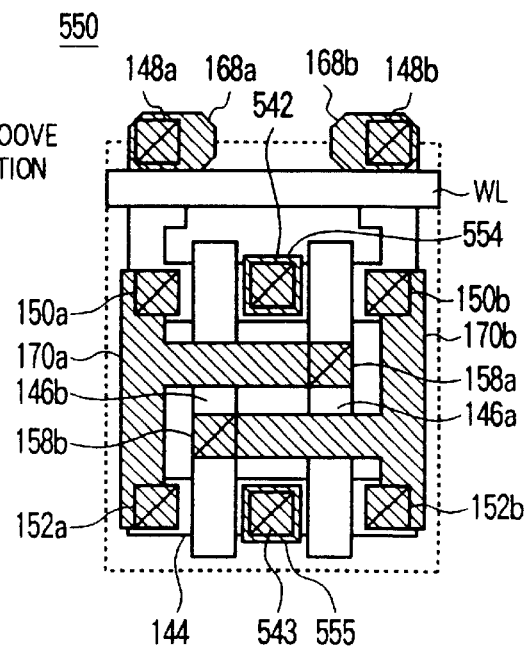
Figure 49A:
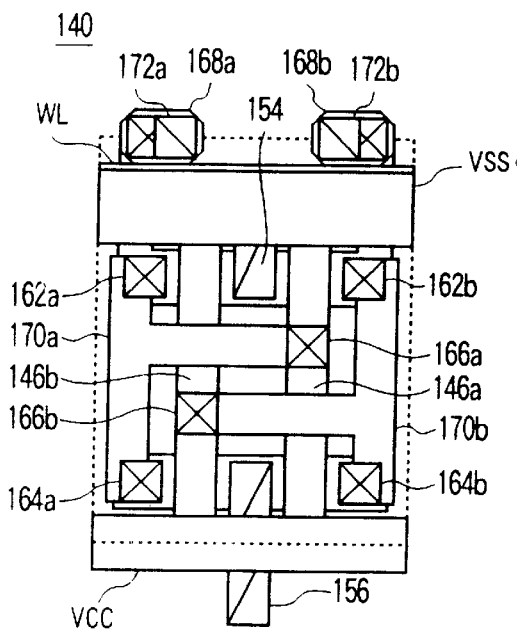
FIGS. 49A to 49D are pattern diagrams of a method of producing an SRAM cell according to a sixth embodiment of the present invention and a first modification showing up to formation of a third-layer plug and comparative examples.
Figure 49C:
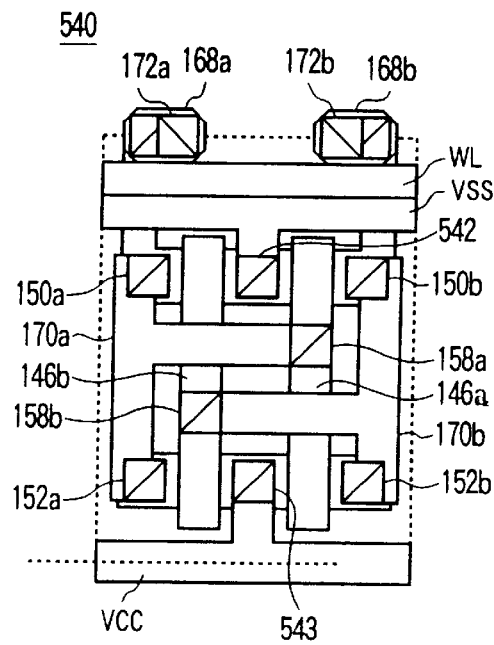
Figure 49B:
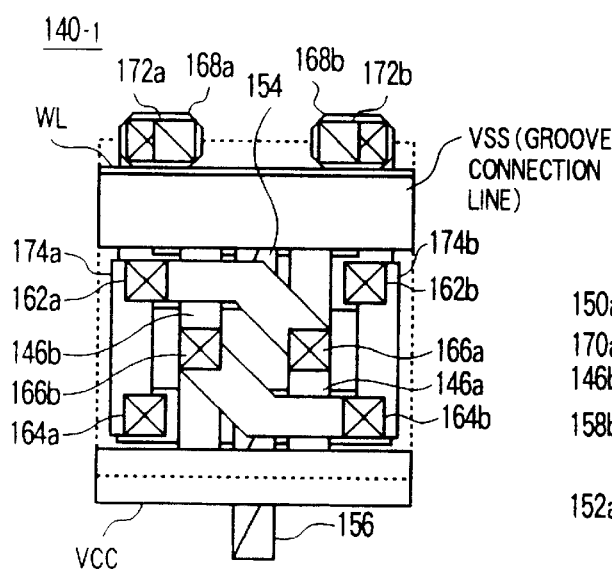
Figure 49D:
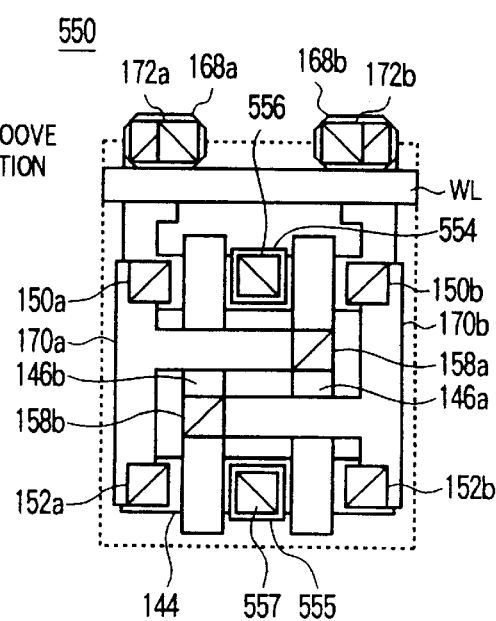

In FIGS. 48A, 48C, and 48D, each of the two storage node interconnections is connected with a common gate line of another inverter side by a branch extending straight in the word line direction from the middle of the interconnection connecting two storage node contact plugs in the bit line direction. That is, the storage node interconnection 170a connects the second-layer plugs 162a, 164a (or first-layer plugs 150a, 152a) and the gate line contact 166a (or 158a). The storage node interconnection 170b connects the second-layer plugs 162b, 164b (or first-layer plugs 150b, 152b) and the gate line contact 166b (or 158b).

On the other hand, in the first modification of FIG. 48B, each of the two storage node interconnections are arranged to detour from one of the two storage node contact plugs to above the first-layer trench interconnection while avoiding the gate line contacts which should not be contacted. The storage node interconnection 174a connects the storage node contact plugs 162a, 164a, then runs above the first-layer trench interconnection 154 and connects with the gate line contact 166a. The storage node interconnection 174b connects the storage node contact plugs 162b, 164b, runs above the first-layer trench interconnection 156, and then is connected on the gate line contact 166b.

At the same time, landing pad layers 168a, 168b are formed on the bit contact plugs 160a, 160b (or 148a, 148b).

Further, simultaneously, only in the fifth related art, the power voltage supply lines $V_{ss}$, $V_{cc}$ are formed by ordinary interconnections in the word line direction connecting the power voltage supply use plugs 542, 543. Further, simultaneously, in only the sixth related art, landing pad layers 554, 555, are formed on the power voltage supply use plugs 542, 543.

Figure 50A:
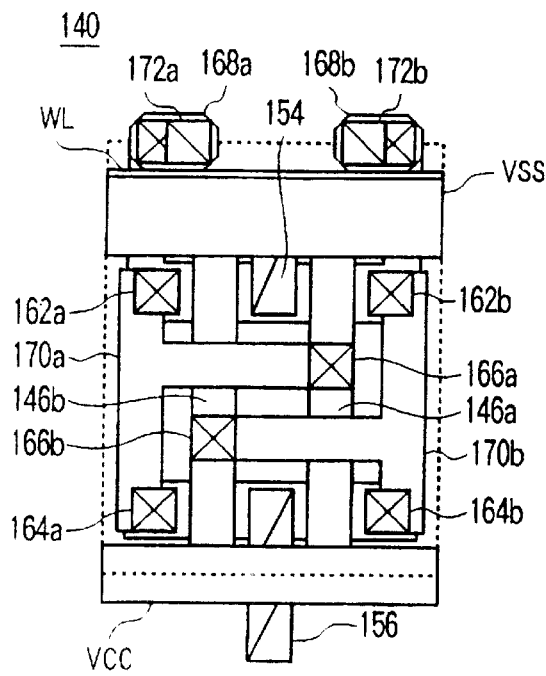
FIGS. 50A to 50D are pattern diagrams of a method of producing an SRAM cell according to a sixth embodiment of the present invention and a first modification showing up to formation of third-layer interconnections (power supply line and common potential lines) in a comparative example.
Figure 50C:
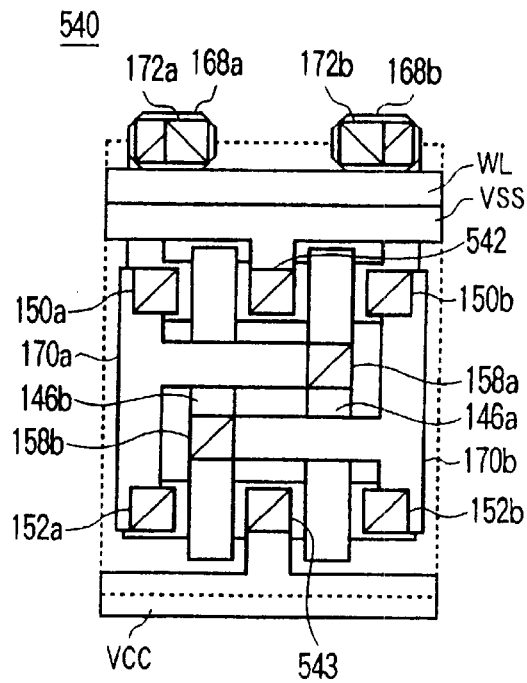
Figure 50B:
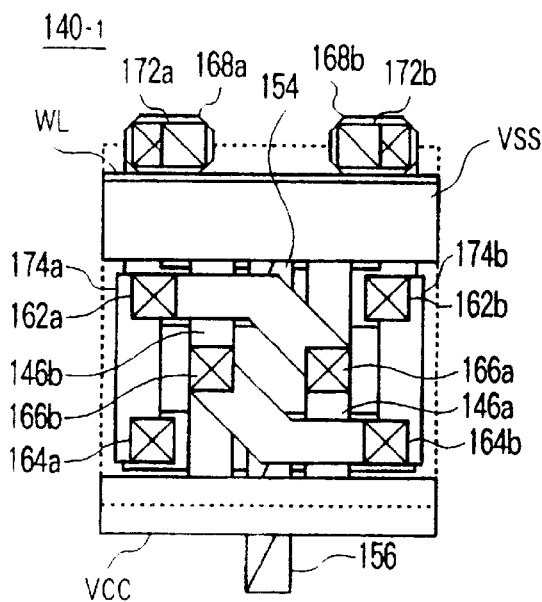
Figure 50D:
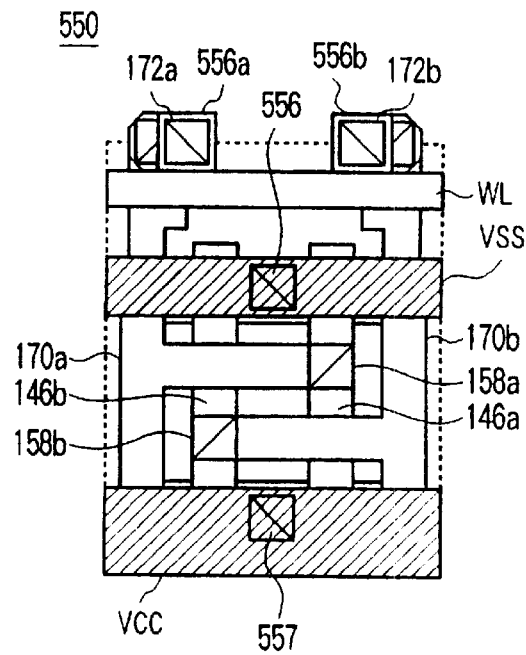
Figure 51A:
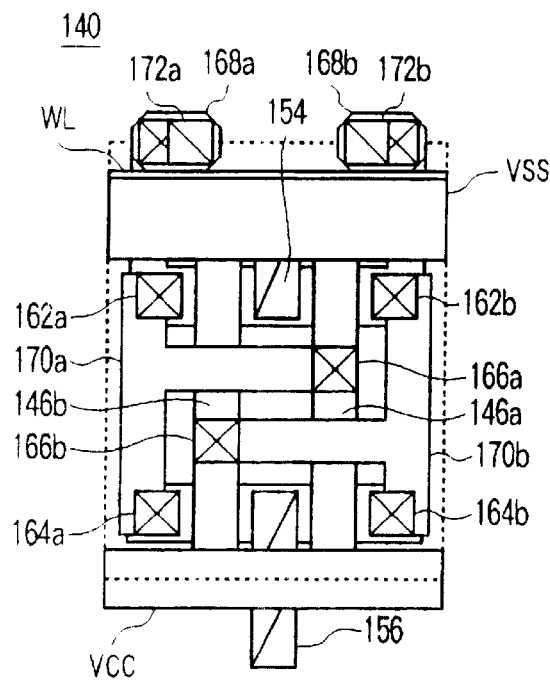
FIGS. 51A to 51D are pattern diagrams of a method of producing an SRAM cell according to a sixth embodiment of the present invention and a first modification showing up to formation of a fourth-layer plug in a comparative example.
Figure 51C:
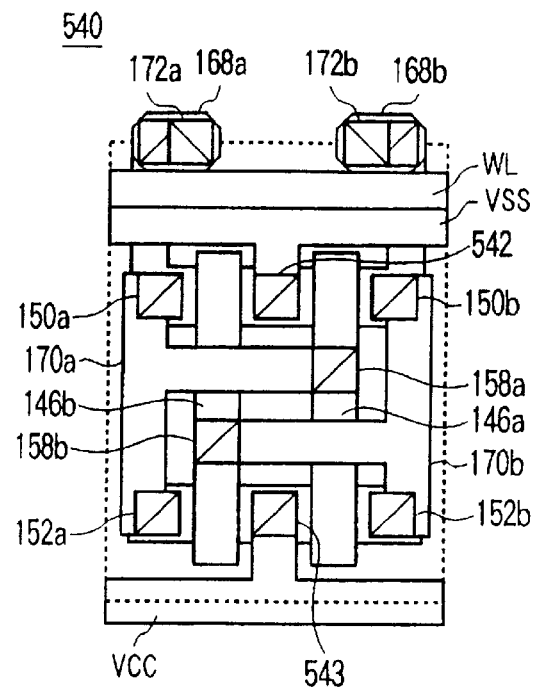
Figure 51B:
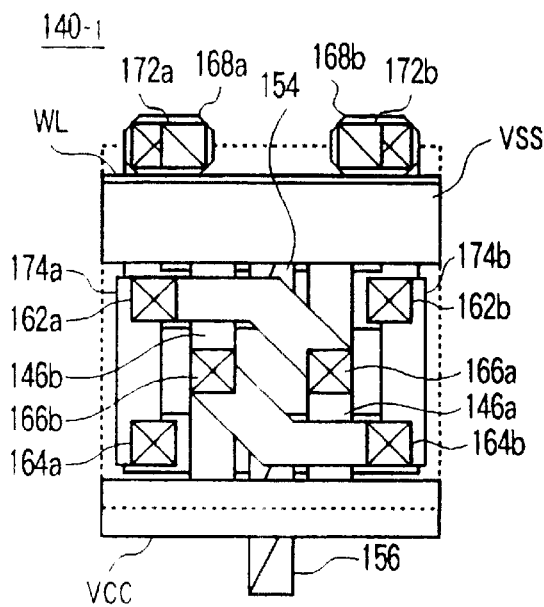
Figure 51D:
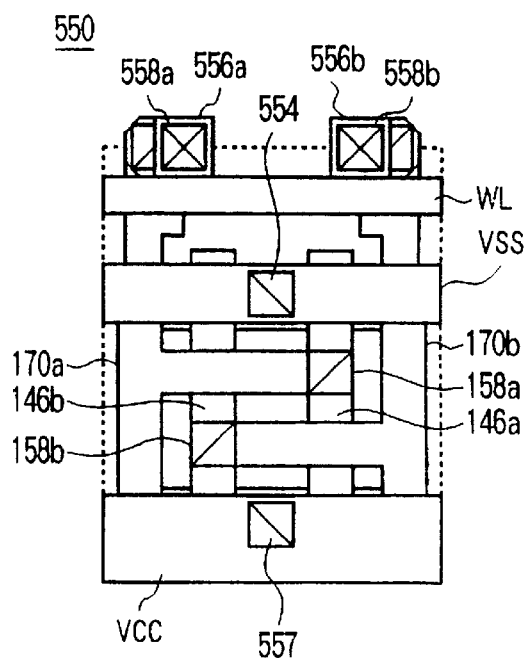
Figure 52A:
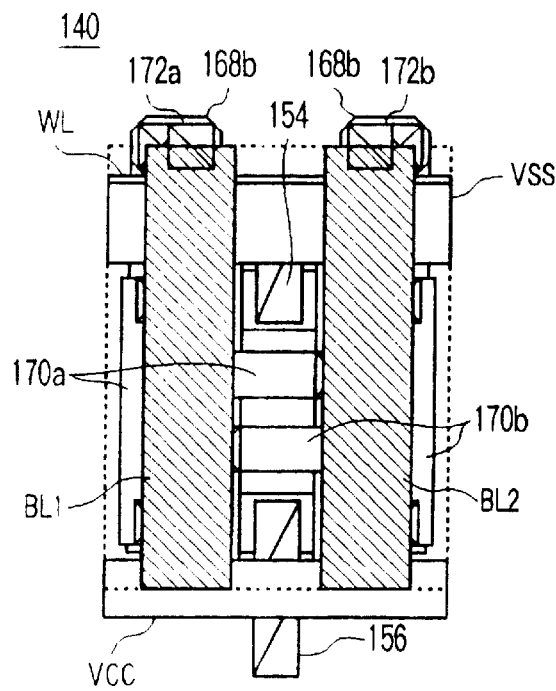
FIGS. 52A to 52D are pattern diagrams of a method of producing an SRAM cell according to a sixth embodiment of the present invention and a first modification showing up to formation of bit lines and comparative examples.
Figure 52C:
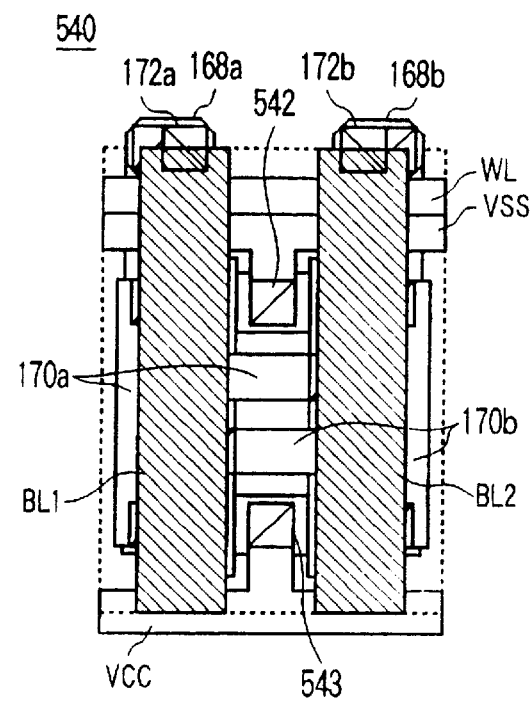
Figure 52B:
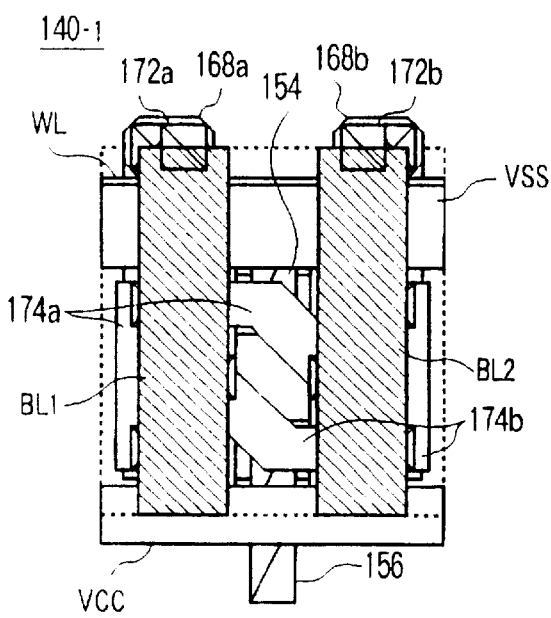
Figure 52D:
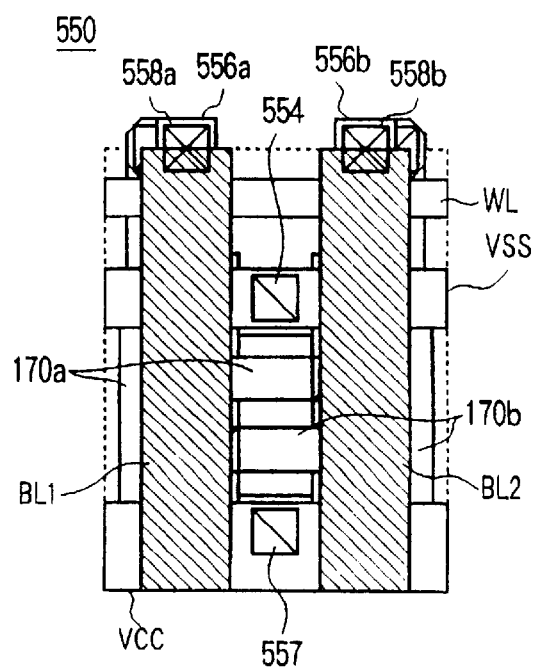

Next, the same procedure is followed as in the previous embodiments to form the bit contact plugs 172a, 172b in the third-layer interlayer insulating layer (FIGS. 49A to 49D), only in the sixth related art the power voltage supply lines $V_{ss}$, $V_{cc}$ are formed by ordinary interconnections (FIG. 50D), only in the sixth related art a fourth-layer interlayer insulating layer is formed and bit contact plugs 558a, 558b are formed (FIG. 51D), and the bit lines BL1, BL2 are formed (FIGS. 52A to 52D).

Next, the predetermined steps are gone through to complete the SRAM device.

Figure 53:
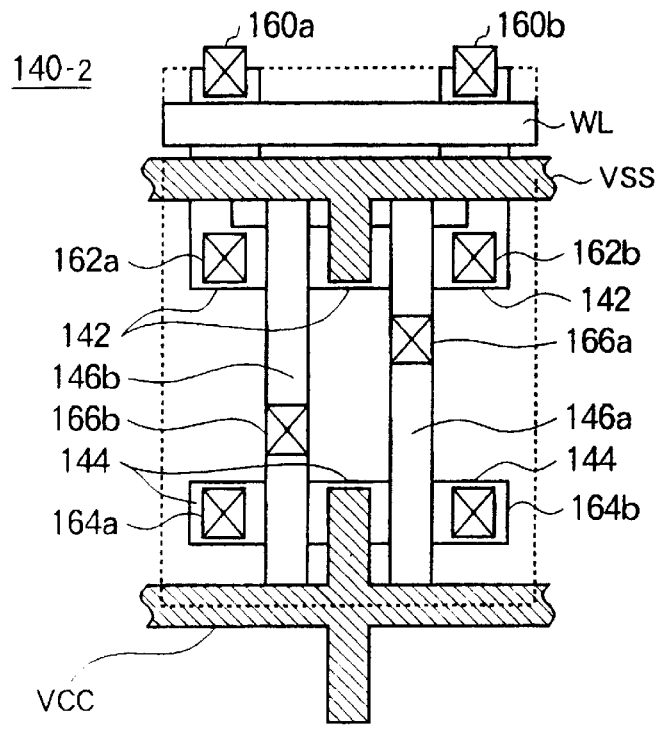
FIG. 53 is a pattern diagram of the state after formation of a second-layer buried conductive layer (trench interconnection) showing a second modification of the sixth embodiment.
Figure 54:
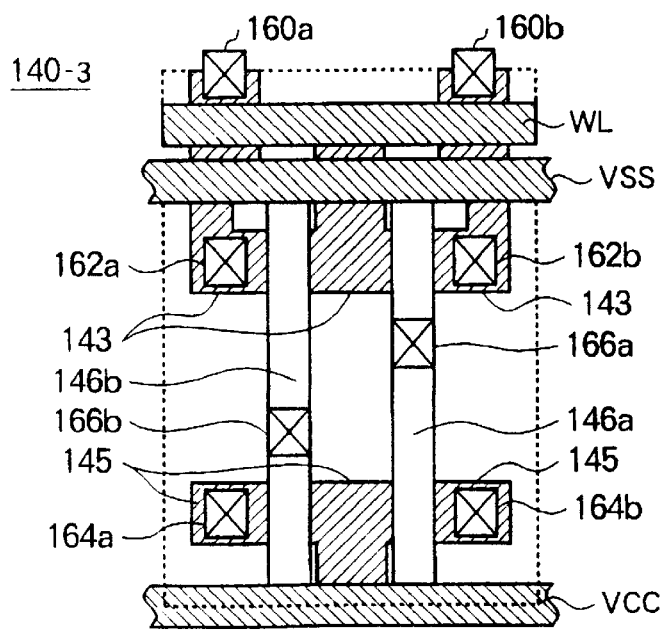
FIG. 54 is a pattern diagram of the state after formation of a second-layer buried conductive layer (trench interconnection) showing a third modification of the sixth embodiment.

FIGS. 53 and 54 are pattern diagrams of the state after forming the trench interconnections according to second and third modifications of the present embodiment.

In the second modification shown in FIG. 53, power voltage supply use contacts are formed by ordinary plugs when forming the first-layer contacts and the connection of these with the power voltage supply lines $V_{ss}$, $V_{cc}$ is achieved by branches extending from the trunks thereof.

Further, in the third modification shown in FIG. 54, the active regions 143, 145 are provided with bent portions from their centers, whereby the power voltage supply lines $V_{ss}$, $V_{cc}$ are made simple stripes.

In the SRAM device of the present embodiment. like in the fourth embodiment, the advantages resulting from making the power voltage supply lines $V_{ss}$, $V_{cc}$ trench interconnections are obtained.

Seventh Embodiment

The seventh embodiment shows the case of addition application of the feature [4] of the present invention to the above second embodiment.

FIGS. 55 to 58 are layout pattern diagrams of a method of producing an SRAM cell according to the present embodiment.

Figure 55:
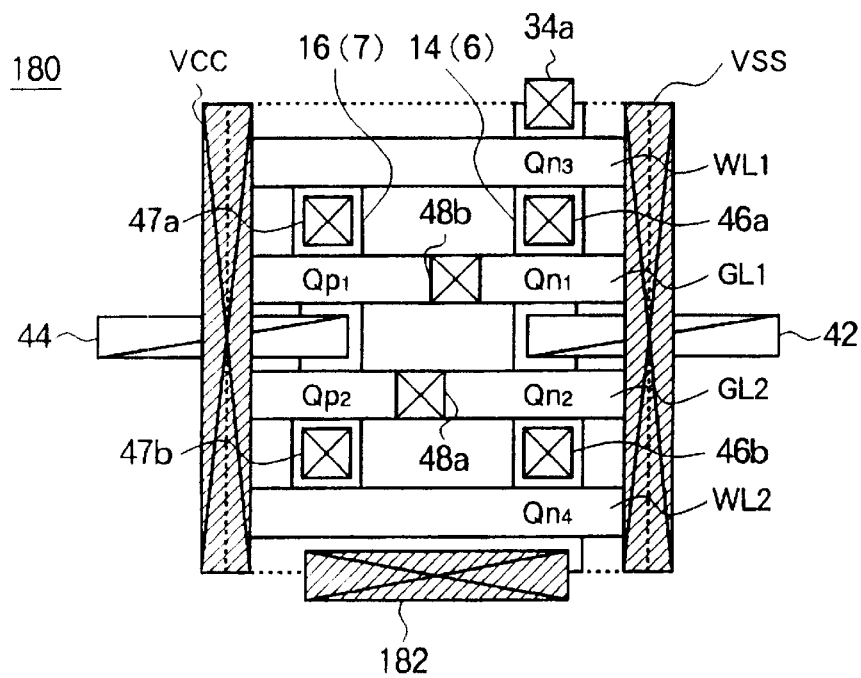
FIG. 55 is a pattern diagram of a method of producing an SRAM cell according to a seventh embodiment of the present invention showing up to formation of the power voltage supply lines (power supply line, common potential lines, and bit line connecting interconnections) by trench interconnections formed buried in a second-layer interlayer insulating layer.

The steps before FIG. 55 are the same as with the second embodiment.

In FIG. 55, power voltage supply lines $V_{ss}$, $V_{cc}$ are formed by trench interconnections. At the same time, a bit line interconnection 182 having a rectangular shape extending-in the word line direction is formed by a trench interconnection and connects on one of the bit contact use plugs 34a, 34b (here, 34b).

Figure 56:
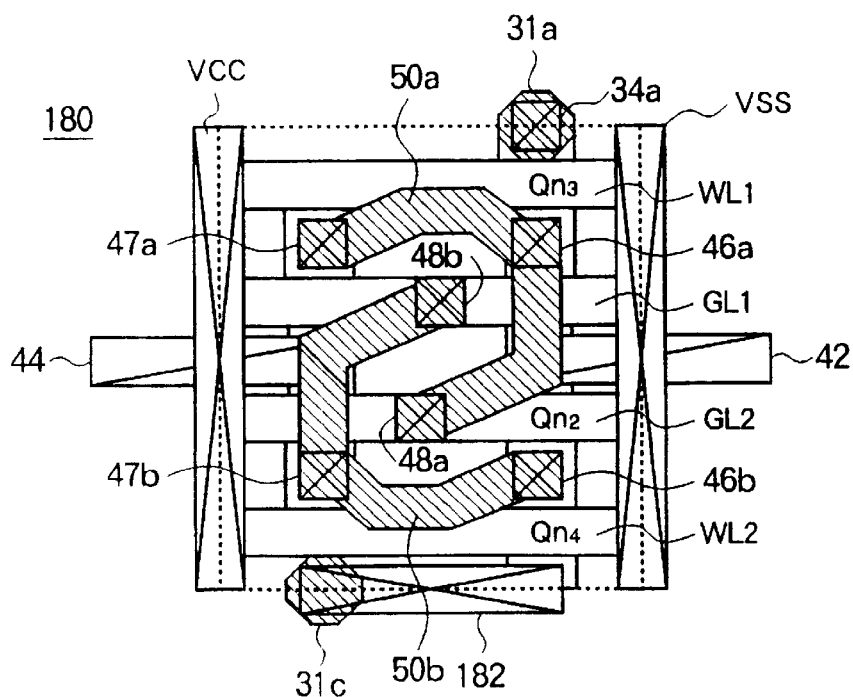
FIG. 56 is a pattern diagram of a method of producing an SRAM cell according to a seventh embodiment of the present invention showing up to formation of the second-layer interconnections (storage node interconnections)
Figure 57:
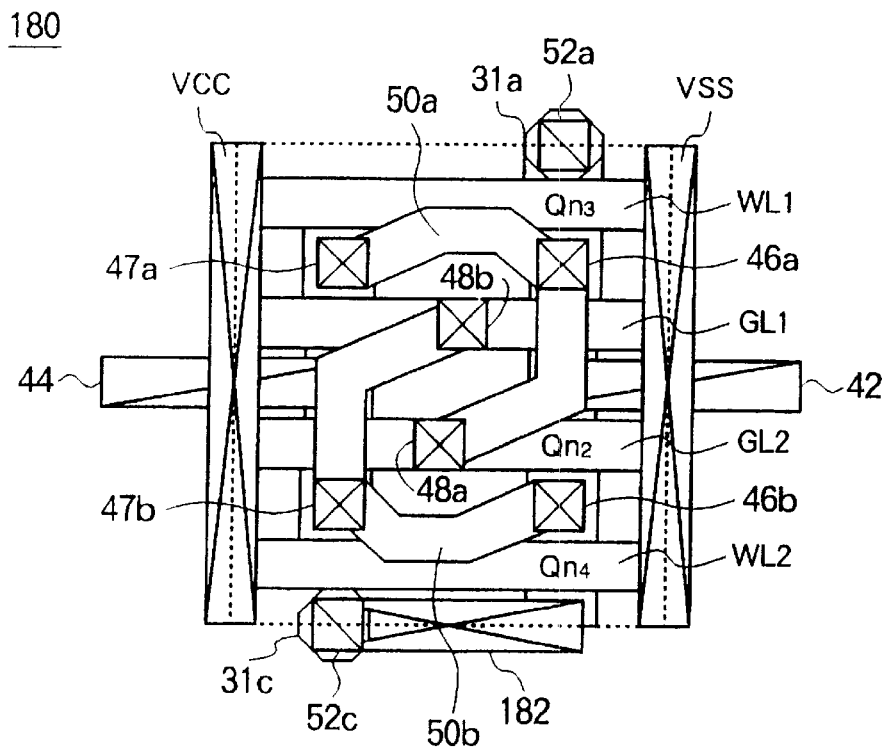
FIG. 57 is a pattern diagram of a method of producing an SRAM cell according to a seventh embodiment of the present invention showing up to formation of a third-layer plug.
Figure 58:
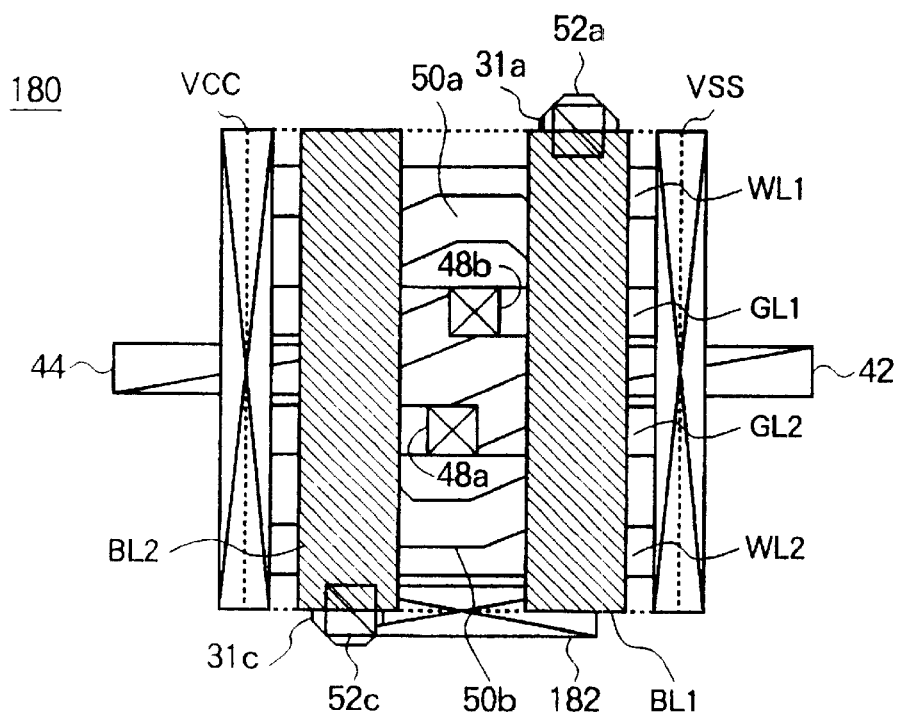
FIG. 58 is a pattern diagram of a method of producing an SRAM cell according to a seventh embodiment of the present invention showing up to formation of the bit lines.

In FIG. 56, storage node interconnections 50a, 50b and a landing pad layer are formed on the second-layer interlayer insulating layer. In the present embodiment, the landing pad layer 31c is formed to contact directly an end of the bit line interconnection 182 formed by a trench interconnection.

Next, a third-layer interlayer insulating layer is formed, then the bit contact use plugs 52a, 52c are formed at positions on the landing pad layer (FIG. 57), the bit lines BL1, BL2 connecting with the plugs are laid on the third-layer interlayer insulating layer (FIG. 58), and other predetermined steps are gone through to complete the SRAM device.

In the present embodiment, in addition to the advantages the same as the second embodiment, by making the bit line connecting interconnections trench interconnections, the multi-layer interconnection structure can be reduced by one layer. Due to this, there is the advantage that the formation of an interlayer insulating layer, formation of connection plugs, etc. can be omitted and the process simplified by that amount.

Note that making the bit line connecting interconnections trench interconnections can be width applied to the pattern of the first embodiment and other type C SRAM devices on a broad basis.

Eighth Embodiment

The eighth embodiment shows a modification of the second embodiment relating to the power voltage supply lines.

Figure 59:
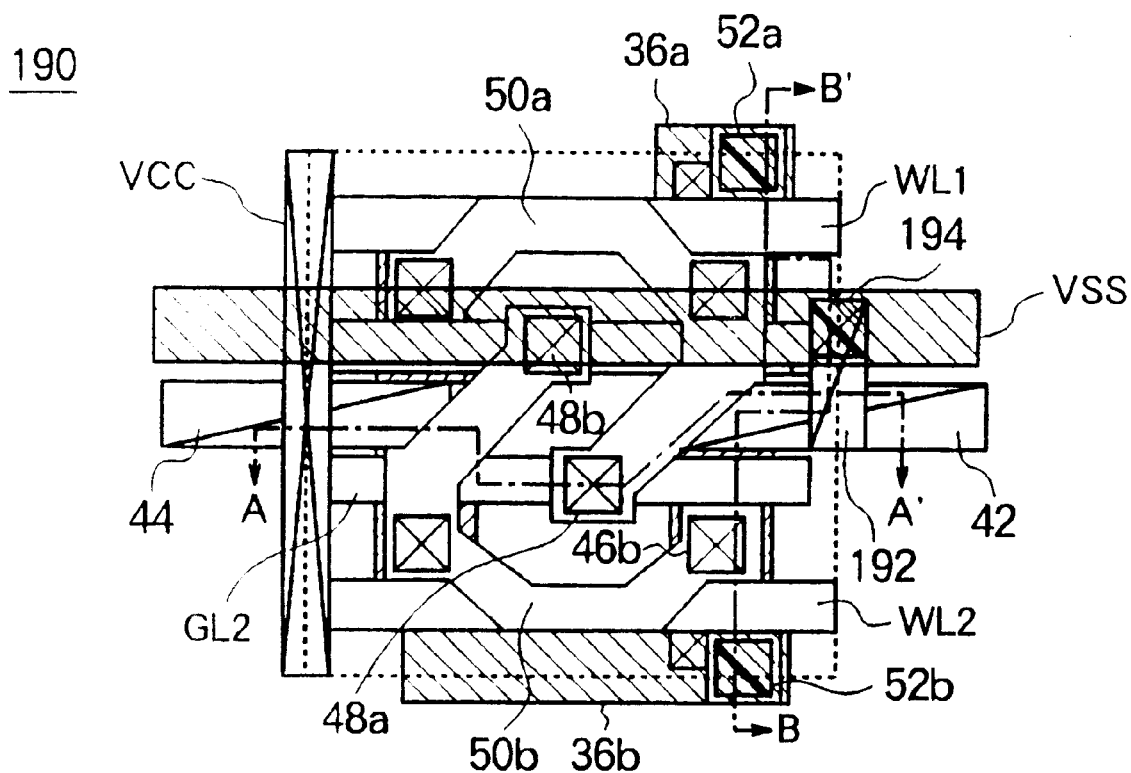
FIG. 59 is a pattern diagram of a method of producing an SRAM cell according to an eighth embodiment of the present invention showing up to formation of the third-layer interconnections (common potential lines and bit line connecting interconnections)
Figure 60A:
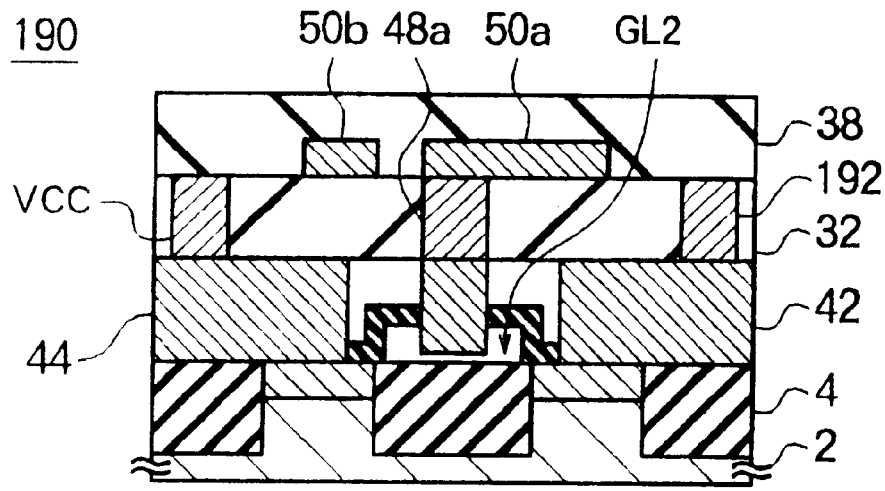
FIGS. 60A and 60B are sectional views of the SRAM cell shown in FIG. 59.
Figure 60B:
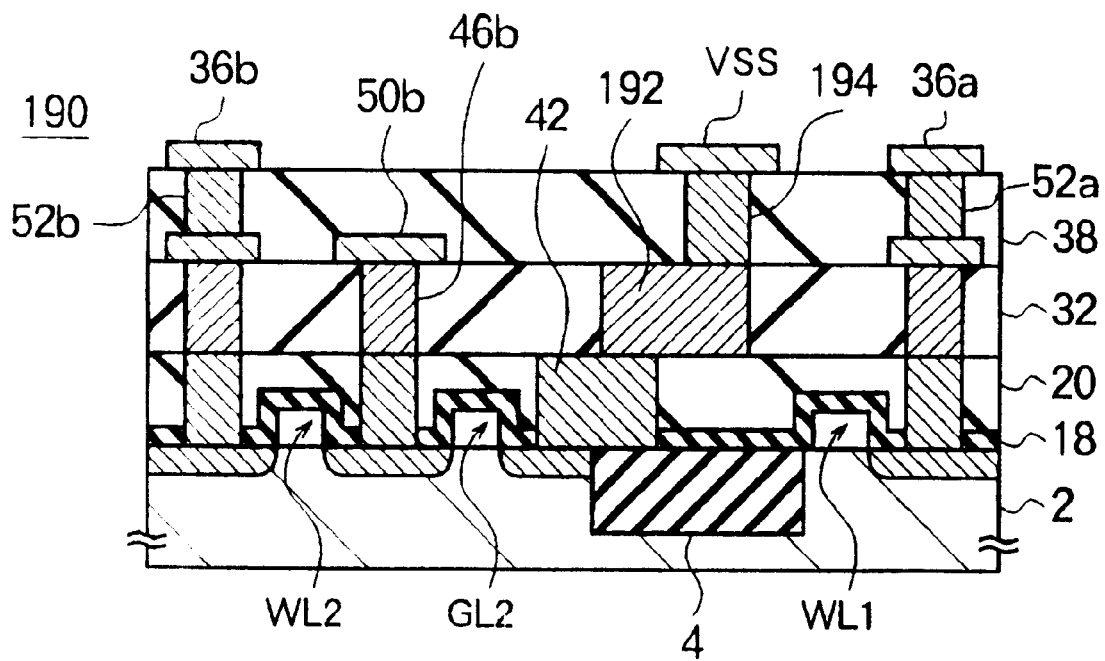

FIG. 59 is a layout pattern diagram of the state after forming third-layer interconnections in a SRAM cell according the present embodiment and corresponds to FIG. 16A of the second embodiment. Further, FIG. 60A is sectional view along the line A–A' in FIG. 59, and FIG. 60B is one along the line B–B' therein.

In the second embodiment, before the second-layer interconnection step, the trench interconnection power voltage supply lines $V_{ss}$, $V_{cc}$ were formed on the second-layer interlayer insulating layer.

As opposed to this, in the present embodiment, only one of these power voltage supply lines (in the illustrated example, common potential line $V_{ss}$) is made a long trench interconnection passing through the cells and at the other side a buried conductive layer (plug or trench interconnection) for internal connection is formed. The buried conductive layer 192 for internal connection illustrated consists of a trench interconnection arranged from the lower-layer trench interconnection 42 to one side in the bit line direction (in the illustrated example, the word line WL1 side).

Next, a third-layer interlayer insulating layer is formed, then bit contact use plugs 52a, 52b are formed it in and, simultaneously, a plug 194 is formed on the buried conductive layer for internal connection (trench interconnection 192).

Then, in the third-layer interconnection step, the power voltage supply line connected on the plug 194 (common potential line $V_{ss}$) is arranged in a direction perpendicularly intersecting the other power voltage supply line (power supply line $V_{cc}$) along with the bit line connecting interconnection 36b etc. (FIG. 59).

Next, in the same way as in the second embodiment, a fourth-layer interlayer insulating layer is formed, bit contact use plugs are formed therein, then the bit lines are laid and other steps taken to complete the SRAM cell.

Figure 61:
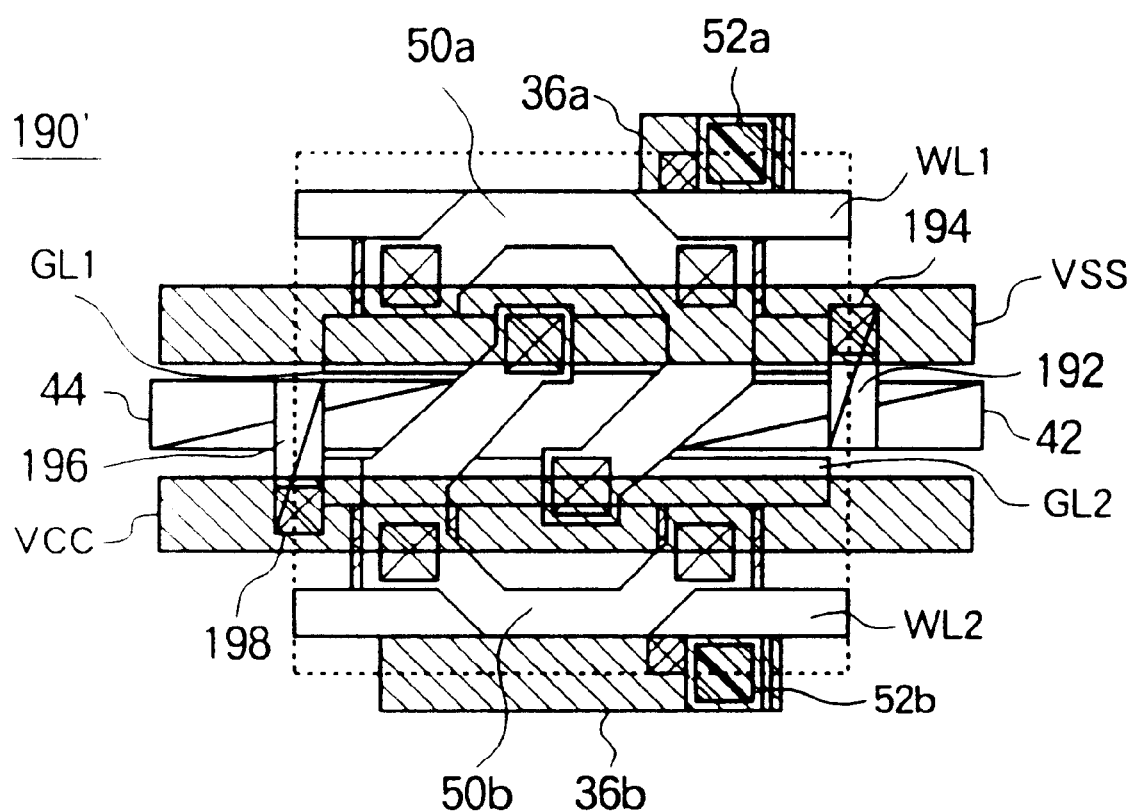
FIG. 61 is a pattern diagram showing a modification of the eighth embodiment.
Figure 62:
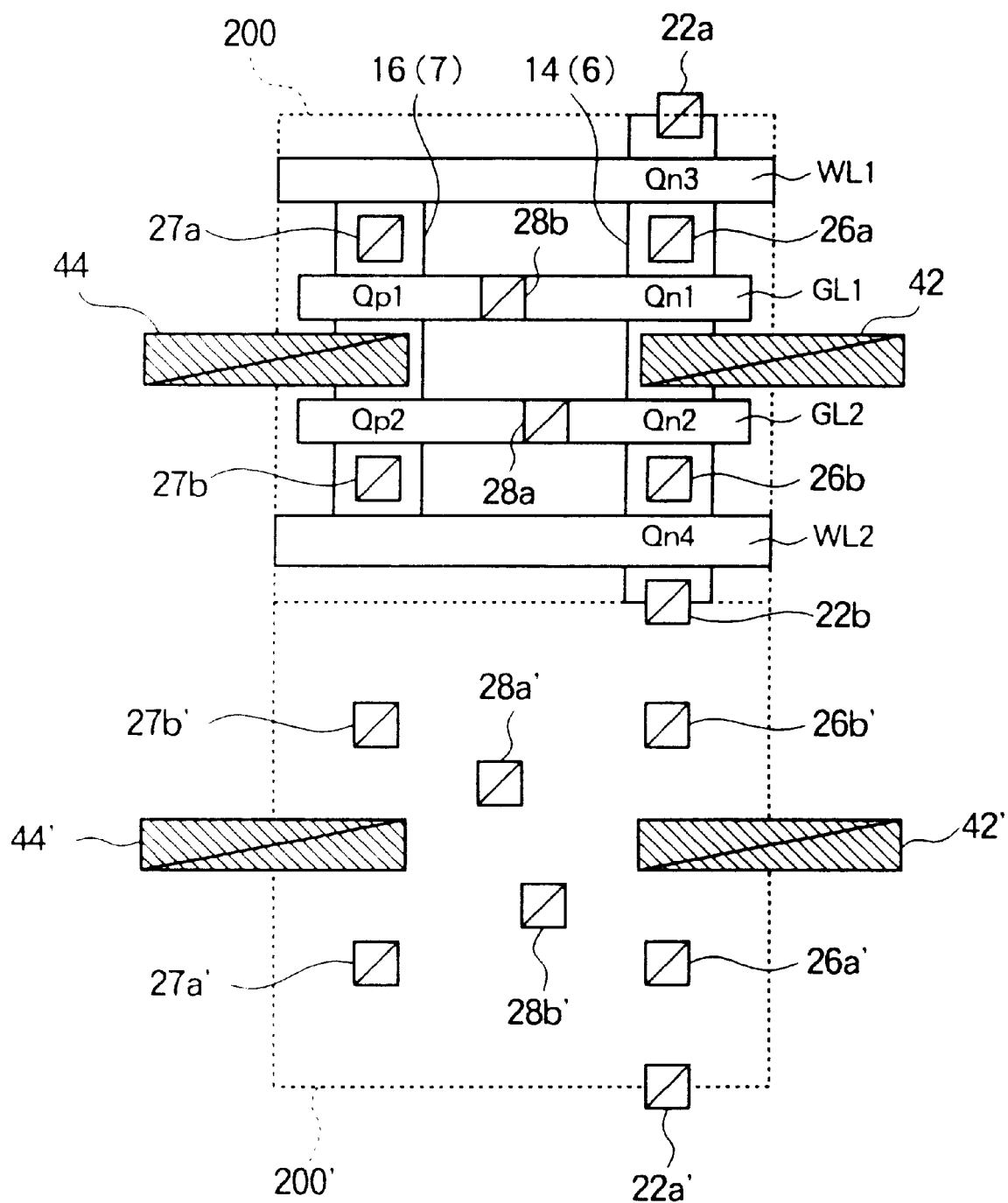
FIG. 62 is a pattern diagram of a method of producing an SRAM cell according to a ninth embodiment of the present invention showing up to the formation of a first contact.

FIG. 61 is a layout pattern diagram according to a modification of the present embodiment.

In this modification, in addition to the common potential line $V_{ss}$, the power supply line $V_{cc}$ is formed by an upper-layer interconnection. In this case, to separate the common potential line $V_{ss}$ and the power supply line $V_{cc}$, it is necessary to make the internal connection use buried conductive layers 192, 196 trench interconnections arranged in opposite directions. The common potential line $V_{ss}$ and the power supply line $V_{cc}$ are formed by parallel stripe patterns a predetermined distance apart on the plugs 194, 198 contacting the trench interconnections 192, 196.

In the present embodiment, the power voltage supply lines formed by the upper-layer interconnections could be increased in width because there was nothing which could disturb them other than the bit line connecting interconnections. In particular, in the case of FIG. 59 where the power voltage supply lines are formed by a trench interconnection and upper-layer interconnection, it is possible to lower the interconnection resistance by forming a wide interconnection. Further, there is no increase in steps compared with the second embodiment.

Ninth Embodiment

The ninth embodiment shows a case of application of the feature [5] of the present invention to the type C, that is, using the same upper-layer interconnections (power voltage supply lines) of the eighth embodiment between cells in a direction perpendicularly intersecting the interconnection direction.

FIGS. 62 to 68 are layout pattern diagrams showing two or four SRAM cells (type C) according to the present embodiment.

As shown in these figures, in type C SRAM cells, a bit contact is shared between two cells 200, 200'. The two cells 200, 200' are arranged linear symmetrically with respect to a cell side where the shared contact is provided.

Figure 66:
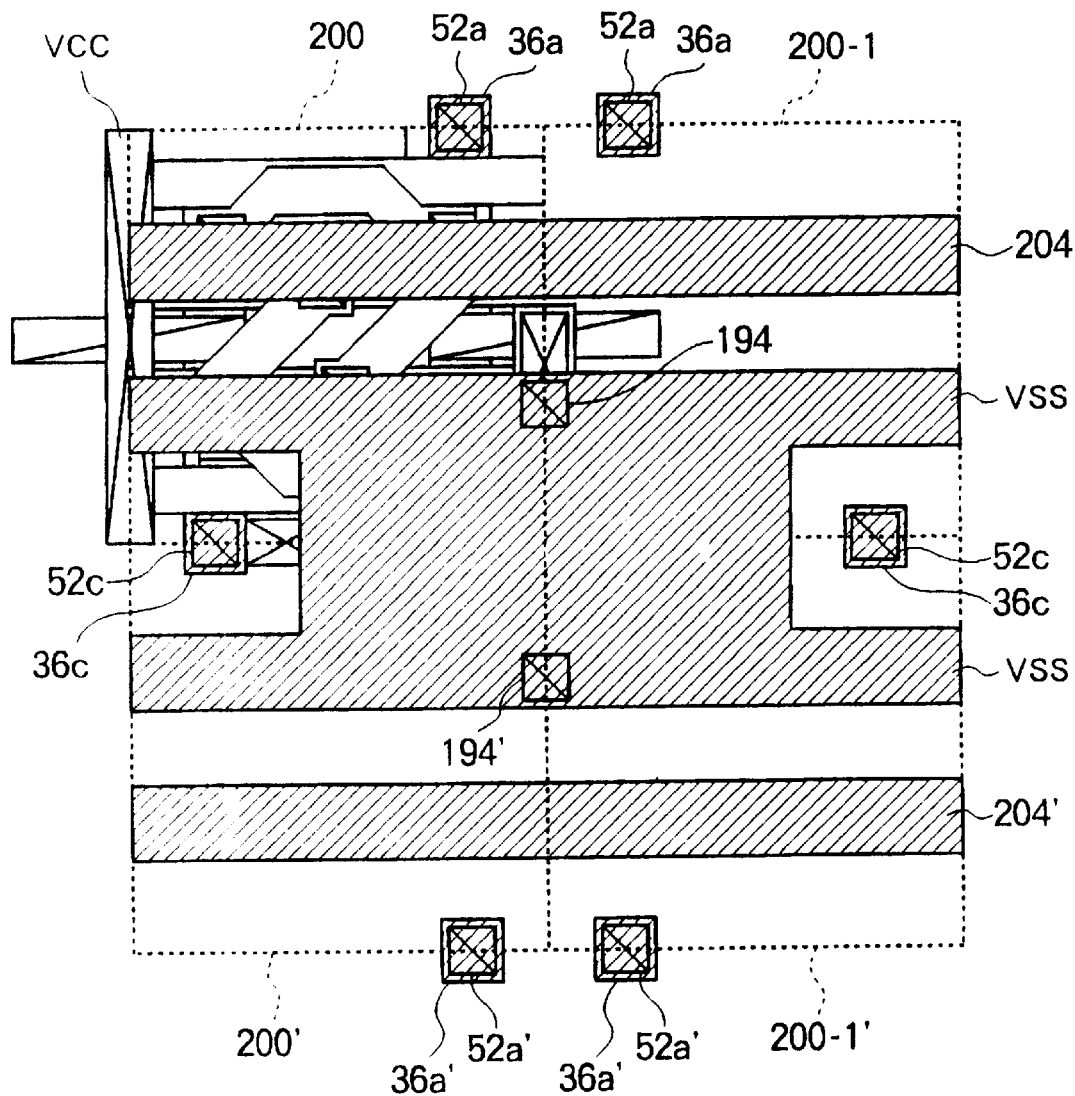
FIG. 66 is a pattern diagram of a method of producing an SRAM cell according to a ninth embodiment of the present invention showing up to the formation of third-layer interconnections (common potential lines)
Figure 67:
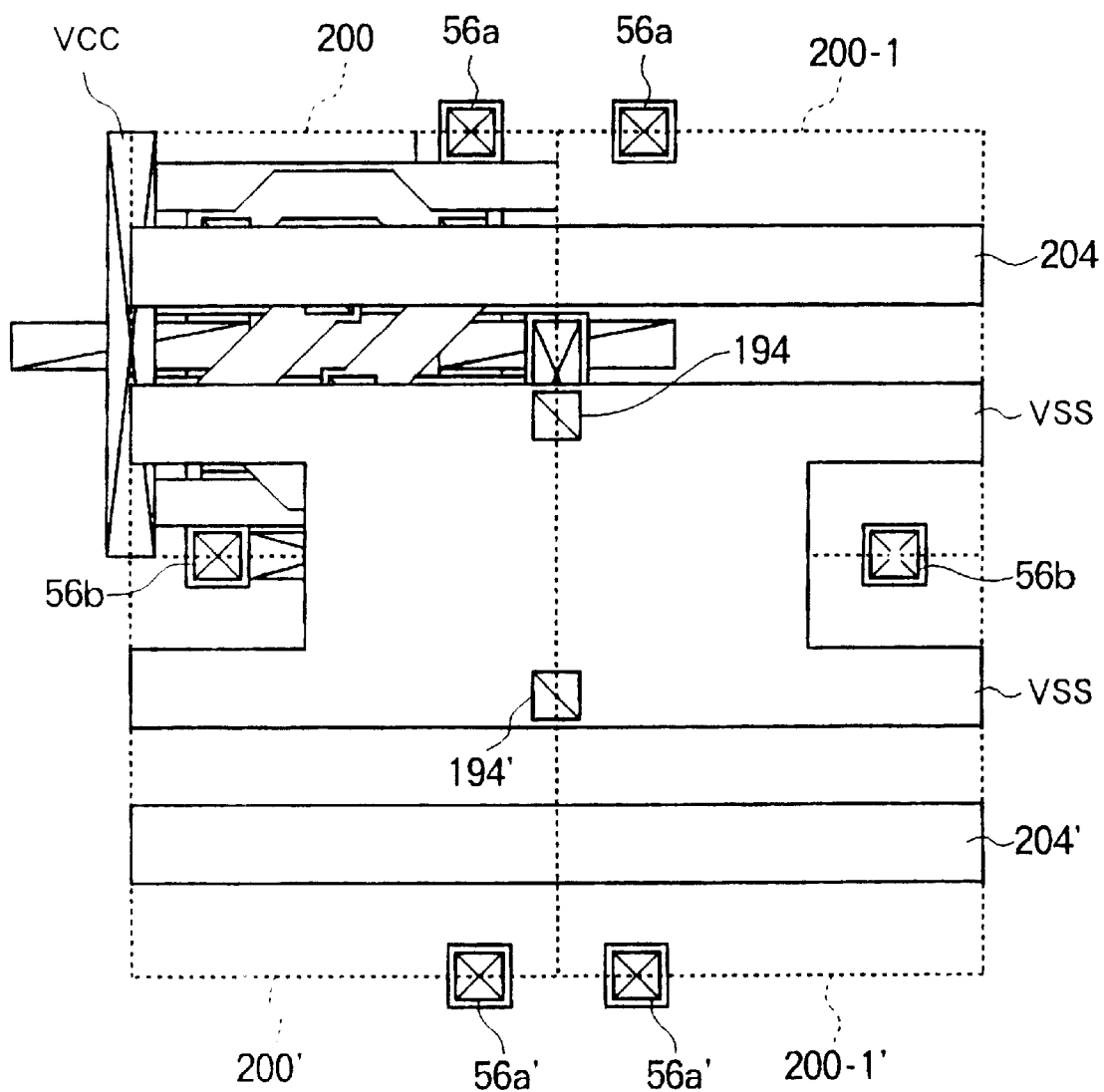
FIG. 67 is a pattern diagram of a method of producing an SRAM cell according to a ninth embodiment of the present invention showing up to the formation of a fourth-layer plug.

In the present embodiment, substantially the same steps as the eighth embodiment are performed up to before the formation of the upper-layer interconnections shown in FIG. 66.

Figure 63:
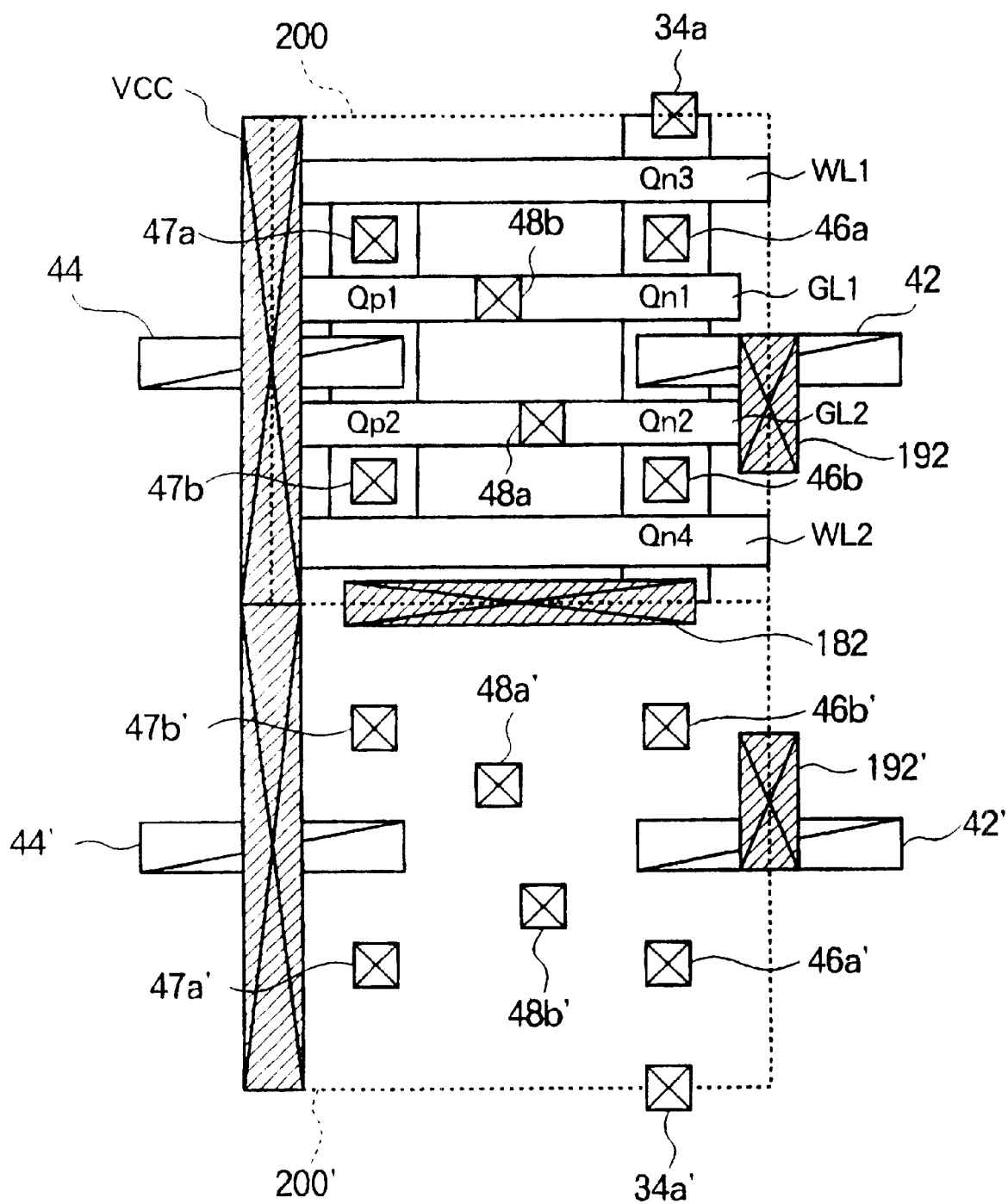
FIG. 63 is a pattern diagram of a method of producing an SRAM cell according to a ninth embodiment of the present invention showing up to the formation of interconnections (power supply line and internal connecting interconnections) by trench interconnections formed buried in a second-layer interlayer insulating layer.
Figure 64:
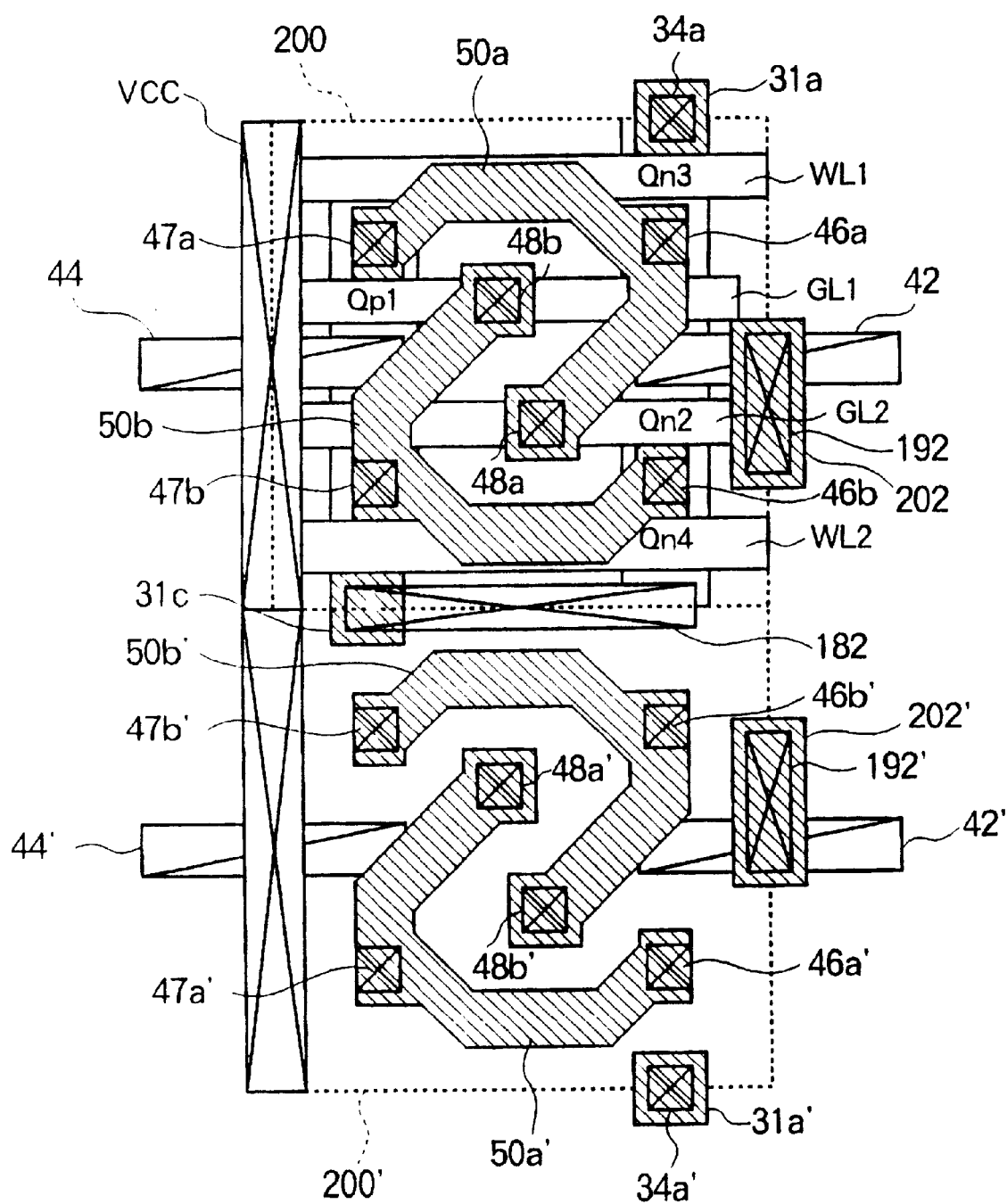
FIG. 64 is a pattern diagram of a method of producing an SRAM cell according to a ninth embodiment of the present invention showing up to the formation of second-layer interconnections (storage node interconnections)
Figure 65:
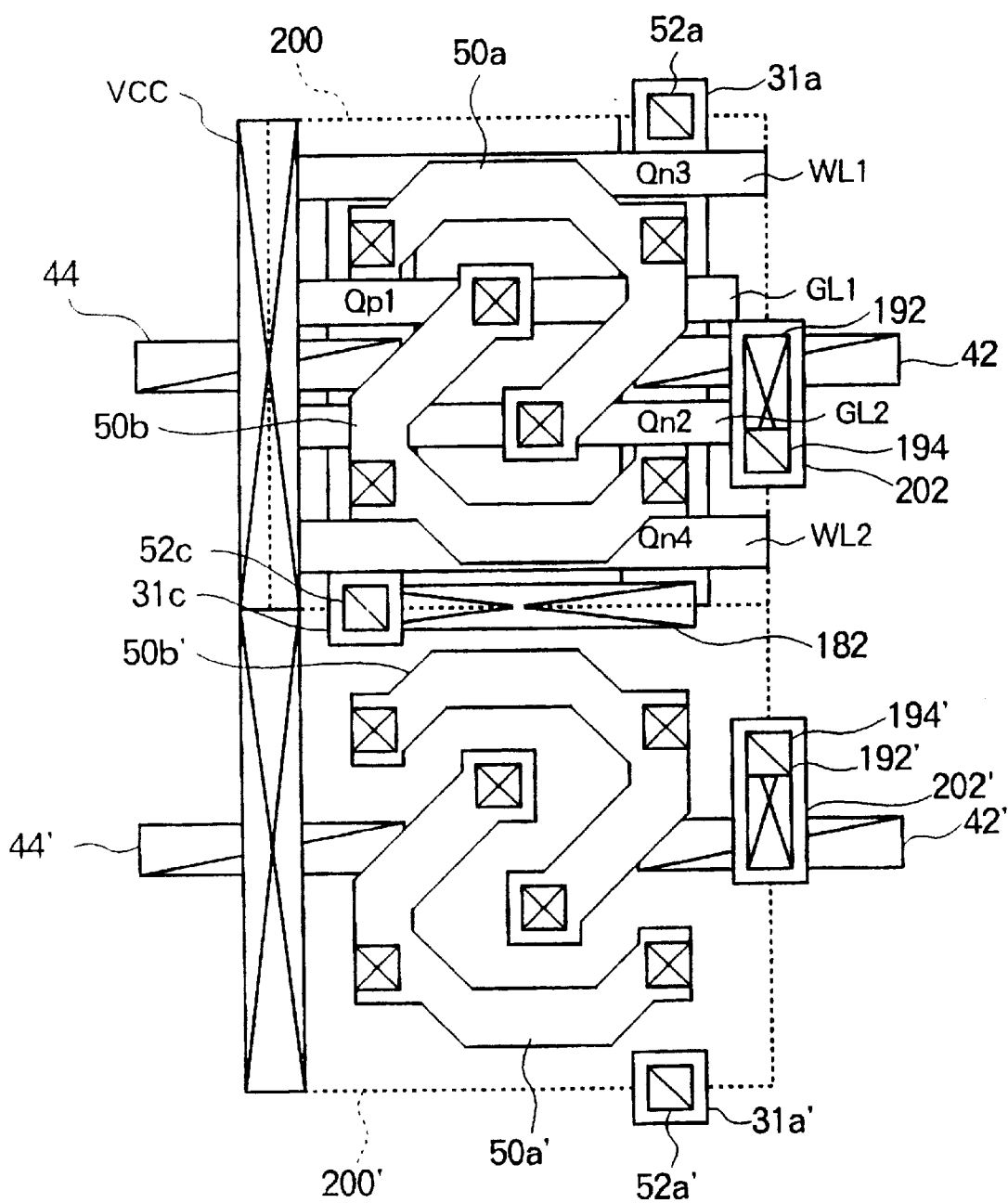
FIG. 65 is a pattern diagram of a method of producing an SRAM cell according to a ninth embodiment of the present invention showing up to the formation of a third-layer plug.

Specifically, after forming the transistors, the first-layer trench interconnections 42, 44 are formed along with various contacts (FIG. 62), the second-layer interlayer insulating layer is formed, and the second-layer trench interconnections 192, 192' are formed on the first-layer trench interconnections 42, 42' on the impurity regions given a common potential at the same time as the formation of the plugs 34a etc. (FIG. 63). Next, landing-pad use interconnections 202, 202' are formed on the second-layer interlayer insulating layer to contact the second-layer trench interconnections 192, 192' at the same time as forming the storage node interconnections 50a, 50b etc. (FIG. 64). Next, the third-layer interlayer insulating layer is formed and power voltage supply use plugs 194, 194' are formed at the same time as forming the bit contact use plugs 52a, 52c (FIG. 65).

In FIG. 66, a common potential line $V_{ss}$ is formed by the third-layer interconnection, but in the present embodiment, the common potential line $V_{ss}$ is made a pattern connected between two adjoining cells in the bit line direction at portions other than around the bit contacts.

Note that, in FIG. 66, reference numeral 204 indicates a so-called "back-connected interconnection" of the word line, that is, an interconnection for reducing the resistance connected to the word line at a not shown location. In this embodiment, this back-connected interconnection 204 of the word line is formed at the same level layer as the common potential line $V_{ss}$. When the back-connected interconnection 204 of the word line is unnecessary, it is possible to make the common potential line $V_{ss}$ a planar pattern open around the bit contacts.

Figure 68:
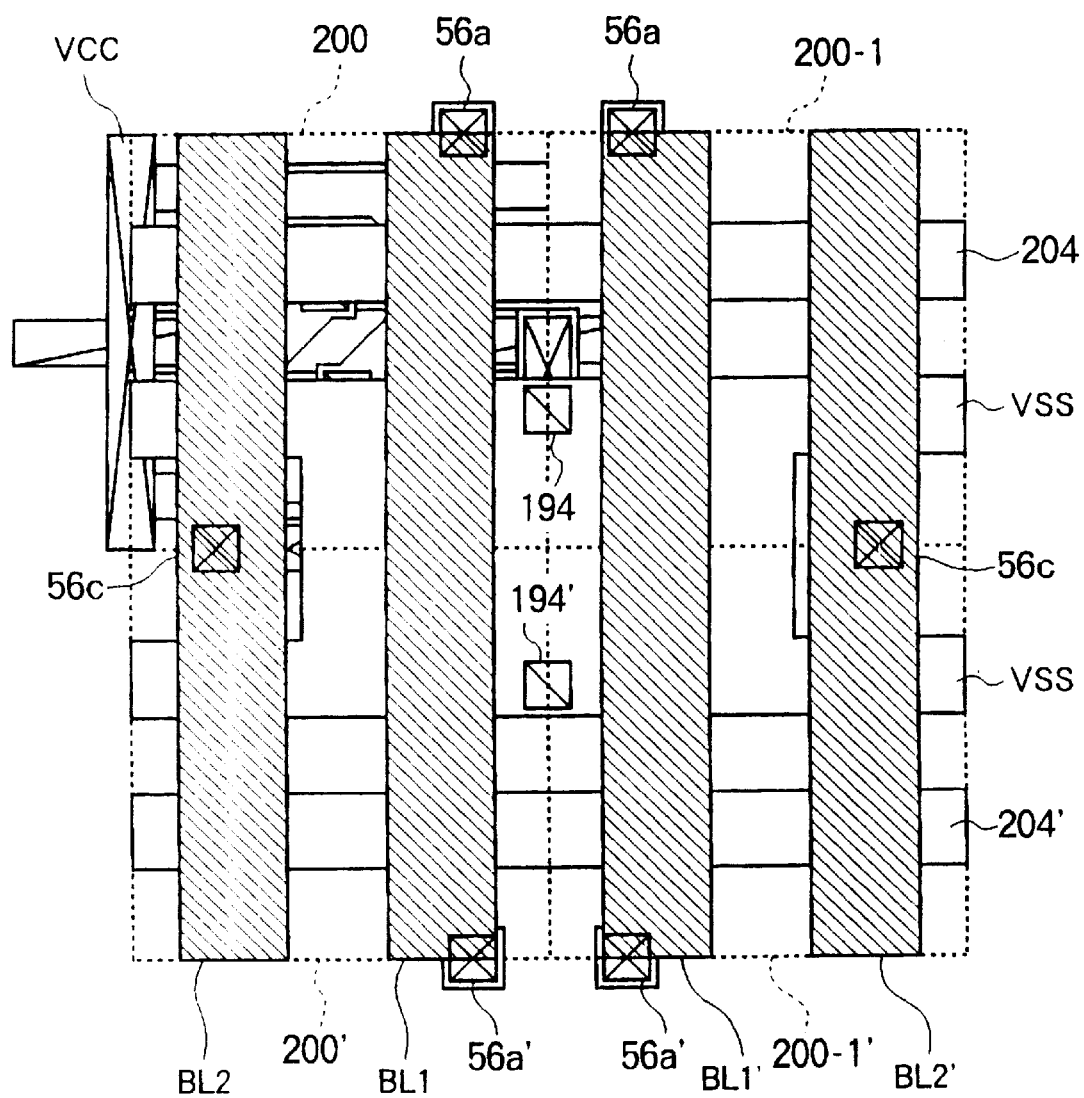
FIG. 68 is a pattern diagram of a method of producing an SRAM cell according to a ninth embodiment of the present invention showing up to the formation of bit lines.

Next, in the same way as the other embodiments, a fourth-layer interlayer insulating layer is formed, then bit contact use plugs 56a, 56b are formed on this (FIG. 67) and then bit lines BL1, BL2 are arranged (FIG. 68).

In the present embodiment, in addition to the same effects as the second and seventh embodiments, it is possible to reduce the interconnection resistance of the power voltage supply lines formed using upper-layer interconnections.

10th Embodiment

The 10th embodiment shows the case of additional application of the feature [6] of the present invention to the ninth embodiment.

FIGS. 69A, 70A, 71A, 72A, 73A, 74A, 75A, 76A, 77A, and 78A show layout pattern diagrams of a method of producing an SRAM cell according to the present embodiment. The corresponding "B" figures are sectional views along the line A–A' in each "A", while the corresponding "C" figures are sectional views along the line B–B' in each "A". Further, the corresponding "D" figures show the second related art used in the fourth embodiment as a comparison.

In the present embodiment, substantially the same steps as the ninth embodiment are performed up to FIGS. 69A to 69D.

That is, the transistors are formed, then the first-layer trench interconnections 42, 44 are formed together with various contacts, the second-layer interlayer insulating layer 32 is formed, then the second-layer trench interconnection 192 is formed on the first-layer trench interconnection 42 on the impurity region given a common potential at the same time as formation of the plug 34a etc.

In FIGS. 70A to 7D, the film for forming the storage nodes is formed, but in the present embodiment, the film is made a double-layer structure consisting of a lower-layer conductive film 212 and an upper-layer etching cover layer 214. This will be explained in detail next, but is so as to form two storage node interconnections using a photolithographic patterning technique two times. The etching cover layer 214 need only be a material having a high etch selectivity with the lower-layer conductive film 212 and is, for example, silicon dioxide ($SiO_2$) or other organic substance, a conductive material different in type from the underlying film, and so on.

Note that a single conductive film 95 is formed by the step of the second related art corresponding to this.

Figure 71A:
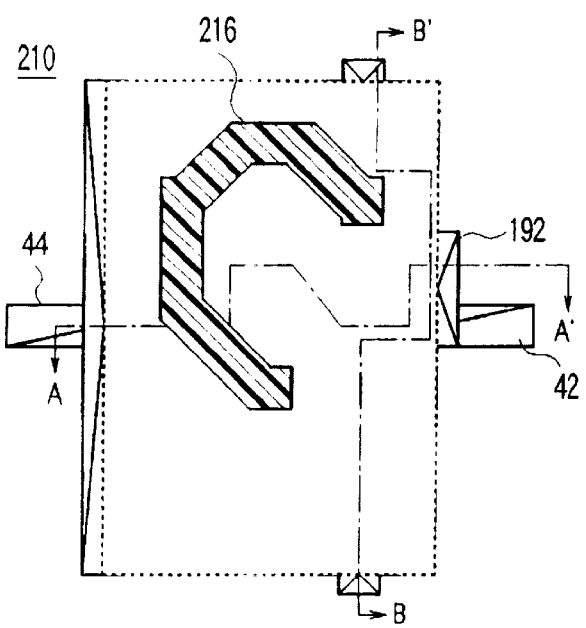
FIGS. 71A to 71D are plan views and sectional views of a method for producing an SRAM cell according to a 10th embodiment of the present invention showing up to the formation of a photoresist pattern for producing an etching cover layer for patterning first storage node interconnections and a comparative example.
Figure 71D:
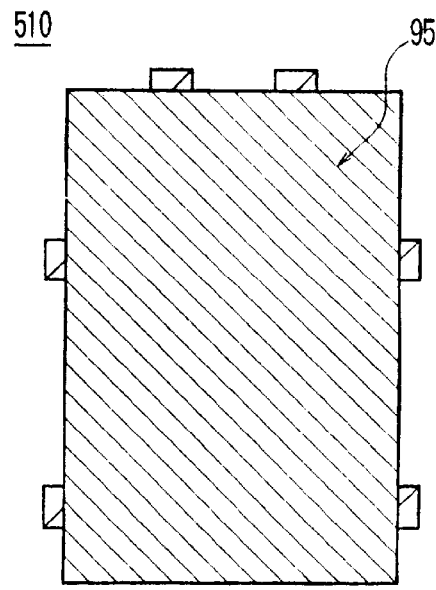
Figure 71B:
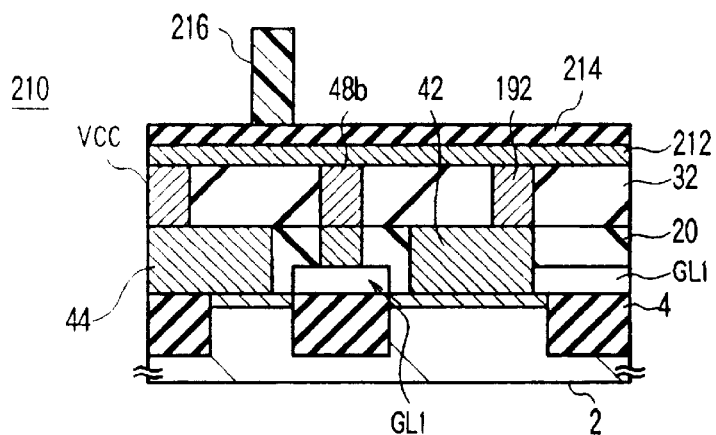
Figure 71C:
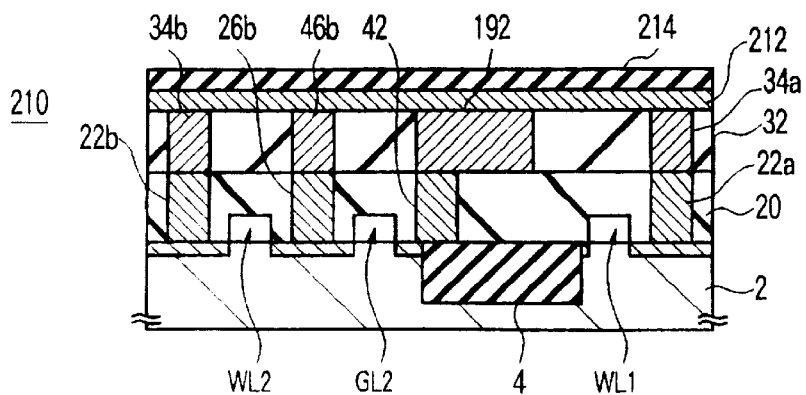

Next, in FIGS. 71A to 71C, a photoresist or other pattern 216 is formed by the pattern of one of the two storage node interconnections.

Figure 72A:
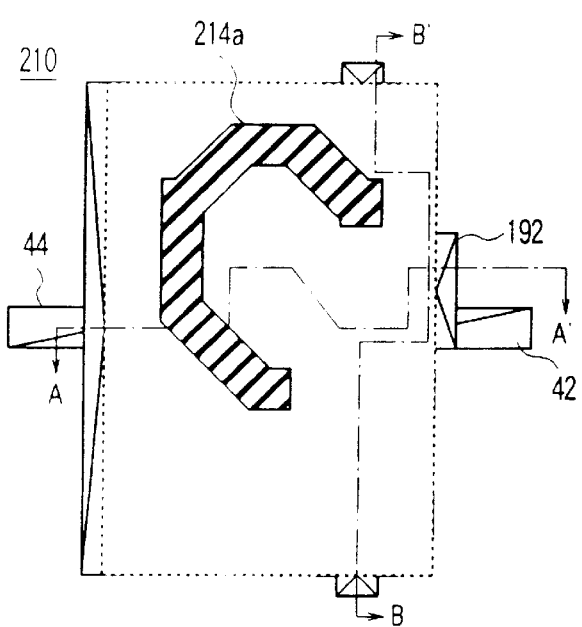
FIGS. 72A to 72D are plan views and sectional views of a method for producing an SRAM cell according to a 10th embodiment of the present invention showing up to the patterning of the etching cover layer and a comparative example.
Figure 72D:
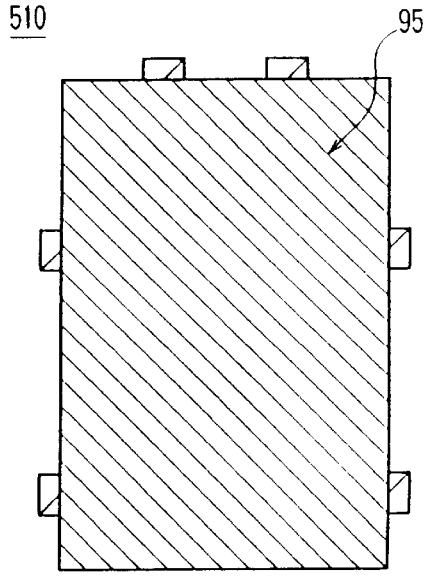
Figure 72B:
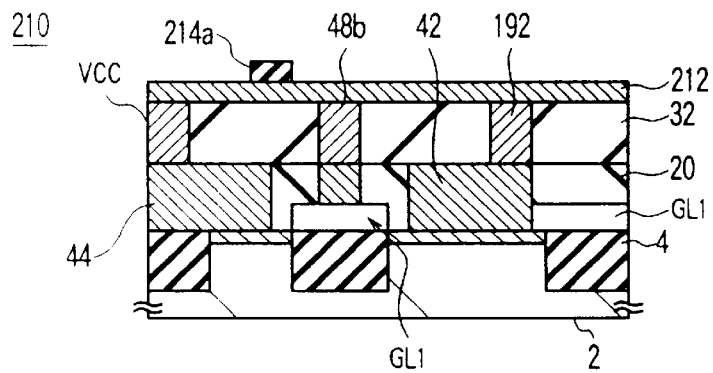
Figure 72C:
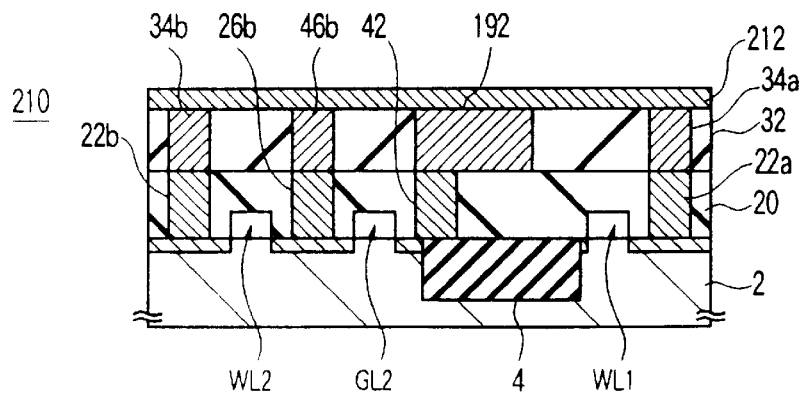

In the next FIGS. 72A to 72C, etching is performed using the pattern 216 as a mask so as to pattern the etching mask layer 214a.

Figure 73A:
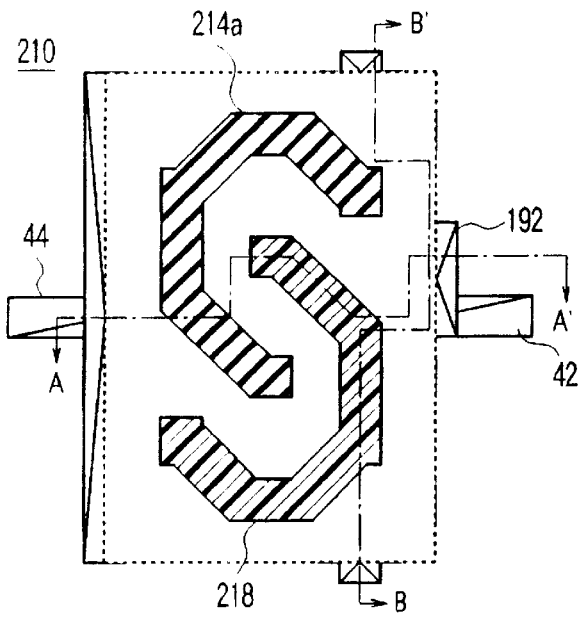
FIGS. 73A to 73D are plan views and sectional views of a method for producing an SRAM cell according to a 10th embodiment of the present invention showing up to the formation of a photoresist pattern for producing a conductive film for patterning second storage node interconnections and a comparative example.
Figure 73D:
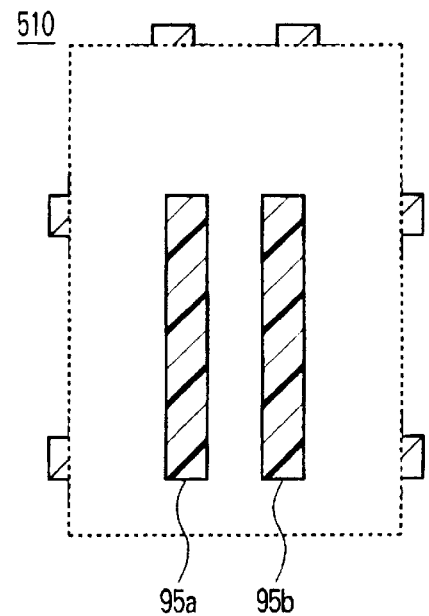
Figure 73B:
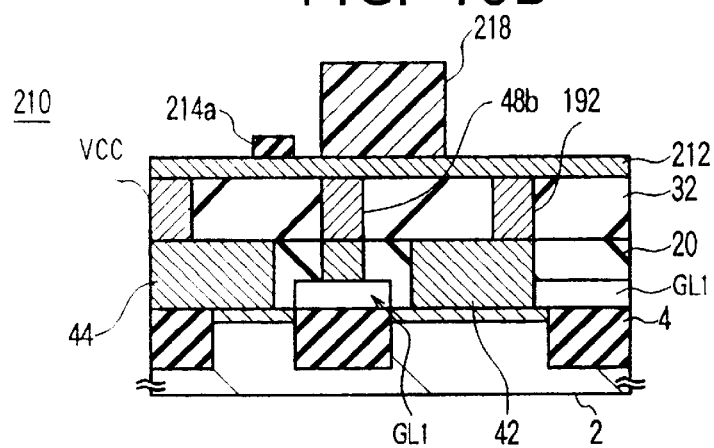
Figure 73C:
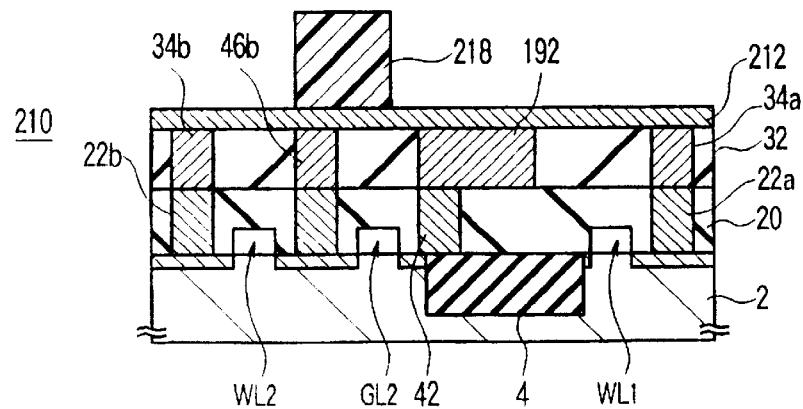

By a similar method, a photoresist or other pattern 218 is formed at the exposed surface of the conductive film 212 at the pattern of the other storage node interconnections (FIGS. 73A to 73C), then etching is performed using this as a mask to pattern the conductive film 212 (FIGS. 74A to 74C). At this time, the etching cover layer 214a functions as a self-alignment mask, therefore the portion of the conductive film directly below it is not etched. For this reason, after the etching shown in FIGS. 74A to 74C, the two-layer first storage node interconnection 212a (and 214a) and single-layer second storage node interconnection 212b are formed connecting predetermined plugs.

Note that the first storage node interconnection may be made a single layer when the upper-layer side etching cover layer 214a is etched off at the time when the etching ends according to its thickness, material, or etching conditions or when it is removed after the patterning by another process. As cases where it is desirable to remove the etching cover layer 214a by a separate step, there is the case where it is an organic material and is inferior in heat resistance. If the etching cover layer 214a is a conductive material or $SiO_2$ or other ordinary insulating material, it may be left there as it is as illustrated.

Figure 75A:
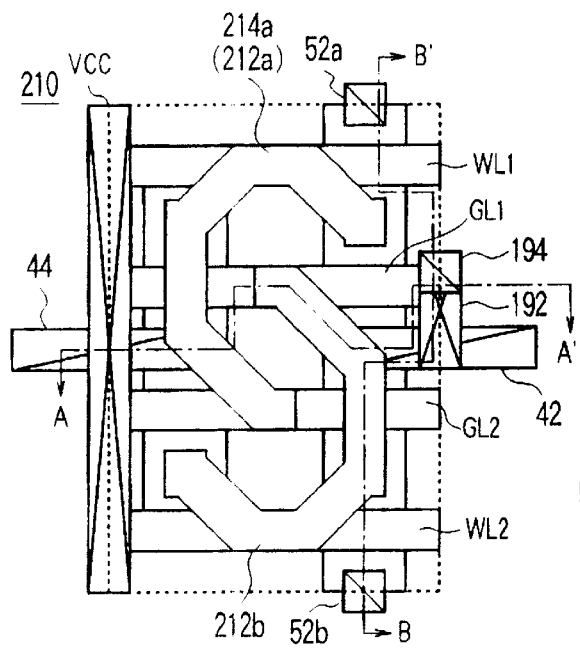
FIGS. 75A to 75D are plan views and sectional views of a method for producing an SRAM cell according to a 10th embodiment of the present invention showing up to the formation of a third-layer plug and a comparative example.
Figure 75D:
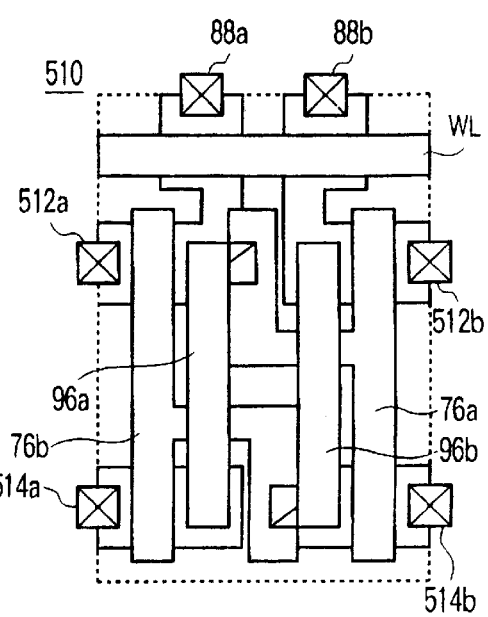
Figure 75B:
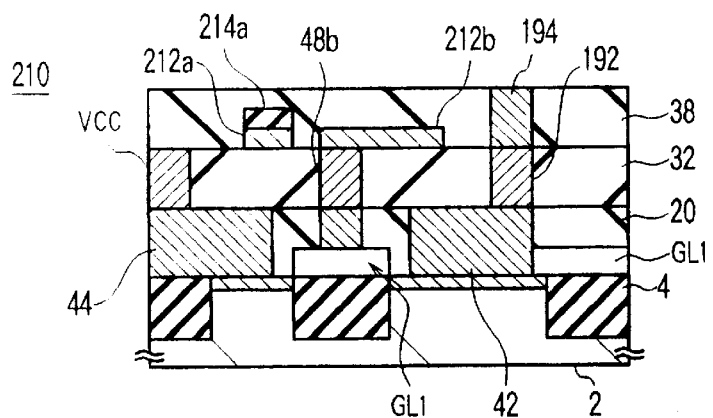
Figure 75C:
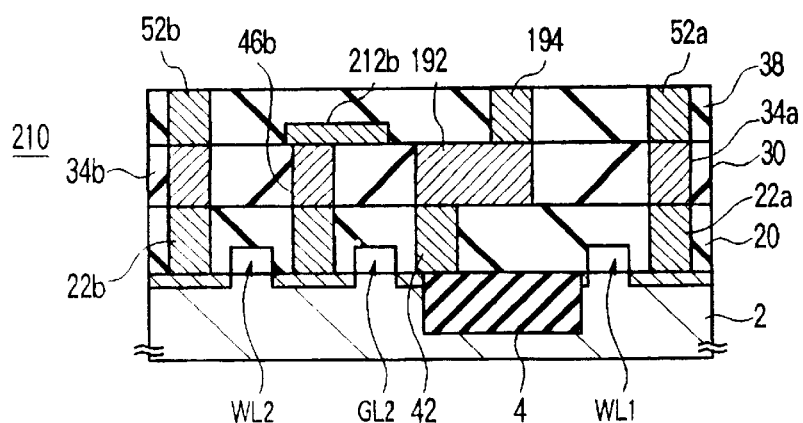

In FIGS. 75A to 75C and on, substantially the same steps as the ninth embodiment are performed except for forming the bit line connecting interconnections by an interconnection layer one level down from the bit lines.

Figure 77A:
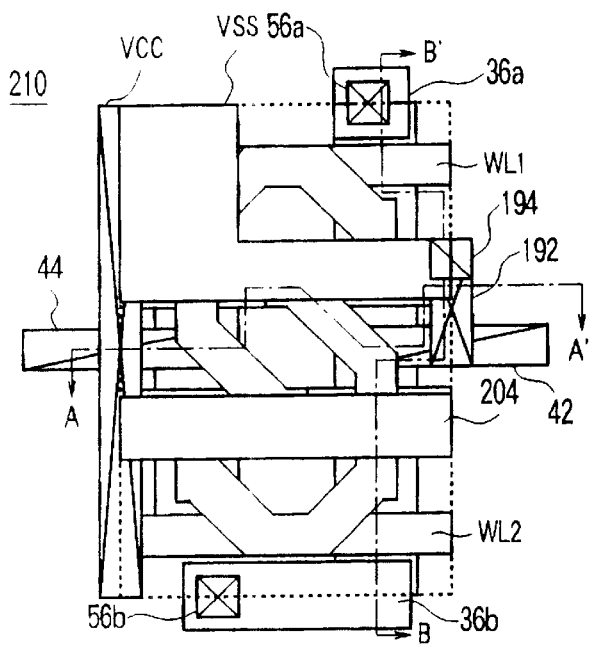
FIGS. 77A to 77D are plan views and sectional views of a method for producing an SRAM cell according to a 10th embodiment of the present invention showing up to the formation of a fourth-layer plug and a comparative example.
Figure 77D:
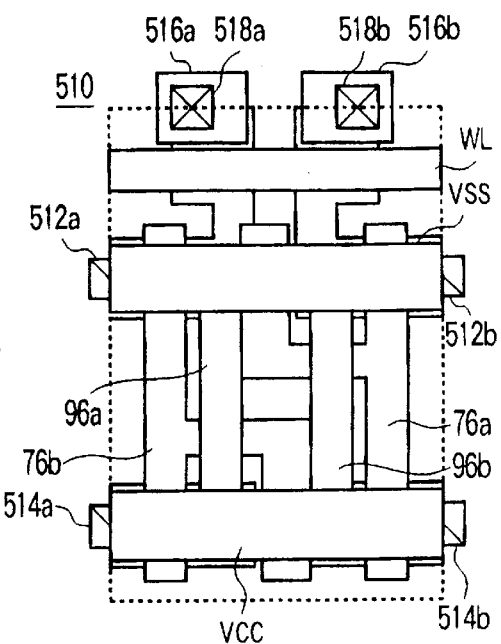
Figure 77B:
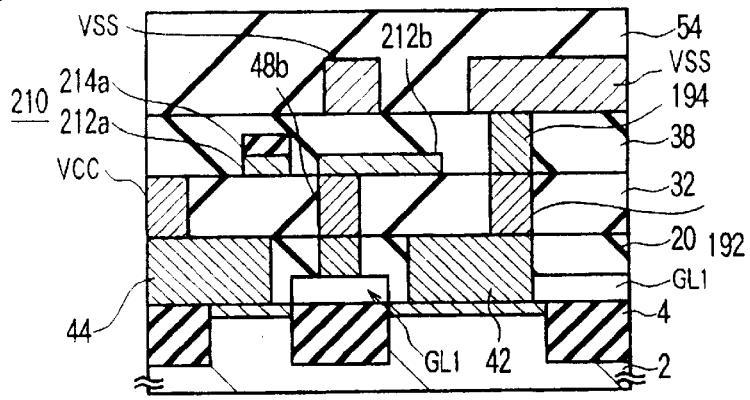
Figure 77C:
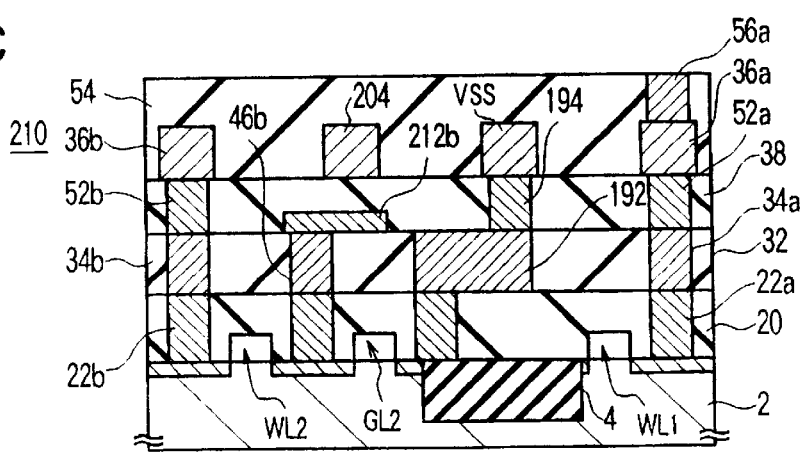
Figure 80:
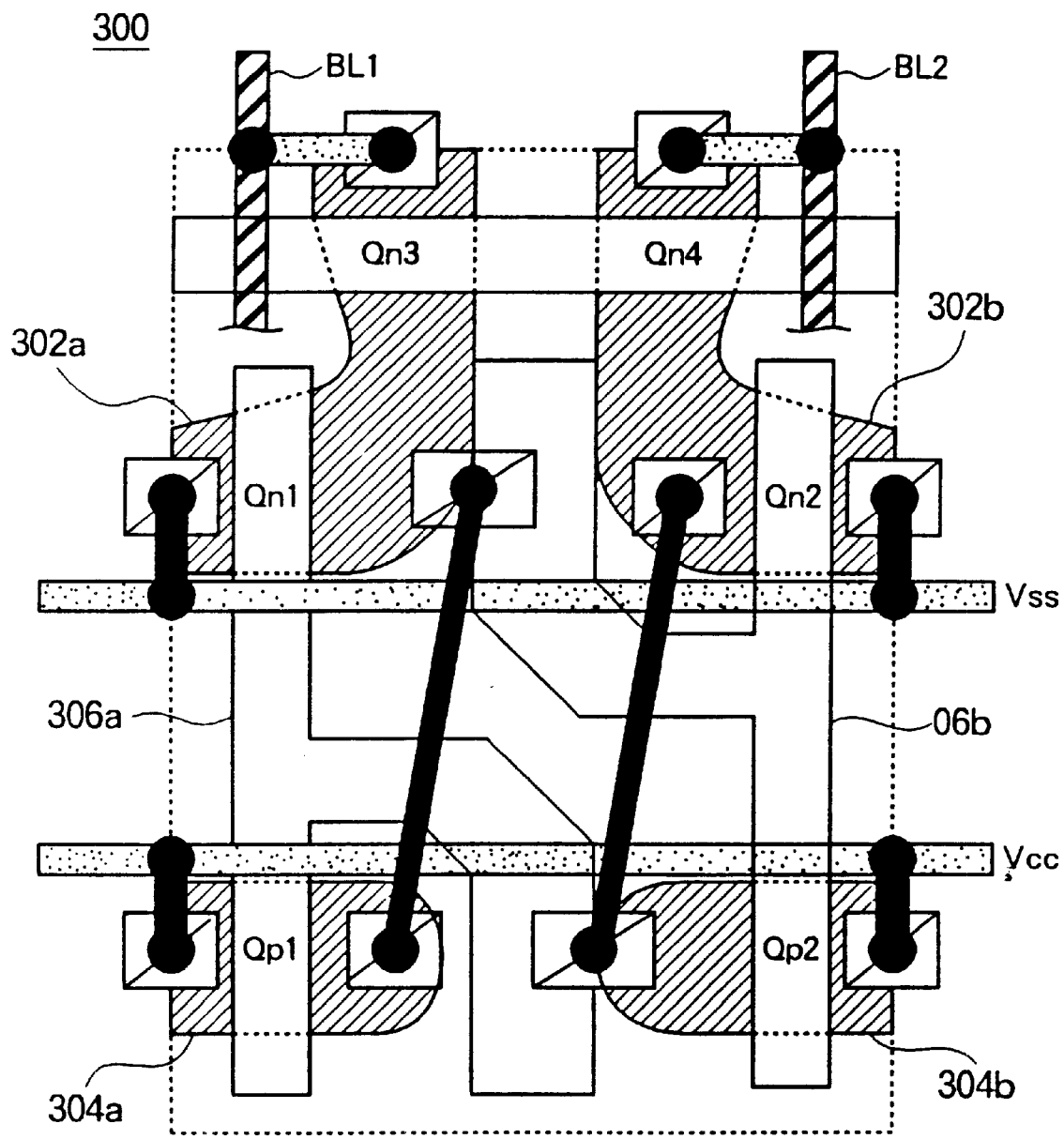
FIG. 80 a plan view of a p-MOS load type SRAM cell according to a first related art.

That is, a third-layer interlayer insulating layer 38, then plugs 52a, 52, and 194 are formed in it (FIGS. 75A to 75C) and the common potential line $V_{ss}$, and bit line connecting interconnection 36a etc. are formed (FIGS. 76A to 76C). Further, a fourth-layer interlayer insulating layer 54 is formed (FIGS. 77A to 77C), bit contact plugs 56a, 56b are formed in its, and the bit lines BL1, BL2 are arranged (FIGS. 78A to 78C).

After this, the predetermined steps are gone through to complete the SRAM device.

In the method of producing an SRAM device according to the present embodiment, the film for forming the two storage node interconnections is made a two-layer film, the upper-layer etching cover layer is formed by one interconnection pattern, the lower-layer conductive film is patterned by the other interconnection pattern, and, at that time, the etching cover layer is used as an etching mask to simultaneously form two storage node interconnections.

Therefore, in this embodiment, the requirements on the pitch of the two storage node interconnections can be eased.

FIGS. 79A to 79C are explanatory views of the design rule and cell size of an SRAM cell according to the present embodiment along with two comparative examples, that is, a first comparative example (second and seventh to ninth embodiments) and a second comparative example (second related art).

In the six-transistor type SRAM device according to the present invention, the minimum design rule relating to interconnections is determined up to the storage node interconnections. Therefore, FIGS. 79A, 79B, and 79C show for the present embodiment, the first comparative example, and the second comparative example the patterns of the LOCOS, gate electrodes, and storage node interconnections, their line widths, space widths, and pitch (total of line and space widths), the design rule defined as ½ of the minimum pitch, and the cell size.

In the first comparative example, the design rule is determined by the pattern of the storage node interconnections. In the second comparative example, the design rule is determined by the LOCOS and gate electrode patterns. In both cases, the line width and the space width are 0.2 μm and the pitch is 0.4 μm, so the design rule is a small 0.2 μm.

On the other hand, in the SRAM device according to the present embodiment, despite the completed pattern itself being the same as that of the first comparative example, since the storage node interconnections are formed divided by two patterns, the requirements on the space width are reduced 3-fold from the conventional 0.2 μm and therefore the requirements on the pitch are also eased 2-fold to 0.8 μm. As a result, in the SRAM device of the present embodiment, the design rule is determined by the gate electrode pattern whose pitch is 0.6 μm resulting in a design rule of 0.3 μm. Due to this, in the present embodiment, the design rule is increased 50% from both of the first and second comparative examples and thus pattern formation becomes easier.

On the other hand, comparing cell sizes, the cell size according to the present embodiment is 4.08 $μm^2$ or smaller than the 4.25 $μm^2$ of the second comparative example. Further, in the illustrated example, it is the same in cell size as the first comparative example, but as explained above since the design rule is increased 50%, it is easy to further reduce the cell area of the SRAM cell of this embodiment.

Further, in the present embodiment, since the etching mask layer for the storage node interconnections is formed by separate photolithographic processes for the two patterns, so long as the space between the two patterns gives enough of a margin for alignment in photolithography and is at least the lower limit of width enabling separation by etching, the two will not contact each other. Therefore, it becomes possible to form the space between two storage node interconnections at under the resolution limit of photolithography. Therefore, in this sense as well, it is easier to reduce the cell area compared with the first comparative example.

In this way, in the present embodiment, in addition to the various advantages of the previous embodiments, the requirements on the pitch of the storage node interconnections are eased and it is possible to form the space between the two storage node interconnections at under the resolution limit to photolithograph. The reduction of the cell area therefore becomes that much easier.

What is claimed is:

1. A method of producing a semiconductor memory device comprising a plurality of memory cells each including two inverters which comprises drive transistors having a first conductivity type and load transistors having a second conductivity type connected in series between a first power voltage supply line for supplying a first power voltage and a second power voltage supply line for supplying a second power voltage and having gates connected in common and which have inputs and outputs connected cross-wise, said method comprising a step of forming first and second interconnections for interconnecting the inputs and outputs of the two inverters:

said interconnections forming step comprising:
successively forming over the entire surface a conductive film for forming node interconnections and a film having an etching rate slower than the conductive film;
producing the film with the slower etching rate by using the pattern of the first interconnections to form an etching mask layer; and
producing the conductive film by using the pattern of the second interconnections to form the first and second node interconnections by using the resultant etching mask layer to thereby protect the portions of the conductive film directly underneath.

2. A method of producing a semiconductor memory device as set forth in claim 1, further comprising the steps of processing the conductive film:

forming a resist pattern by using the pattern of the second node interconnections on the conductive film close to the already formed etching mask layer at a separating distance smaller than the pattern width of the second node interconnections and removing exposed parts of the conductive film in a state where the resist pattern and the etching mask layer are formed.

3. A method of producing a semiconductor memory device as set forth in claim 1, wherein each memory comprises:

two word transistors having the first conductivity type each having a source or a drain thereof connected to an input of an inverter and having a gate connected to a word line;

a first active region wherein channels of the word transistors and the drive transistors are formed; and a second active region wherein channels of the load transistors are formed;

said first active region having outside portions extending from two drive transistor in opposite directions; and said two word transistors being formed by a different word line each perpendicularly intersecting one of the two extending portions.

* * * * *